US011037825B2

(12) United States Patent
Mullick et al.

(10) Patent No.: US 11,037,825 B2
(45) Date of Patent: Jun. 15, 2021

(54) SELECTIVE REMOVAL PROCESS TO CREATE HIGH ASPECT RATIO FULLY SELF-ALIGNED VIA

(71) Applicant: Micromaterials LLC, Wilmington, DE (US)

(72) Inventors: Amrita B. Mullick, Santa Clara, CA (US); Madhur Sachan, Belmont, CA (US); He Ren, San Jose, CA (US); Swaminathan Srinivasan, Pleasanton, CA (US); Regina Freed, Los Altos, CA (US); Uday Mitra, Cupertino, CA (US)

(73) Assignee: Micromaterials LLC, Wilmington, DE (US)

( * ) Notice: Subject to any disclaimer, the term of this patent is extended or adjusted under 35 U.S.C. 154(b) by 7 days.

(21) Appl. No.: 17/002,402

(22) Filed: Aug. 25, 2020

(65) Prior Publication Data

US 2020/0388535 A1 Dec. 10, 2020

Related U.S. Application Data

(62) Division of application No. 16/403,946, filed on May 6, 2019, now Pat. No. 10,790,191.

(Continued)

(51) Int. Cl.
*H01L 21/768* (2006.01)
*H01L 23/522* (2006.01)
*H01L 21/311* (2006.01)

(52) U.S. Cl.
CPC .. *H01L 21/76897* (2013.01); *H01L 21/31111* (2013.01); *H01L 21/7681* (2013.01); *H01L 21/76813* (2013.01); *H01L 21/76819* (2013.01); *H01L 21/76877* (2013.01); *H01L 23/5226* (2013.01)

(58) Field of Classification Search
CPC .......... H01L 21/76897; H01L 21/7681; H01L 21/76813; H01L 21/76819; H01L 21/76877; H01L 21/31111; H01L 23/5226
See application file for complete search history.

(56) References Cited

U.S. PATENT DOCUMENTS 4,671,970 A 6/1987 Keiser et al.
5,824,597 A 10/1998 Hong
(Continued)

FOREIGN PATENT DOCUMENTS

JP 2008108757 A 5/2008
JP 2011060803 A 3/2011
(Continued)

OTHER PUBLICATIONS

PCT International Search Report and Written Opinion in PCT/US2017/037141 dated Aug. 31, 2017, 11 pages.
(Continued)

*Primary Examiner* — Matthew E. Gordon
(74) *Attorney, Agent, or Firm* — Servilla Whitney LLC

(57) ABSTRACT

Apparatuses and methods to provide a fully self-aligned via are described. Some embodiments of the disclosure utilize a cap layer to protect an insulating layer in order to minimize bowing of the side walls during metal recess in a fully self-aligned via. The cap layer can be selectively removed, thus increasing the aspect ratio, by exposing the substrate to a hot phosphoric acid solution.

10 Claims, 36 Drawing Sheets

Related U.S. Application Data

(60) Provisional application No. 62/668,406, filed on May 8, 2018.

(56) References Cited

U.S. PATENT DOCUMENTS

| | | |
|---|---|---|
| 6,130,151 A | 10/2000 | Lin et al. |
| 6,143,653 A | 11/2000 | Tsai et al. |
| 6,528,884 B1 | 3/2003 | Lopatin et al. |
| 6,576,113 B1 | 6/2003 | Scherer et al. |
| 6,653,200 B2 | 11/2003 | Olsen |
| 7,192,803 B1 | 3/2007 | Lin et al. |
| 7,279,119 B2 | 10/2007 | Hellring et al. |
| 7,288,463 B1 | 10/2007 | Papasouliotis |
| 7,541,297 B2 | 6/2009 | Mallick et al. |
| 7,985,977 B2 | 7/2011 | Gogoi et al. |
| 8,034,705 B2 | 10/2011 | Choi et al. |
| 8,338,225 B2 | 12/2012 | Breitwisch et al. |
| 8,575,753 B2 | 11/2013 | Choi et al. |
| 8,951,429 B1 | 2/2015 | Liu et al. |
| 9,012,322 B2 | 4/2015 | Duong et al. |
| 9,117,884 B1 | 8/2015 | Shaviv et al. |
| 9,236,292 B2 | 1/2016 | Romero et al. |
| 9,312,220 B2 | 4/2016 | Lu et al. |
| 9,324,650 B2 | 4/2016 | Edelstein et al. |
| 9,362,165 B1 | 6/2016 | Bouche et al. |
| 9,362,413 B2 | 6/2016 | Yu et al. |
| 9,368,395 B1 | 6/2016 | Wei et al. |
| 9,490,202 B2 | 11/2016 | Lin et al. |
| 9,666,451 B2 | 5/2017 | Wallace et al. |
| 9,679,781 B2 | 6/2017 | Abatchez et al. |
| 9,721,888 B2 | 8/2017 | Chang et al. |
| 9,837,314 B2 | 12/2017 | Smith et al. |
| 10,083,834 B2 | 9/2018 | Thompson et al. |
| 10,319,604 B2 | 6/2019 | Duan et al. |
| 10,319,636 B2 | 6/2019 | Basu et al. |
| 2002/0098642 A1 | 7/2002 | Harris et al. |
| 2002/0163081 A1 | 11/2002 | Aoyama |
| 2003/0143862 A1 | 7/2003 | Iyer |
| 2004/0067649 A1 | 4/2004 | Hellring et al. |
| 2004/0192034 A1 | 9/2004 | Ohiwa et al. |
| 2005/0121768 A1 | 6/2005 | Edelstein et al. |
| 2005/0167846 A1 | 8/2005 | Aoyama |
| 2005/0266627 A1 | 12/2005 | Furukawa et al. |
| 2006/0169576 A1 | 8/2006 | Brown et al. |
| 2006/0286806 A1 | 12/2006 | Ohkuni et al. |
| 2007/0166981 A1 | 7/2007 | Furukawa et al. |
| 2007/0199922 A1 | 8/2007 | Shen et al. |
| 2008/0160783 A1 | 7/2008 | Watanabe et al. |
| 2008/0182411 A1 | 7/2008 | Elers |
| 2008/0242097 A1 | 10/2008 | Boescke et al. |
| 2009/0017631 A1 | 1/2009 | Bencher |
| 2009/0072409 A1 | 3/2009 | Nitta et al. |
| 2009/0174040 A1 | 7/2009 | Gogoi et al. |
| 2009/0269569 A1 | 10/2009 | Fucsko et al. |
| 2010/0078617 A1 | 4/2010 | Breitwisch et al. |
| 2010/0096691 A1 | 4/2010 | Shin et al. |
| 2010/0171220 A1 | 7/2010 | Cheng-Lin |
| 2010/0173494 A1 | 7/2010 | Kobrin |
| 2010/0203725 A1 | 8/2010 | Choi et al. |
| 2010/0301480 A1 | 12/2010 | Choi et al. |
| 2010/0330805 A1 | 12/2010 | Doan et al. |
| 2011/0049568 A1 | 3/2011 | Lochtefeld et al. |
| 2011/0057317 A1 | 3/2011 | Koike et al. |
| 2011/0089393 A1 | 4/2011 | Kuo-Pin et al. |
| 2011/0207318 A1 | 8/2011 | Usami |
| 2011/0281417 A1 | 11/2011 | Gordon et al. |
| 2012/0115302 A1 | 5/2012 | Breitwisch et al. |
| 2012/0156857 A1 | 6/2012 | Cohen |
| 2012/0178235 A1 | 7/2012 | Pachamuthu et al. |
| 2013/0072019 A1 | 3/2013 | Ryan |
| 2013/0109148 A1 | 5/2013 | Oh et al. |
| 2013/0241037 A1 | 9/2013 | Jeong et al. |
| 2013/0264533 A1 | 10/2013 | Cheong et al. |
| 2014/0029181 A1 | 1/2014 | Gstrein |
| 2014/0145238 A1* | 5/2014 | Mariani ............ H01L 29/66666 257/107 |
| 2014/0264747 A1 | 9/2014 | Barabash |
| 2014/0264896 A1 | 9/2014 | Wei et al. |
| 2014/0327140 A1 | 11/2014 | Zhang et al. |
| 2015/0111374 A1 | 4/2015 | Bao et al. |
| 2015/0132901 A1 | 5/2015 | Wang et al. |
| 2015/0137113 A1 | 5/2015 | Yu et al. |
| 2015/0170956 A1 | 6/2015 | Naik et al. |
| 2015/0279736 A1 | 10/2015 | Hotta et al. |
| 2015/0287675 A1 | 10/2015 | Shaviv |
| 2015/0325622 A1 | 11/2015 | Zhang et al. |
| 2015/0357439 A1 | 12/2015 | Liu et al. |
| 2015/0364420 A1 | 12/2015 | Mei et al. |
| 2015/0371896 A1 | 12/2015 | Chen et al. |
| 2016/0049427 A1 | 2/2016 | Zang |
| 2016/0056074 A1 | 2/2016 | Na |
| 2016/0056104 A1 | 2/2016 | Bouche et al. |
| 2016/0068710 A1 | 3/2016 | Wang et al. |
| 2016/0093635 A1 | 3/2016 | Rabkin et al. |
| 2016/0111342 A1 | 4/2016 | Huang et al. |
| 2016/0141416 A1 | 5/2016 | Mariani et al. |
| 2016/0163587 A1* | 6/2016 | Backes ............... H01L 21/2885 257/751 |
| 2016/0163640 A1* | 6/2016 | Edelstein ......... H01L 21/76811 257/751 |
| 2016/0190008 A1 | 6/2016 | Chandrashekar et al. |
| 2016/0190009 A1 | 6/2016 | Wallace et al. |
| 2016/0260779 A1 | 9/2016 | Kawashima et al. |
| 2017/0076945 A1 | 3/2017 | Hudson |
| 2017/0077037 A1 | 3/2017 | Kelly et al. |
| 2017/0186849 A1 | 6/2017 | Chen et al. |
| 2017/0263563 A1 | 9/2017 | Dutta et al. |
| 2017/0271202 A1* | 9/2017 | Xu .................... H01L 21/76831 |
| 2017/0338149 A1 | 11/2017 | Lin |
| 2018/0096847 A1 | 4/2018 | Thompson et al. |
| 2018/0130671 A1 | 5/2018 | Duan et al. |
| 2018/0144980 A1 | 5/2018 | Basu et al. |
| 2018/0286749 A1* | 10/2018 | Zhang ............... H01L 21/76811 |
| 2018/0358260 A1* | 12/2018 | Roy .................. H01J 37/32165 |

FOREIGN PATENT DOCUMENTS

| | | |
|---|---|---|
| JP | 2011233922 A | 11/2011 |
| KR | 100223334 B1 | 10/1999 |
| KR | 20000026588 A | 5/2000 |
| KR | 20020020969 A | 3/2002 |
| WO | 2016/106092 A1 | 6/2016 |
| WO | 2017136577 A1 | 8/2017 |

OTHER PUBLICATIONS

PCT International Search Report and Written Opinion in PCT/US2017/053936 dated Jan. 12, 2018, 10 pages.
PCT International Search Report and Written Opinion in PCT/US2017/059737 dated May 18, 2018, 11 pages.
PCT International Search Report and Written Opinion in PCT/US2017/060367 dated Feb. 22, 2018, 9 pages.
PCT International Search Report and Written Opinion in PCT/US2017/060368 dated Jan. 31, 2018, 11 pages.
PCT International Search Report and Written Opinion in PCT/US2018/019146 dated May 23, 2018, 12 pages.
PCT International Search Report and Written Opinion in PCT/US2018/027284 dated Aug. 2, 2018, 10 pages.
PCT international Search Report and Written Opinion in PCT/US2018/036690 dated Sep. 18, 2018, 9 pages.
PCT International Search Report and Written Opinion in PCT/US2018/048503 dated Dec. 14, 2018, 10 pages.
PCT International Search Report and Written Opinion in PCT/US2018/048504 dated Dec. 13, 2018, 10 pages.
PCT International Search Report and Written Opinion in PCT/US2018/048509 dated Dec. 13, 2018, 10 pages.
PCT ISR & Written Opinion for PCT/US2018/026026, dated Jul. 26, 2018, 11 pages.

(56) References Cited

OTHER PUBLICATIONS

PCT International Search Report and Written Opinion in PCT/US2019/031034 dated Aug. 21, 2019, 10 pages.

* cited by examiner

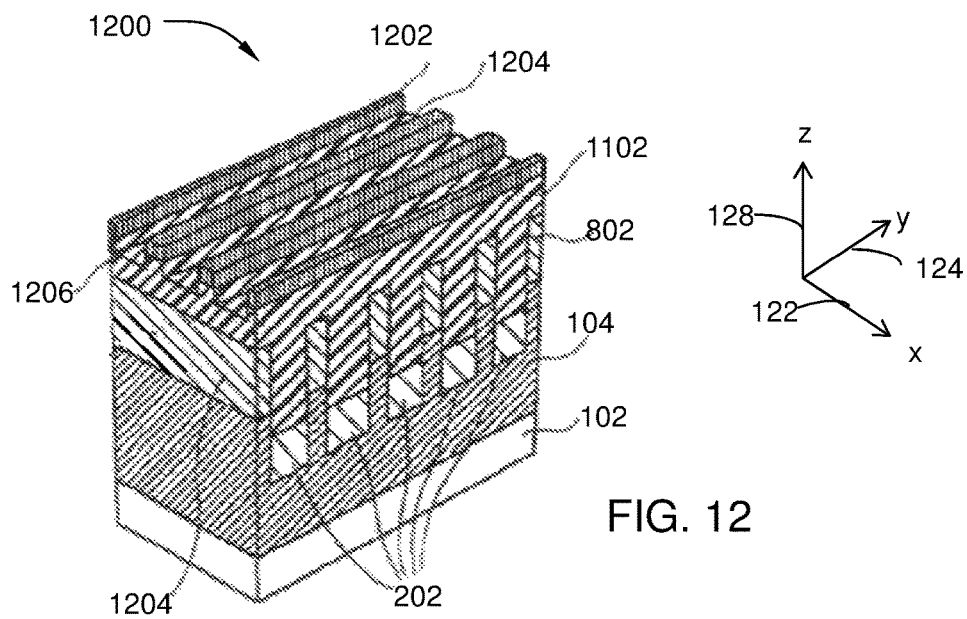
FIG. 12
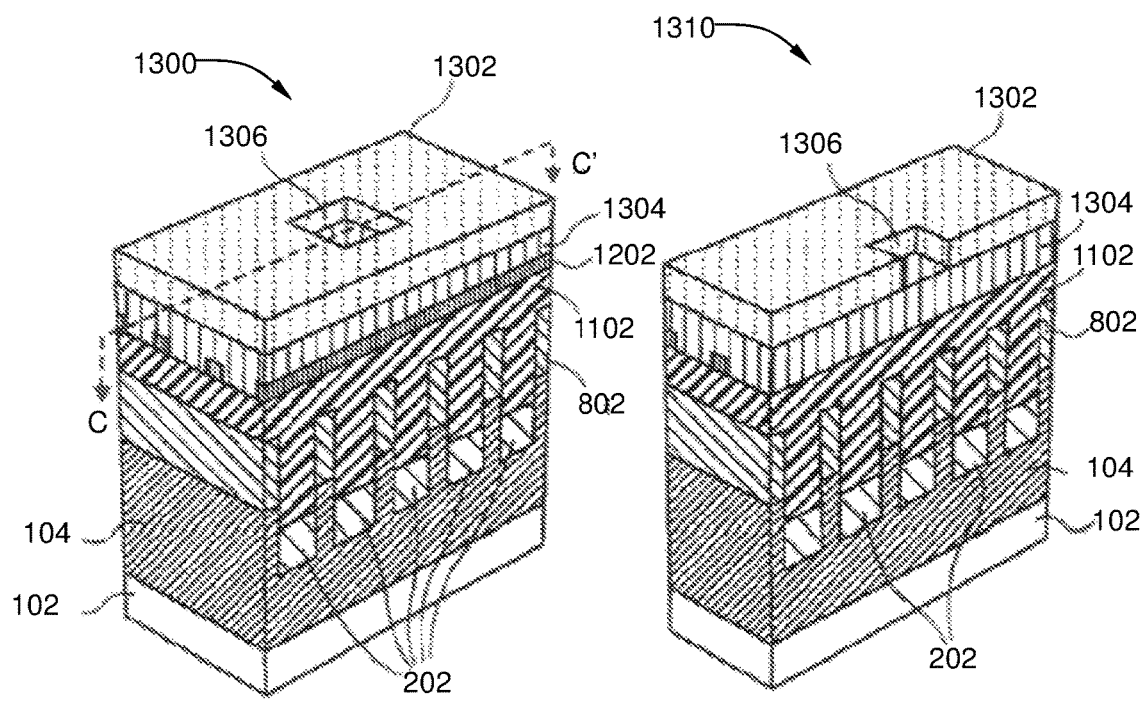
FIG. 13A
FIG. 13B
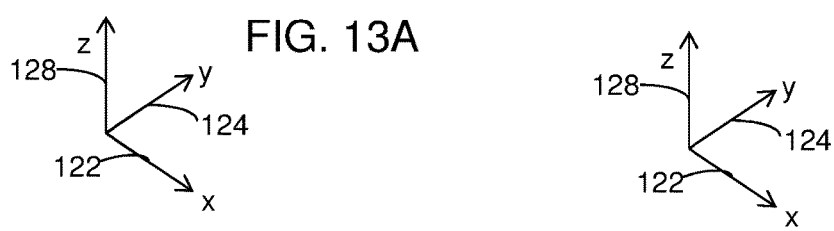

SELECTIVE REMOVAL PROCESS TO CREATE HIGH ASPECT RATIO FULLY SELF-ALIGNED VIA

CROSS-REFERENCE TO RELATED APPLICATIONS

This application is a Divisional of U.S. application Ser. No. 16/403,946, filed on May 6, 2019, which claims priority to U.S. Provisional Application No. 62/668,406, filed May 8, 2018, the entire disclosures of which are hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure are directed to methods of producing vias which are self-aligned such that conductive layers with lines running in opposing directions are connected.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the IC decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide the full via self-alignment. In the conventional techniques, the vias formed to connect lines in an upper metallization layer to a lower metallization layer are often misaligned to the lines in the lower metallization layer. The via-line misalignment increases via resistance and leads to potential shorting to the wrong metal line. The via-line misalignment causes device failures, decreases yield and increases manufacturing cost.

SUMMARY

Apparatuses and methods to provide a fully self-aligned via are described. In one embodiment, a first metallization layer comprises a set of first conductive lines that extend along a first direction, each of the first conductive lines separated from an adjacent first conductive line by a first insulating layer. An etch stop layer is on the first insulating layer, and a second insulating layer is on the first insulating layer, the second insulating layer separated from the first insulating layer by the etch stop layer. A third insulating layer is on some of the first conductive lines so that at least one conductive line is free of the third insulating layer. A second metallization layer is on portions of the second insulating layer and the third insulating layer, the second metallization layer comprising a set of second conductive lines extending along a second direction that crosses the first direction at an angle, each of the second conductive lines separated from an adjacent second conductive line by the third insulating layer. At least one via is between the first metallization layer and the second metallization layer, each of the at least one vias formed on the at least one first conductive line that is free of the third insulating layer and having a conductive material therein, wherein the via is self-aligned along the second direction to one of the first conductive lines.

One or more embodiments are directed to methods to provide a fully self-aligned via. A substrate is provided having a first insulating layer thereon, the first insulating layer having a top surface with a plurality of trenches formed along a first direction. A cap layer is formed on the top surface of the first insulating layer. A plurality of recessed first conductive lines are provided in the trenches of the first insulating layer, the first conductive lines extending along the first direction and having a first conductive surface below the top surface of the first insulating layer. A first metal film is formed on the recessed first conductive lines. Pillars are formed from the first metal film on the recessed first conductive lines, the pillars extending orthogonal to the top surface of the first insulating layer. At least a portion of the cap layer is selectively removed to expose the top surface of the first insulating layer. A second insulating layer is deposited around the pillars and on the top surface of the first insulating layer. At least one of the pillars is selectively removed to form at least one opening in the second insulating layer. A third insulating layer is deposited in the openings onto the recessed first conductive lines to form filled vias. A portion of the third insulating layer is etched relative to the second insulating layer to form a via opening to at least one of the first conductive lines. Second conductive lines are then formed on portions of the second insulating layer and the third insulating layer, the second conductive lines extending along a second direction that crosses the first direction at an angle.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 12 is a view after an insulating layer is deposited into trenches according to one embodiment.

FIG. 13A is a view similar to FIG. 12 after a mask layer is deposited on an insulating layer on the patterned hard mask layer according to one embodiment.

FIG. 13B is a cross-sectional view of FIG. 13A along an axis C-C'.

DETAILED DESCRIPTION

Figure 1A:
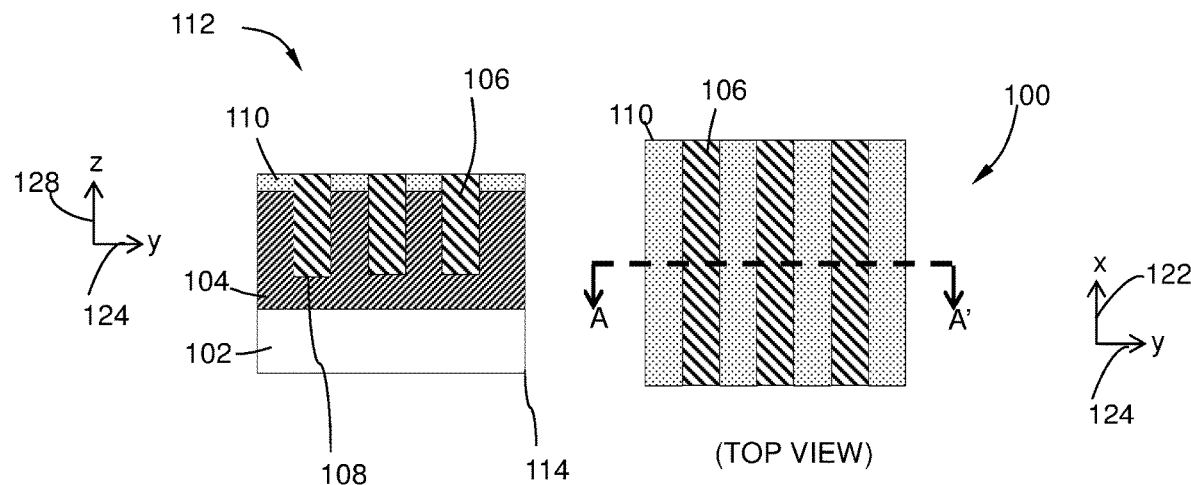
FIG. 1A illustrates a top view and a cross-sectional view of an electronic device structure to provide a fully self-aligned via according to one embodiment.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Methods and apparatus to provide fully self-aligned vias are described. In one embodiment, a first metallization layer comprises a set of first conductive lines that extend along a first direction, each of the first conductive lines separated from an adjacent first conductive line by a first insulating layer. An etch stop layer is on the first insulating layer, and a second insulating layer is on the first insulating layer, the second insulating layer separated from the first insulating layer by the etch stop layer. A third insulating layer is on some of the first conductive lines so that at least one conductive line is free of the third insulating layer. A second metallization layer is on portions of the second insulating layer and the third insulating layer, the second metallization layer comprising a set of second conductive lines extending along a second direction that crosses the first direction at an angle, each of the second conductive lines separated from an adjacent second conductive line by the third insulating layer. At least one via is between the first metallization layer and the second metallization layer, each of the at least one vias formed on the at least one first conductive line that is free of the third insulating layer and having a conductive material therein, wherein the via is self-aligned along the second direction to one of the first conductive lines.

In one embodiment, the via is self-aligned along the first direction to one of the second conductive lines.

In one embodiment, a fully self-aligned via is the via that is self-aligned along at least two directions to the conductive lines in a lower (or first) and an upper (or second) metallization layer. In one embodiment, the fully self-aligned via is defined by a hard mask in one direction and the underlying insulating layer in another direction, as described in further detail below.

Comparing to the conventional techniques, some embodiments advantageously provide fully self-aligned vias with minimized bowing of the side walls during metal recess. In some embodiments, the fully self-aligned vias provide lower via resistance and capacitance benefits over the conventional vias. Some embodiments of the self-aligned vias provide full alignment between the vias and the conductive lines of the metallization layers that is substantially error free that advantageously increase the device yield and reduce the device cost. Additionally, some embodiments of the self-aligned vias provide a high aspect ratio for the fully self-aligned via.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in a least one embodiment of the present disclosure. Thus, the appearance of the phrases "in one embodiment" or "in an embodiment" in various places throughout the specification are not necessarily all referring to the same embodiment of the disclosure. Furthermore, the particular features, structures, or characteristics may be combined in any suitable manner in one or more embodiments.

Figure 1B:
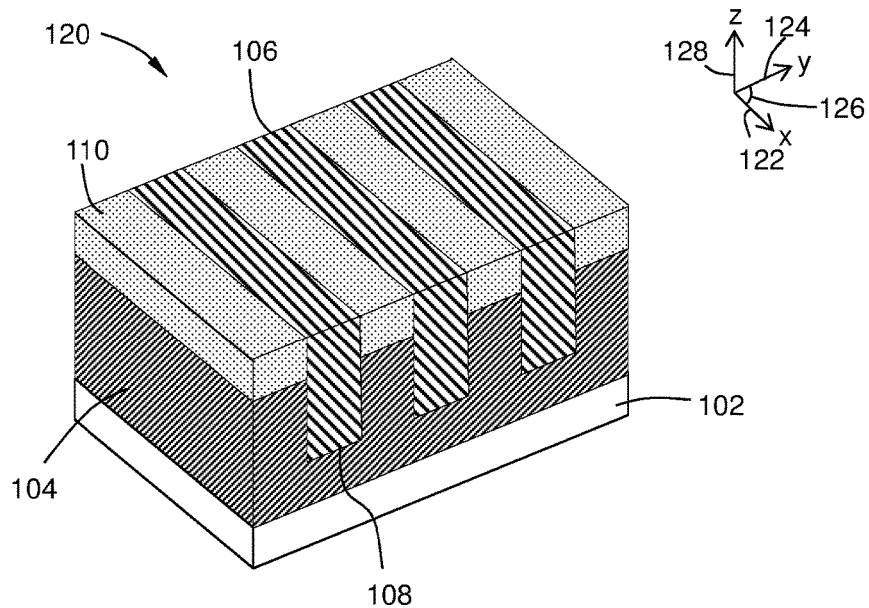
FIG. 1B is a perspective view of the electronic device structure depicted in FIG. 1A.

FIG. 1A illustrates a top view 100 and a cross-sectional view 112 of an electronic device 114 structure to provide a fully self-aligned via according to one embodiment. The cross-sectional view 112 is along an axis A-A', as depicted in FIG. 1A. FIG. 1B is a perspective view 120 of the electronic device structure depicted in FIG. 1A. A lower metallization layer (Mx) comprises a set of conductive lines 106 that extend along an X-axis (direction) 122 on an insulating layer 104 on a substrate 102, as shown in FIGS. 1A and 1B. As shown in FIG. 1B, X-axis (direction) 122 crosses Y-axis (direction) 124 at an angle 126. In one embodiment, angle 126 is about 90 degrees. In another embodiment, angle 126 is an angle that is other than the 90 degrees angle. The insulating layer 104 comprises trenches 108. The conductive lines 106 are deposited in trenches 108. A cap layer 110 is formed on the insulating layer 104.

In an embodiment, the substrate 102 comprises a semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In an embodiment, substrate 102 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 102 can be, e.g., an organic, a ceramic, a glass, or a semiconductor substrate. Although a few examples of materials from which the substrate 102 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one embodiment, substrate 102 includes one or more metallization interconnect layers for integrated circuits. In at least some embodiments, the substrate 102 includes interconnects, for example, vias, configured to connect the metallization layers. In at least some embodiments, the substrate 102 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate 102 includes one or more layers above substrate 102 to confine lattice dislocations and defects.

Insulating layer 104 can be any material suitable to insulate adjacent devices and prevent leakage. In one embodiment, electrically insulating layer 104 is an oxide layer, e.g., silicon dioxide, or any other electrically insulating layer determined by an electronic device design. In one embodiment, insulating layer 104 comprises an interlayer dielectric (ILD). In one embodiment, insulating layer 104 is a low-k dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof.

In one embodiment, insulating layer 104 includes a dielectric material having a k-value less than 5. In one embodiment, insulating layer 104 includes a dielectric material having a k-value less than 2. In at least some embodiments, insulating layer 104 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof, other electrically insulating layer determined by an electronic device design, or any combination thereof. In at least some embodiments, insulating layer 104 may include polyimide, epoxy, photodefinable materials, such as benzocyclobutene (BCB), and WPR-series materials, or spin-on-glass.

In one embodiment, insulating layer 104 is a low-k interlayer dielectric to isolate one metal line from other metal lines on substrate 102. In one embodiment, the thickness of the insulating layer 104 is in an approximate range from about 10 nanometers (nm) to about 2 microns (μm).

In an embodiment, insulating layer 104 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one embodiment, the lower metallization layer Mx comprising conductive lines 106 (i.e., metal lines) is a part of a back end metallization of the electronic device. In one embodiment, the insulating layer 104 is patterned and etched using a hard mask to form trenches 108 using one or more patterning and etching techniques known to one of ordinary skill in the art of microelectronic device manufacturing. In one embodiment, the size of trenches 108 in the insulating layer 104 is determined by the size of conductive lines formed later on in a process.

In one embodiment, forming the conductive lines 106 involves filling the trenches 108 with a layer of conductive material. In one embodiment, a base layer (not shown) is first deposited on the internal sidewalls and bottom of the trenches 108, and then the conductive layer is deposited on the base layer. In one embodiment, the base layer includes a conductive seed layer (not shown) deposited on a conductive barrier layer (not shown). The seed layer can include copper (Cu), and the conductive barrier layer can include aluminum (Al), titanium (Ti), tantalum (Ta), tantalum nitride (TaN), and the like metals. The conductive barrier layer can be used to prevent diffusion of the conductive material from the seed layer, e.g., copper or cobalt, into the insulating layer 104. Additionally, the conductive barrier layer can be used to provide adhesion for the seed layer (e.g., copper).

In one embodiment, to form the base layer, the conductive barrier layer is deposited onto the sidewalls and bottom of the trenches 108, and then the seed layer is deposited on the conductive barrier layer. In another embodiment, the conductive base layer includes the seed layer that is directly deposited onto the sidewalls and bottom of the trenches 108. Each of the conductive barrier layer and seed layer may be deposited using any think film deposition technique known to one of ordinary skill in the art of semiconductor manufacturing, e.g., sputtering, blanket deposition, and the like. In one embodiment, each of the conductive barrier layer and the seed layer has the thickness in an approximate range from about lnm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper or cobalt, is deposited onto the seed layer of base layer of copper, by an electroplating process. In one embodiment, the conductive layer is deposited into the trenches 108 using a damascene process known to one of ordinary skill in the art of microelectronic device manufacturing. In one embodiment, the conductive layer is deposited onto the seed layer in the trenches 108 using a selective deposition technique, such as but not limited to electroplating, electrolysis, CVD, PVD, MBE, MOCVD, ALD, spin-on, or other deposition techniques know to one of ordinary skill in the art of microelectronic device manufacturing.

In one embodiment, the choice of a material for conductive layer for the conductive lines 106 determines the choice of a material for the seed layer. For example, if the material for the conductive lines 106 includes copper, the material for the seed layer also includes copper. In one embodiment, the conductive lines 106 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pd), antimony (Sb), bismuth (Bi), zinc (Zn), cadmium (Cd), or any combination thereof.

In alternative embodiments, examples of the conductive materials that may be used for the conductive lines 106 of the metallization layer Mx are, for example, metals, e.g., copper (Cu), tantalum (Ta), tungsten (W), ruthenium (Ru), titanium (Ti), hafnium (Hf), zirconium (Zr), aluminum (Al), silver (Ag), tin (Sn), lead Pb), metal alloys, metal carbides, e.g., hafnium carbide (HfC), zirconium carbide (ZrC), titanium carbide (TiC), tantalum carbide (TaC), aluminum carbide (AlC), other conductive materials, or any combination thereof.

In one embodiment, portions of the conductive layer and the base layer are removed to even out top portions of the conductive lines 106 with top portions of the insulating layer 104 using a chemical-mechanical polishing ("CMP") technique known to one of ordinary skill in the art of microelectronic device manufacturing.

In one non-limiting example, the thickness (as measured along the z-axis of FIG. 1A) of the conductive lines 106 is in an approximate range from about 15 nm to about 1000 nm. In one non-limiting example, the thickness of the conductive lines 106 is from about 20 nm to about 200 nm. In one non-limiting example, the width (as measured along the y-axis of FIG. 1A) of the conductive lines 106 is in an approximate range from about 5 nm to about 500 nm. In one non-limiting example, the spacing (pitch) between the conductive lines 106 is from about 2 nm to about 500 nm. In more specific non-limiting example, the spacing (pitch) between the conductive lines 106 is from about 5 nm to about 50 nm.

In an embodiment, the lower metallization layer Mx is configured to connect to other metallization layers (not shown). In an embodiment, the metallization layer Mx is configured to provide electrical contact to electronic devices, e.g., transistor, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

In one or more embodiments, the cap layer comprises silicon nitride (SiN). In one or more embodiments, the cap layer is selected from one or more of silicon nitride (SiN), silicon oxide (SiO), silicon oxynitride (SiON), and silicon carbonitride (SiCN). The cap layer 110 protects the insulating layer 104. In one or more embodiments, the cap layer 110 minimizes bowing of the side walls of the trenches 108

Figure 2:
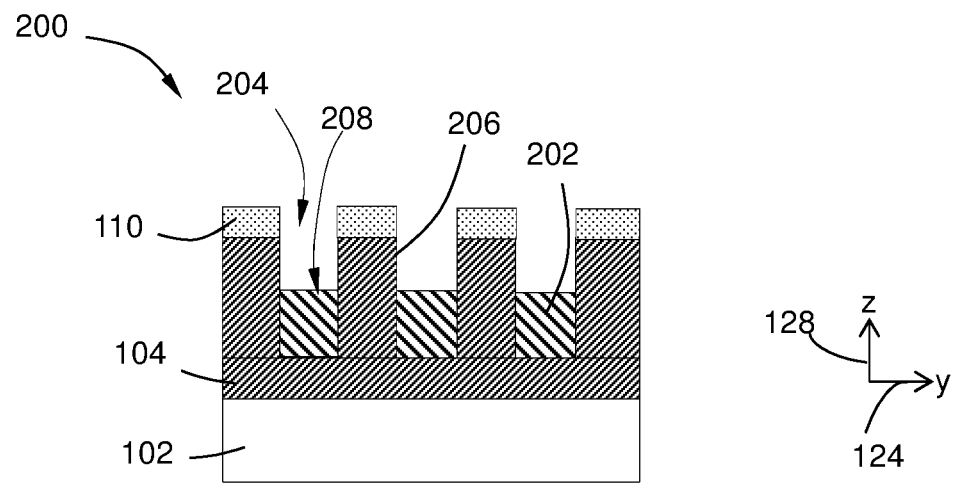
FIG. 2 is a view similar to FIG. 1A, after the conductive lines are recessed according to one embodiment.

FIG. 2 is a view 200 similar to cross-sectional view 112 of FIG. 1A, after the conductive lines 106 are recessed according to one embodiment. The conductive lines 106 are recessed to a predetermined depth to form recessed conductive lines 202. As shown in FIG. 2, trenches 204 are formed in the insulating layer 104. Each trench 204 has sidewalls 206 that are portions of insulating layer 104 and a bottom that is a top surface 208 of the recessed conductive lines 202.

In one embodiment, the depth of the trenches 204 is from about 10 nm to about 500 nm. In one embodiment, the depth of the trenches 204 is from about 10% to about 100% of the thickness of the conductive lines. In one embodiment, the conductive lines 106 are recessed using one or more of wet etching, dry etching, or a combination thereof techniques known to one of ordinary skill in the art of electronic device manufacturing.

Figure 3:
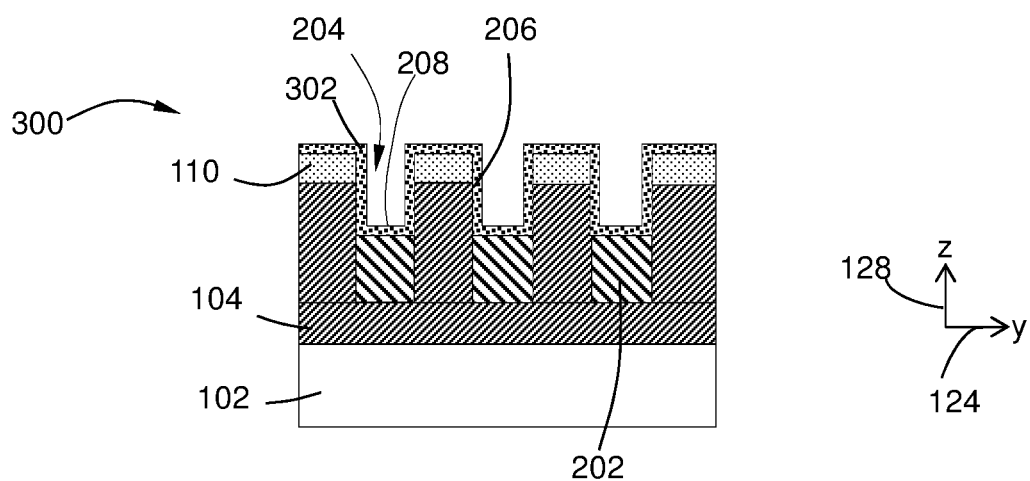
FIG. 3 is a view similar to FIG. 2, after a liner is deposited on the recessed conductive lines according to one embodiment.

FIG. 3 is a view 300 similar to FIG. 2, after a liner 302 is deposited on the recessed conductive lines 202 according to one embodiment. Liner 302 is deposited on the bottom and sidewalls of the trenches 204, as shown in FIG. 3.

In one embodiment, liner 302 is deposited to protect the conductive lines 202 from changing properties later on in a process (e.g., during tungsten deposition, or other processes). In one embodiment, liner 302 is a conductive liner. In another embodiment, liner 302 is a non-conductive liner. In one embodiment, when liner 302 is a non-conductive liner, the liner 302 is removed later on in a process, as described in further detail below. In one embodiment, liner 302 includes titanium nitride (TiN), titanium (Ti), tantalum (Ta), tantalum nitride (TaN), or any combination thereof. In another embodiment, liner 302 is an oxide, e.g., aluminum oxide ($Al_2O_3$), titanium oxide ($TiO_2$). In yet another embodiment, liner 302 is a nitride, e.g., silicon nitride (SiN). In an embodiment, the liner 302 is deposited to the thickness from about 0.5 nm to about 10 nm.

In an embodiment, the liner 302 is deposited using an atomic layer deposition (ALD) technique. In one embodiment, the liner 302 is deposited using one of deposition techniques, such as but not limited to a CVD, PVD, MBE, MOCVD, spin-on, or other liner deposition techniques know to one of ordinary skill in the art of microelectronic device manufacturing.

Figure 4:
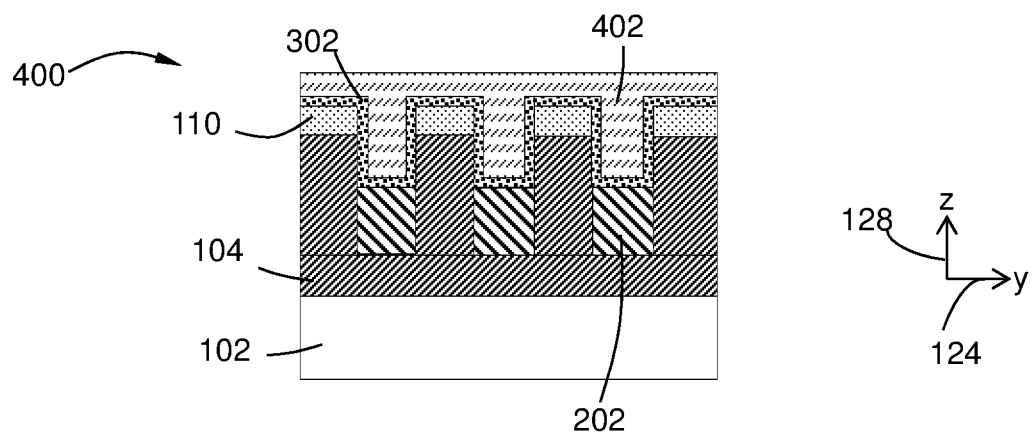
FIG. 4 is a view similar to FIG. 3, after a seed gapfill layer is deposited on the liner according to one embodiment.

FIG. 4 is a view 400 similar to FIG. 3, after a seed gapfill layer 402 is deposited on the liner 302 according to one embodiment. In one embodiment, seed gapfill layer 402 is a self-aligned selective growth seed film. As shown in FIG. 4, seed gapfill layer 402 is deposited on liner 302 on the top surface 208 of the recessed conductive lines 202, the sidewalls 206 of the trenches 204 and top portions of the insulating layer 104. In one embodiment, seed gapfill layer 402 is a tungsten (W) layer, or other seed gapfill layer to provide selective growth pillars. In some embodiments, seed gapfill layer 402 is a metal film or a metal containing film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, seed gapfill layer 402 comprises is a tungsten (W) seed gapfill layer.

In one embodiment, the seed gapfill layer 402 is deposited using one of deposition techniques, such as but not limited to an ALD, a CVD, PVD, MBE, MOCVD, spin-on or other liner deposition techniques known to one of ordinary skill in the art of microelectronic device manufacturing.

Figure 5:
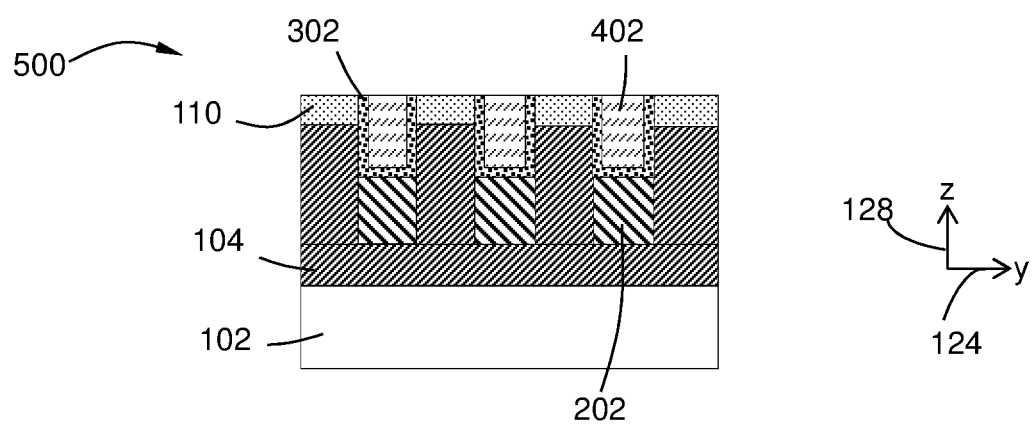
FIG. 5 is a view similar to FIG. 4, after portions of the seed gapfill layer are removed to expose top portions of the insulating layer according to one embodiment.

FIG. 5 is a view 500 similar to FIG. 4, after portions of the seed gapfill layer 402 are removed to expose top portions of the cap layer 110 according to one embodiment. In one embodiment, the portions of the seed gapfill layer 402 are removed using one of the chemical-mechanical polishing (CMP) techniques known to one of ordinary skill in the art of microelectronic device manufacturing.

Figure 6:
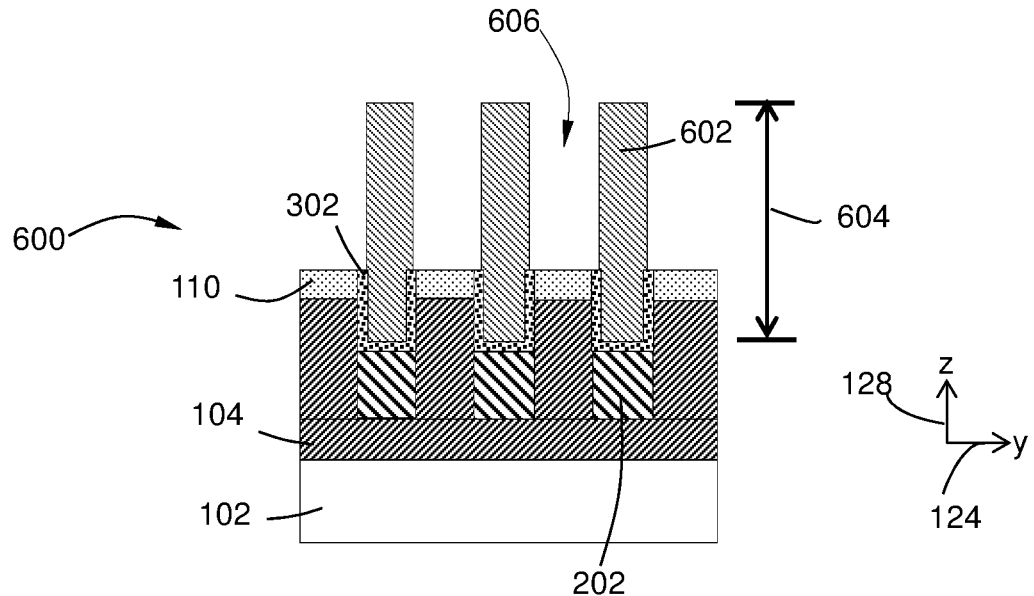
FIG. 6 is a view similar to FIG. 5, after self-aligned selective growth pillars are formed according to one embodiment.

FIG. 6 is a view 600 similar to FIG. 5, after self-aligned selective growth pillars 602 are formed using the seed gapfill layer 402 on the liner 302 on the recessed conductive lines 202 according to one embodiment. As shown in FIG. 6, an array of the self-aligned selective growth pillars 602 has the same pattern as the set of the conductive lines 202. As shown in FIG. 6, the pillars 602 extend substantially orthogonally from the top surfaces of the conductive lines 202. As shown in FIG. 6, the pillars 602 extend along the same direction as the conductive lines 202. As shown in FIG. 6, the pillars are separated by gaps 606.

In one embodiment, the pillars 602 are selectively grown from the seed gapfill layer 402 on portions of the liner 302 on the conductive lines 202. The pillars 602 are not grown on portions of the liner 302 on the insulating layer 104, as shown in FIG. 6. In one embodiment, portions of the seed gapfill layer 402 above the conductive lines 202 are expanded for example, by oxidation, nitridation, or other process to grow pillars 602. In one embodiment, the seed gapfill layer 402 is oxidized by exposure to an oxidizing agent or oxidizing conditions to transform the metal or metal containing seed gapfill layer 402 to metal oxide pillars 602. In one embodiment, pillars 602 include an oxide of one or more metals listed above. In more specific embodiment, pillars 602 include tungsten oxide (e.g., WO, $WO_3$ and other tungsten oxide).

The oxidizing agent can be any suitable oxidizing agent including, but not limited to, $O_2$, $O_3$, $N_2O$, $H_2O$, $H_2O_2$, CO, $CO_2$, $N_2/Ar$, $N_2/He$, $N_2/Ar/He$, ammonium persulphate, organic peroxide agents, such as meta-chloroperbenzoic acid and peracids (e.g. trifluoroperacetic acid, 2,4-dinitroperbenzoic acid, peracetic acid, persulfuric acid, percarbonic acid, perboric acid, and the like), or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In one embodiment, the pillars 602 are formed by oxidation of the seed gapfill layer at any suitable temperature depending on, for example, the composition of the seed gapfill layer and the oxidizing agent. In some embodiments, the oxidation occurs at a temperature in an approximate range of about 25° C. to about 800° C. In some embodiments, the oxidation occurs at a temperature greater than or equal to about 150° C.

The pillars 602 form in a straight-up manner to grow a pillar that is orthogonal to the surface of the cap layer 110. As used in this manner, the term "orthogonal" means that a major plane formed by the sidewalls of the pillars 602 meet the surface of the cap layer 110 with a relative angle in the range of about 75° to about 105°, or in the range of about 80° to about 100°, or in the range of about 85° to about 95°, or about 90°.

In one embodiment, the height 604 of the pillars 602 is in an approximate range from about 5 angstroms (Å) to about 10 microns (μm).

Figure 7:
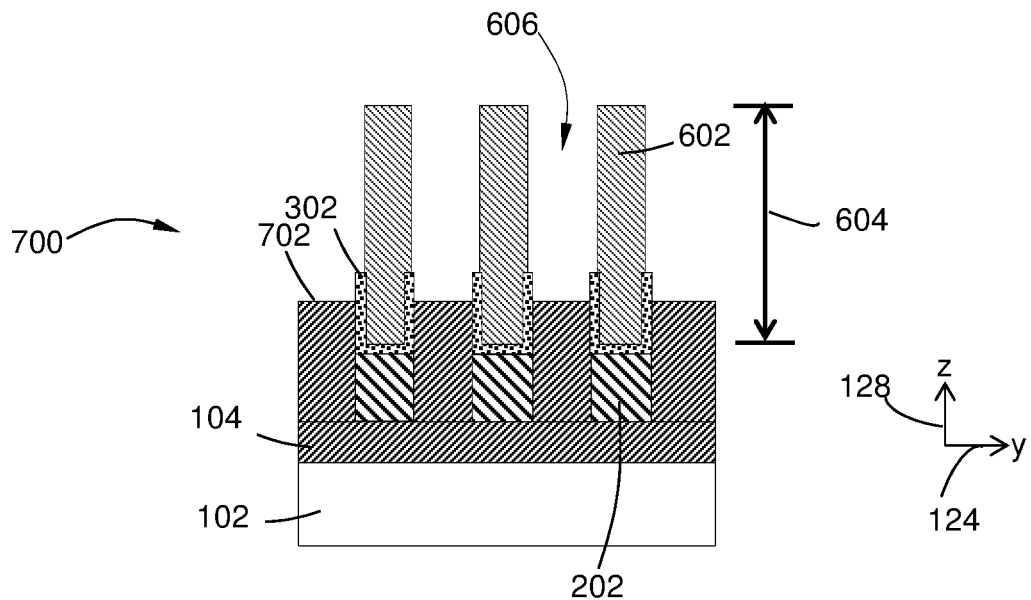
FIG. 7 is a view similar to FIG. 6 after a cap layer is removed according to one embodiment.

FIG. 7 is a view 700 similar to FIG. 6, after at least a portion of the cap layer 110 is selectively removed to expose the top surface 702 of the insulating layer 104. The cap layer 110 can be removed by exposing the substrate 102 to a solution of hot phosphoric acid (i.e. "hot phos"). In one or more embodiments, the entire cap layer 110 is removed by exposing the substrate 102 to a solution of hot phosphoric acid (hot phos). Without intending to be bound by theory, it is thought that the cap layer 110 serves as a sacrificial layer, introduced at the beginning of the process flow and removed midway to make the pillars appear taller.

In one or more embodiments, the solution of hot phosphoric acid (hot phos) has a concentration in the range of 1 wt. % to 99 wt. % in water. In some embodiments, the phosphoric acid concentration is 1 wt. % to 99 wt. %. The substrate 102 can be treated with the solution of hot phosphoric acid (hot phos) for a period in the range of 0.1 minutes to 60 min. In some embodiments, the substrate 102 is treated with the solution of hot phosphoric acid (hot phos) for a period in the range of about 2 seconds to about 2 hours, or about 2 seconds to about 1 hour. In one or more embodiments, the temperature of the hot phosphoric acid solution (hot phos) is in the range of 15° C. to 400° C. In some embodiments, the temperature of the hot phosphoric acid solution (hot phos) is in the range of 25° C. to 500° C. In some embodiments, the temperature of the hot phosphoric acid solution (hot phos) is greater than 500° C.

In one or more embodiments, the removal of the cap layer 110 increases the aspect ratio. In one or more embodiments, the aspect ratio is in a range of 1:1 to 10:1.

It was unexpectedly and advantageously found by transmission electron microscopy (TEM) and electron energy loss spectroscopy (EELS) that the hot phos removal process is selective to the cap layer 110 and does not affect the tungsten oxide layer.

Figure 8:
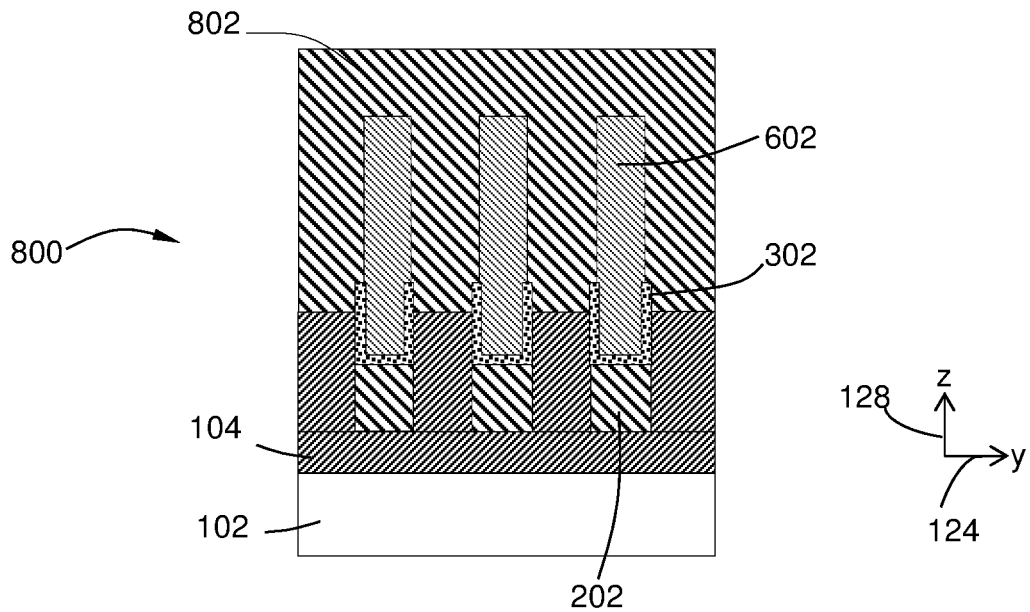
FIG. 8 is a view similar to FIG. 7 after an insulating layer is deposited to overfill the gaps between the pillars according to one embodiment.

FIG. 8 is a view 800 similar to FIG. 7, and, after an insulating layer 802 is deposited to overfill the gaps 606 between the pillars 602 according to one embodiment. As shown in FIG. 8, insulating layer 802 is deposited on the opposing sidewalls 804 and top portions 806 of the pillars 602 and through the gaps 606 on the portions of the insulating layer 104 and liner 302 between the pillars 602.

In one embodiment, insulating layer 802 is a low-k gapfill layer. In one embodiment, insulating layer 802 is a flowable silicon oxide (FSiOx) layer. In at least some embodiments, insulating layer 802 is an oxide layer, e.g., silicon dioxide ($SiO_2$), or any other electrically insulating layer determined by an electronic device design. In one embodiment, insulating layer 802 is an interlayer dielectric (ILD). In one embodiment, insulating layer 802 is a low-k dielectric that includes, but is not limited to, materials such as, e.g., silicon dioxide, silicon oxide, a carbon based material, e.g., a porous carbon film, carbon doped oxide ("CDO"), e.g.

carbon doped silicon dioxide, porous silicon dioxide, porous silicon oxide carbide hydride (SiOCH), silicon nitride, or any combination thereof. In one embodiment, insulating layer 802 is a dielectric material having k-value less than 3. In more specific embodiment, insulating layer 802 is a dielectric material having k-value in an approximate range from about 2.2 to about 2.7. In one embodiment, insulating layer 802 includes a dielectric material having k-value less than 2. In one embodiment, insulating layer 802 represents one of the insulating layers described above with respect to insulating layer 104.

In one embodiment, insulating layer 802 is a low-k interlayer dielectric to isolate one metal line from other metal lines. In one embodiment, insulating layer 802 is deposited using one of deposition techniques, such as but not limited to a CVD, spin-on, an ALD, PVD. MBE, MOCVD, or other low-k insulating layer deposition techniques known to one of ordinary skill in the art of microelectronic device manufacturing.

Figure 9:
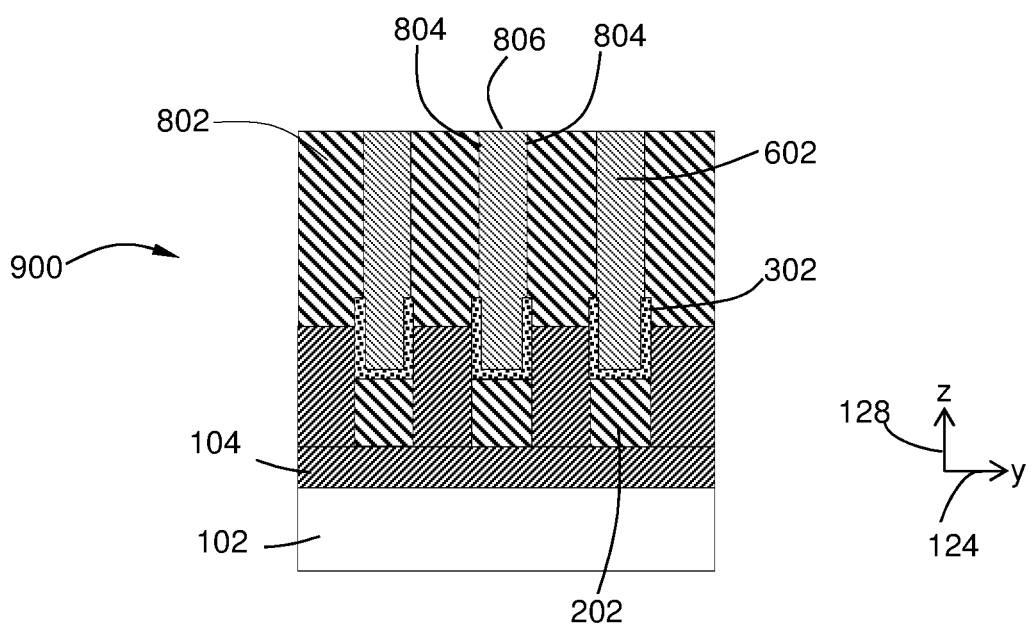
FIG. 9 is a view similar to FIG. 8, after a portion of the insulating layer is removed to expose the top portions of the pillars according to one embodiment.

FIG. 9 is a view 900 similar to FIG. 8, after a portion of the insulating layer 802 is removed to expose the top portions 806 of the pillars 602 according to one embodiment. In one embodiment, the portion of the insulating layer 802 is removed using a CMP technique known to one of ordinary skill in the art of microelectronic device manufacturing. In one embodiment, the portion of the insulating layer 802 is etched back to expose the top portions 806 of the pillars 602 using one or more of the dry and wet etching techniques known to one of ordinary skill in the art of microelectronic device manufacturing.

In one embodiment, insulating layer 802 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing. In another embodiment, insulating layer 802 is deposited to overfill the gaps 606 between the pillars 602, as described with respect to FIG. 8, and then a portion of the insulating layer 802 is etched back to expose upper portions 808 of the sidewalls 804 and top portions 806 of the pillars 602 using one or more of the dry and wet etching techniques known to one of ordinary skill in the art of microelectronic device manufacturing.

Figure 10:
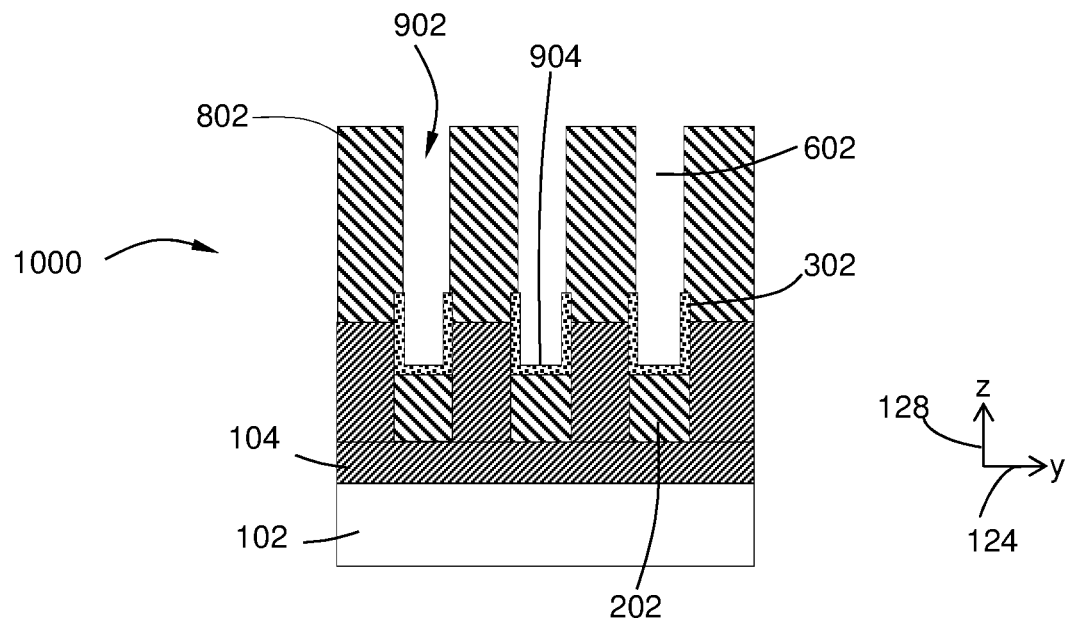
FIG. 10 is a view similar to FIG. 9 after the self-aligned selectively grown pillars are selectively removed to form trenches according to one embodiment.

FIG. 10 is a view 1000 similar to FIG. 9 after the self-aligned selectively grown pillars 602 are selectively removed to form trenches 902 according to one embodiment. As shown in FIG. 10, the pillars 602 are removed selectively to the insulating layer 802 and liner 302. In another embodiment, when liner 302 is a non-conductive liner, liner 302 is removed. In one embodiment, the pillars 602 and liner 302 are removed selectively to the insulating layers 802 and 104 and conductive lines 202. As shown in FIG. 10, trenches 902 are formed in the insulating layers 802 and 104. Trenches 902 extend along the recessed conductive lines 202. As shown in FIG. 10, each trench 902 has a bottom that is a bottom portion 904 of liner 302 and opposing sidewalls that include a sidewall portion 906 of liner 302 and a portion of insulating layer 802. In another embodiment, when liner 302 is removed, each trench 902 has a bottom that is recessed conductive lines 202 and opposing sidewalls that include portions of insulating layers 802 and 104. Generally, the aspect ratio of the trench refers to the ratio of the depth of the trench to the width of the trench. In one embodiment, the aspect ratio of each trench 902 is in an approximate range from about 1:1 to about 200:1.

In one embodiment, the pillars 602 are selectively removed using one or more of the dry and wet etching techniques known to one of ordinary skill in the art of electronic device manufacturing. In one embodiment, the pillars 602 are selectively wet etched by e.g., 5 wt. % of ammonium hydroxide ($NH_4OH$) aqueous solution at the temperature of about 80 degrees C. In one embodiment, hydrogen peroxide ($H_2O_2$) is added to the 5 wt. % $NH_4OH$ aqueous solution to increase the etching rate of the pillars 602. In one embodiment, the pillars 602 are selectively wet etched using hydrofluoric acid (HF) and nitric acid ($HNO_3$) in a ratio of 1:1. In one embodiment, the pillars 602 are selectively wet etched using HF and $HNO_3$ in a ratio of 3:7 respectively. In one embodiment, the pillars 602 are selectively wet etched using HF and $HNO_3$ in a ratio of 4:1, respectively. In one embodiment, the pillars 602 are selectively wet etched using HF and $HNO_3$ in a ratio of 30%:70%, respectively. In one embodiment, the pillars 602 including tungsten (W), titanium (Ti), or both titanium and tungsten are selectively wet etched using $NH_4OH$ and $H_2O_2$ in a ratio of 1:2, respectively. In one embodiment, the pillars 602 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 602 are selectively wet etched using diluted or concentrated one or more of the chemistries including hydrochloric acid (HCl), $HNO_3$, sulfuric acid ($H_2SO_4$), HF, and $H_2O_2$. In one embodiment, the pillars 602 are selectively wet etched using HF, $HNO_3$ and acetic acid ($CH_3COOH$) in a ratio of 4:4:3, respectively. In one embodiment, the pillars 602 are selectively dry etched using a bromotrifluoromethane (CBrF3) reactive ion etching (RIE) technique. In one embodiment, the pillars 602 are selectively dry etched using a chlorine, fluorine, bromine or any combination thereof based chemistries. In one embodiment, the pillars 602 are selectively wet etched using hot or warm Aqua Regia mixture including HCl and $HNO_3$ in a ratio of 3:1, respectively. In one embodiment, the pillars 602 are selectively etched using alkali with oxidizers (potassium nitrate ($KNO_3$) and lead dioxide ($PbO_2$)). In one embodiment, the liner 302 is selectively removed using one or more of the dry and wet etching techniques known to one of ordinary skill in the art of electronic device manufacturing.

Figure 11:
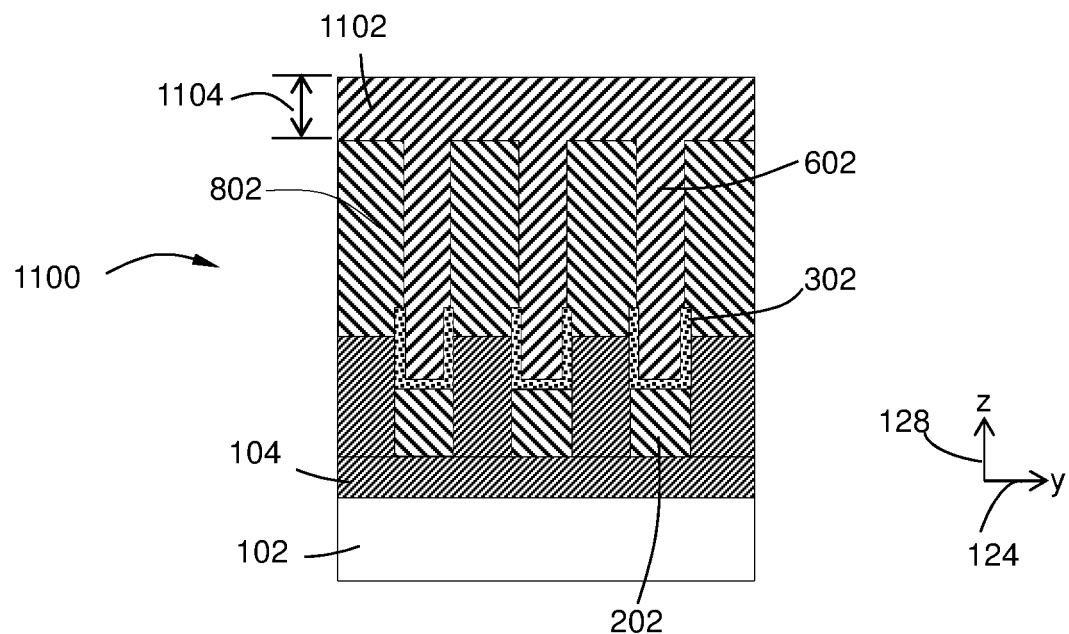
FIG. 11 is a view similar to FIG. 10 after an insulating layer is deposited into trenches according to one embodiment.

FIG. 11 is a view 1100 and that is similar to FIG. 10 after an insulating layer 1102 is deposited into trenches 902 according to one embodiment. As shown in FIG. 11, insulating layer 1102 overfills the trenches 902 so that portions of the insulating layer 1102 are deposited on the top portions of the insulating layer 802. In one embodiment, the thickness of the insulating layer 1102 is greater or similar to the thickness of the insulating layer 802. In one embodiment, the thickness 1104 is at least two or three times greater than the thickness of the insulating layer 802. In another embodiment, portions of the insulating layer 1102 are removed using one or more of CMP or a back etch technique to even out with the top portions of the insulating layer 802, and then other insulating layer (not shown) is deposited onto the top portions of the insulating layer 802 and insulating layer 1102. As shown in FIG. 11, insulating layer 1102 is deposited on the sidewalls and bottom of the trenches 904. As shown in FIG. 11, the insulating layer 1102 is deposited on the liner 302 and portions of the insulating layer 802. In another embodiment, when the liner 302 is removed, the insulating layer 1102 is directly deposited on the recessed conductive lines 202 and portions of the insulating layer 104 and insulating layer 802. In one embodiment, the insulating layer 1102 is etch selective to the insulating layer 802.

Generally, etch selectivity between two materials is defined as the ratio between their etching rates at similar etching conditions. In one embodiment, the ratio of the etching rate of the insulating layer 1102 to that of the insulating layer 802 is at least 5:1, 10:1, 15:1, 20:1 or 25:1. In one embodiment, the ratio of the etching rates of the insulating layer 1102 to that of the insulating layer 802 is in an approximate range from about 2:1 to about 50:1, or in the range of about 3:1 to about 30:1, or in the range of about 4:1 to about 20:1.

In one embodiment, insulating layer 1102 is a low-k gapfill layer. In one embodiment, insulating layer 1102 is a flowable silicon oxide carbide (FSiOC) layer. In some other embodiments, insulating layer 1102 is an oxide layer, e.g., silicon dioxide, or any other electrically insulating layer determined by an electronic device design. In one embodiment, insulating layer 1102 is an interlayer dielectric (ILD). In one embodiment, insulating layer 1102 is a low-k dielectric that includes, but is not limited to, materials such as, e.g., silicon dioxide, silicon oxide, a carbon based material, e.g., a porous carbon film carbon doped oxide ("CDO"), e.g., carbon doped silicon dioxide, porous silicon dioxide, porous silicon oxide carbide hydride (SiOCH), silicon nitride, or any combination thereof. In one embodiment, insulating layer 1102 is a dielectric material having k-value less than 3. In more specific embodiment, insulating layer 1102 is a dielectric material having k-value in an approximate range from about 2.2 to about 2.7. In one embodiment, insulating layer 1102 includes a dielectric material having k-value less than 2. In one embodiment, insulating layer 1102 represents one of the insulating layers described above with respect to insulating layer 104 and insulating layer 802.

In one embodiment, insulating layer 1102 is a low-k interlayer dielectric to isolate one metal line from other metal lines. In one embodiment, insulating layer 1102 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

FIG. 12 is a view 1200 after a hard mask layer 1202 is deposited on insulating layer 1204 according to one embodiment. FIG. 12 is different from FIG. 11 in that the liner 302 is removed, so that insulating layer 1204 is directly deposited on the recessed conductive lines 202 and portions of the insulating layer 104 and insulating layer 802, as described above. In one embodiment, hard mask layer 1202 is a metallization layer hard mask. As shown in FIG. 11, the hard mask layer 1202 is patterned to define a plurality of trenches 1206. As shown in FIG. 11, the trenches 1206 extend along an Y-axis (direction) 124 that crosses an X-axis (direction) 122 at an angle. In one embodiment, direction 124 is substantially perpendicular to direction 124. In one embodiment, patterned hard mask layer 1202 is a carbon hard mask layer, a metal oxide hard mask layer, a metal nitride hard mask layer, a silicon nitride hard mask layer, a silicon oxide hard mask layer, a carbide hard mask layer, or other hard mask layer known to one of ordinary skill in the art of microelectronic device manufacturing. In one embodiment, the patterned hard mask layer 1202 is formed using one or more hard mask patterning techniques known to one of ordinary skill in the art of microelectronic device manufacturing. In one embodiment, the insulating layer 1102 is etched through a patterned hard mask layer to form trenches 1206 using one or more of etching techniques known to one of ordinary skill in the art of microelectronic device manufacturing. In one embodiment, the size of trenches in the insulating layer 1102 is determined by the size of conductive lines formed later on in a process.

FIG. 13A is a view 1300 similar to FIG. 12, after a mask layer 1302 is deposited on an insulating layer 1304 on a patterned hard mask layer 1202 according to one embodiment. FIG. 13B is a cross-sectional view 1310 of FIG. 13A along an axis C-C'.

As shown in FIGS. 13A and 13B, an opening 1306 is formed in mask layer 1202. Opening 1306 is formed above one of the conductive lines 202, as shown in FIGS. 13A and 13B. In one embodiment, the opening 1306 defines a trench portion of the fully self-aligned via formed later on in a process.

In one embodiment, mask layer 1302 includes a photoresist layer. In one embodiment, mask layer 1302 includes one or more hard mask layers. In one embodiment, the insulating layer 1304 is a hard mask layer. In one embodiment, insulating layer 1304 includes a bottom anti-reflective coating (BARC) layer. In one embodiment, insulating layer 1304 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer, or any combination thereof. In one embodiment, insulating layer 1304 represents one of the insulating layers described above. In one embodiment, mask layer 1302 is deposited using one or more mask layer deposition techniques known to one of ordinary skill in the art of microelectronic device manufacturing. In one embodiment, insulating layer 1304 is deposited using one of deposition techniques, such as but not limited to a CVD, PVD, MBE, NOCVD, spin-on, or other insulating layer deposition techniques known to one of ordinary skill in the art of microelectronic device manufacturing. In one embodiment, the opening 1306 is formed using one or more of the patterning and etching techniques known to one of ordinary skill in the art of microelectronic device manufacturing.

Figure 14A:
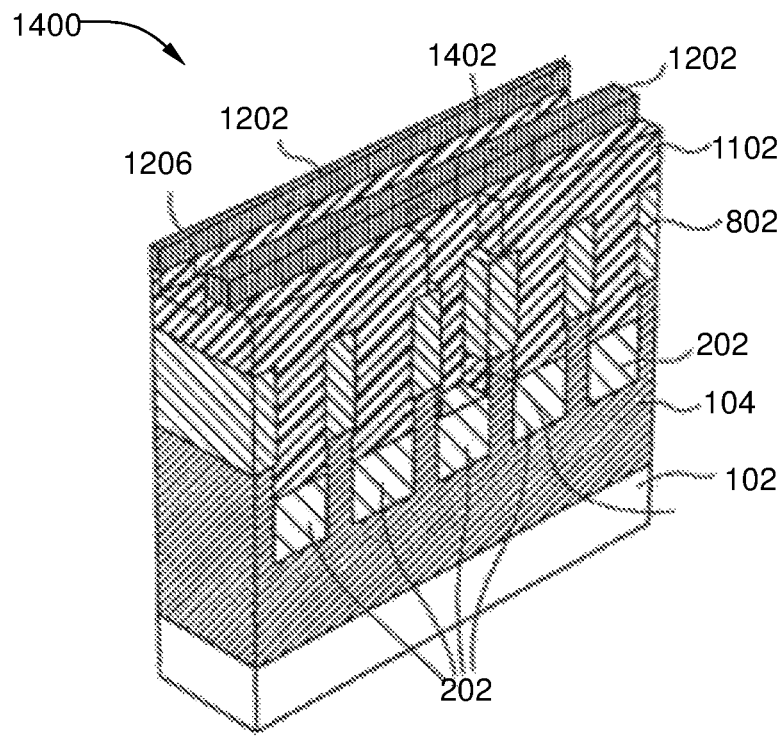
FIG. 14A is a view similar to FIG. 13B after the insulating layer is selectively etched according to one embodiment.
Figure 14B:
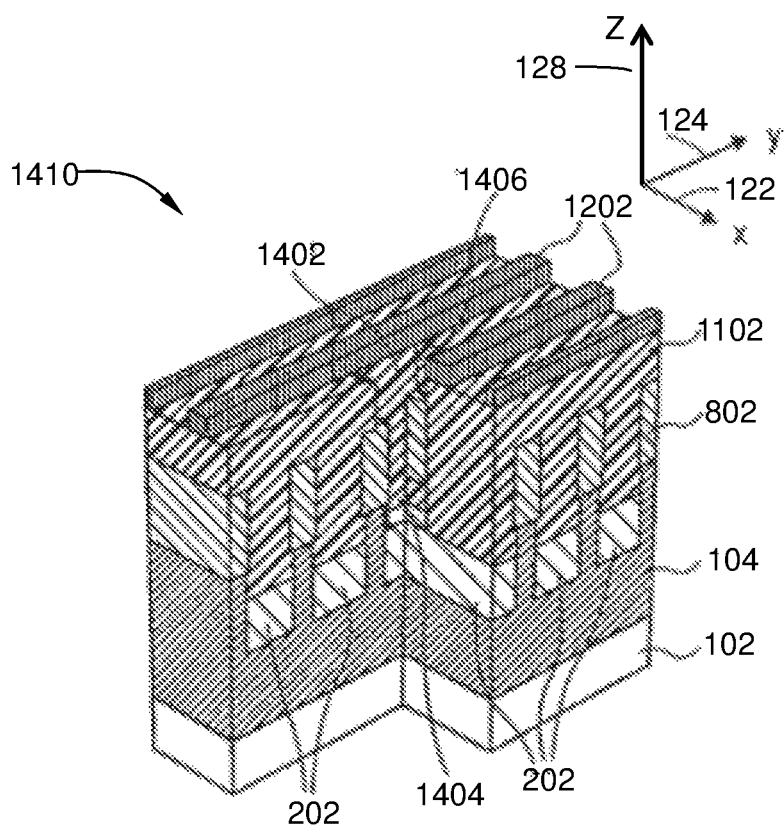
FIG. 14B is a view similar to FIG. 13A after the insulating layer is selectively etched according to one embodiment.

FIG. 14A is a view 1400 similar to FIG. 13B after the insulating layer 1304 and hard mask layer 1202 are selectively etched through opening 1306 to form an opening 1402 according to one embodiment. FIG. 14B is a view 1410 similar to FIG. 13A after the insulating layer 1304 and insulating layer 1102 are selectively etched through opening 1306 to form opening 1402 according to one embodiment.

FIG. 14B is different from FIG. 13A in that FIG. 14B shows a cut through opening 1402 along X-axis 122 and Y-axis 124. As shown in FIGS. 14A and 14B, opening 1402 includes a via portion 1404 and a trench portion 1406. As shown in FIGS. 14A and 14B, via portion 1404 of the opening 1402 is limited along Y-axis 124 by insulating layer 802. Via portion 1404 of the opening 1402 is self-aligned along Y-axis 124 to one of the conductive lines 202. As shown in FIGS. 14A and 14B, trench portion 1406 is limited along X-axis 122 by the features of the hard mask layer 1202 that extend along Y-axis 124. In one embodiment, insulating layer 1102 is selectively etched relative to the insulating layer 802 to form opening 1402.

In one embodiment, hard mask layer 1202 is selectively etched relative to the insulating layer 802 to form opening 1402. As shown in FIGS. 14A and 14B, mask layer 1302 and insulating layer 1304 are removed. In one embodiment, mask layer 1302 is removed using one or more of the mask layer removal techniques known to one of ordinary skill in the art of microelectronic device manufacturing. In one embodiment, insulating layer 1304 is removed using one or more of the etching techniques known to one of ordinary skill in the art of microelectronic device manufacturing.

Figure 15A:
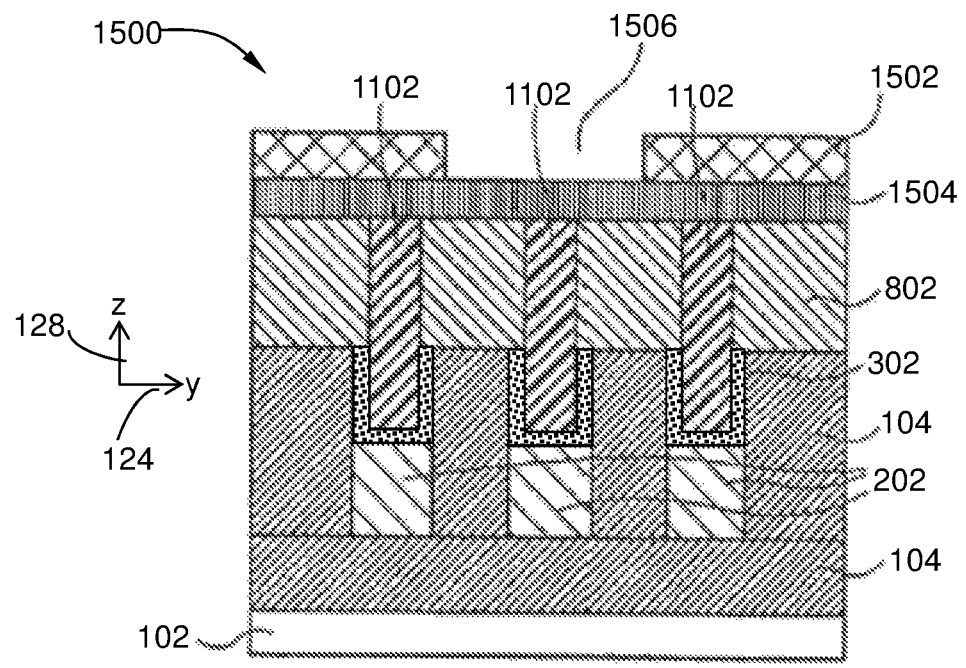
FIG. 15A is a view similar to FIG. 11 after a mask layer is deposited on a hard mask layer according to one embodiment.
Figure 15B:
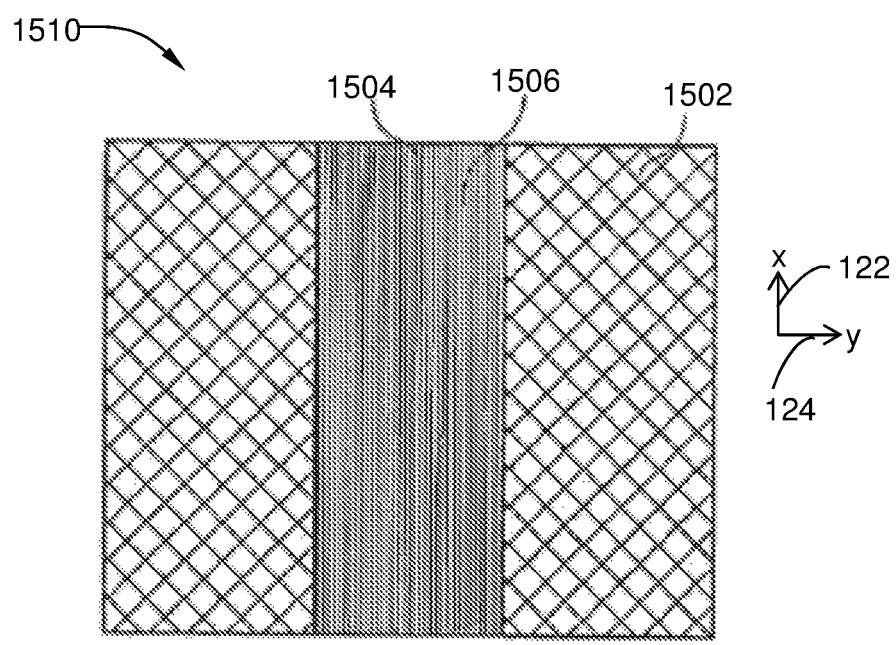
FIG. 15B is a top view of the electronic device structure depicted in FIG. 15A.

FIG. 15A is a view 1500 similar to FIG. 11, after a mask layer 1502 is deposited on the exposed insulating layer 802 and insulating layer 1102 according to one embodiment. FIG. 15B is a top view 1510 of the electronic device structure depicted in FIG. 15A. As shown in FIG. 15A, a portion of the insulating layer 1102 is removed to even out top portions of the insulating layer 802 with top portions of the insulating layer 1102. As shown in FIGS. 15A and 15B, mask layer 1502 has an opening 1506 to expose hard mask layer 1502.

In one embodiment, the portion of the insulating layer 1102 is removed using a CMP technique known to one of ordinary skill in the art of microelectronic device manufacturing. In one embodiment, a portion of the insulating layer 1102 is etched back to expose the top portion of the insulating layer 802. In another embodiment, a portion of the insulating layer 802 is etched back to a predetermined depth to expose upper portions of the sidewalls and top portions of the insulating layer 1102 in the trenches 902. In one embodiment, the portion of the insulating layer 802 is etched back using one or more of the dry and wet etching techniques known to one of ordinary skill in the art of microelectronic device manufacturing.

In one embodiment, mask layer 1502 includes a photoresist layer. In one embodiment, mask layer 1502 includes one or more hard mask layers. In one embodiment, mask layer 1502 is a tri-layer mask stack, e.g., a 193 nm immersion (193i) or EUV resist mask on a middle layer (ML) (e.g., a silicon containing organic layer or a metal containing dielectric layer) on a bottom anti-reflective coating (BARC) layer on a silicon oxide hard mask. In one embodiment, the hard mask layer 1504 is a metallization layer hard mask to pattern the conductive lines of the next metallization layer. In one embodiment, hard mask layer 1504 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer or any combination thereof. In one embodiment, hard mask layer 1504 represents one of the hard mask layers described above.

In one embodiment, the insulating layer 802 and the insulating layer 1102 are patterned and etched using hard mask 1504 to form trenches using one or more patterning and etching techniques known to one or ordinary skill in the art of microelectronic device manufacturing. In one embodiment, the size of trenches in the insulating layer 802 and insulating layer 1102 is determined by the size of conductive lines formed later on in a process.

In one embodiment, the mask layer 1502 is deposited using one or more of the mask deposition techniques known to one of ordinary skill in the art of microelectronic device manufacturing. In one embodiment, hard mask layer 1504 is deposited using one or more hard mask layer deposition techniques, such as but not limited to a CVD, PVD, MBE, MOCVD, spin-on, or other hard mask deposition known to one of ordinary skill in the art of microelectronic device manufacturing. In one embodiment, the opening 1506 is formed using one or more of the patterning and etching techniques known to one of ordinary skill in the art of microelectronic device manufacturing.

Figure 16A:
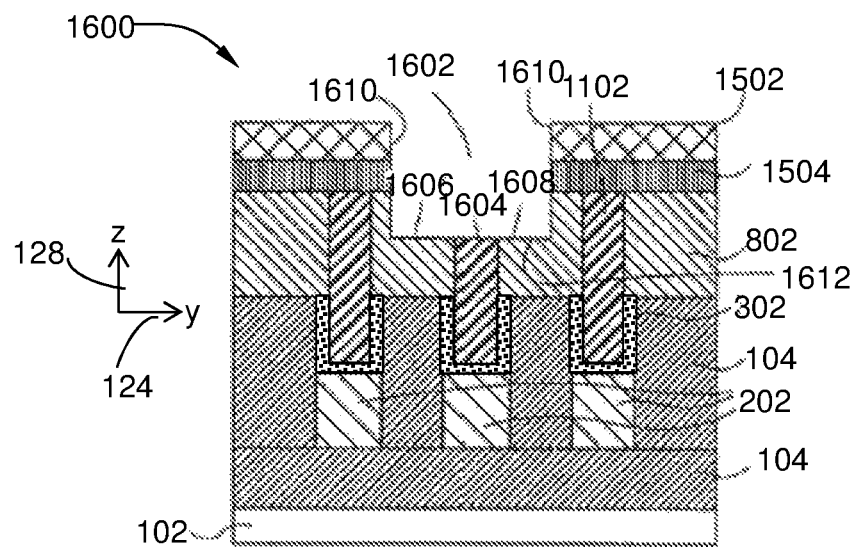
FIG. 16A is a view similar to FIG. 15A after portions of the hard mask layer and the insulating layer are removed according to one embodiment.
Figure 16B:
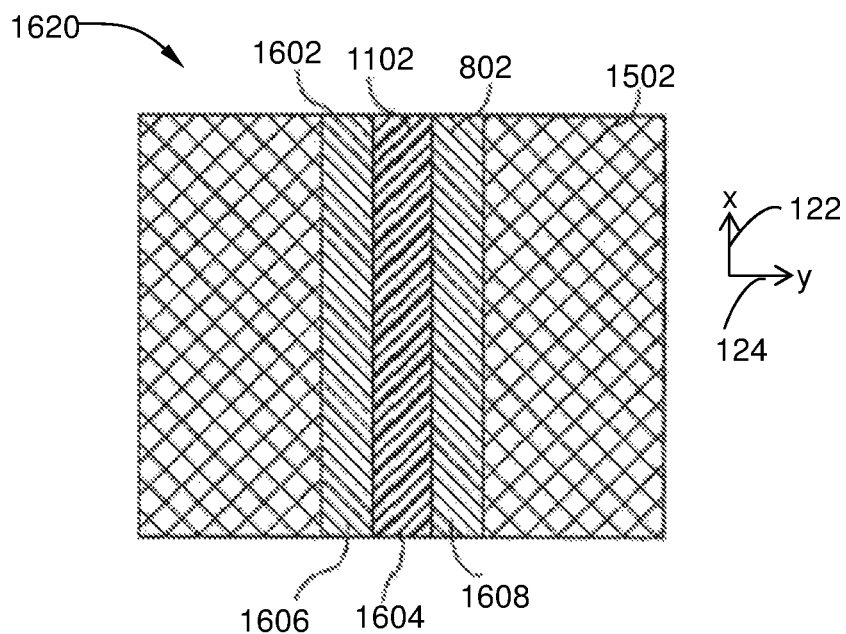
FIG. 16B is a top view of the electronic device structure depicted in FIG. 16A.

FIG. 16A is a view 1600 similar to FIG. 15A, after portions of the hard mask layer 1504, insulating layer 802 and insulating layer 1102 are removed through opening 1506 to form an opening 1602 in insulating layer 802 according to one embodiment. FIG. 16B is a top view 1620 of the electronic device structure depicted in FIG. 16A. In one embodiment, opening 1602 is a trench opening for a via. As shown in FIGS. 16A and 16B, opening 1602 includes a bottom 1612 that includes a portion 1604 of the insulating layer 1102 between portions 1606 and 1608 of the insulating layer 802. As shown in FIGS. 16A and 16B, opening 1602 includes opposing sidewalls 1610 that include portions of the insulating layer 802. In one embodiment, each sidewall 1610 is substantially orthogonal to bottom 1612. In another embodiment, each sidewall 1610 is slanted relative to bottom 1612 at an angle other than 90 degrees, so that an upper portion of the opening 1602 is greater than a lower portion of the opening 1602.

In one embodiment, opening 1602 having slanted sidewalls is formed using an angled non-selective etch. In one embodiment, hard mask layer 1504 is removed using one or more of wet etching, dry etching, or a combination thereof techniques known to one of ordinary skill in the art of microelectronic device manufacturing. In one embodiment, insulating layer 802 and insulating layer 1102 are removed using a non-selective etch in a trench first dual damascene process. In one embodiment, insulating layer 802 and insulating layer 1102 are etched down to the depth that is determined by time. In another embodiment, insulating layer 802 and insulating layer 1102 are etched non-selectively down to an etch stop layer (not shown). In one embodiment, insulating layer 802 and insulating layer 1102 are non-selectively etched using one or more of wet etching, dry etching, or a combination thereof techniques known to one of ordinary skill in the art of electronic device manufacturing.

Figure 17A:
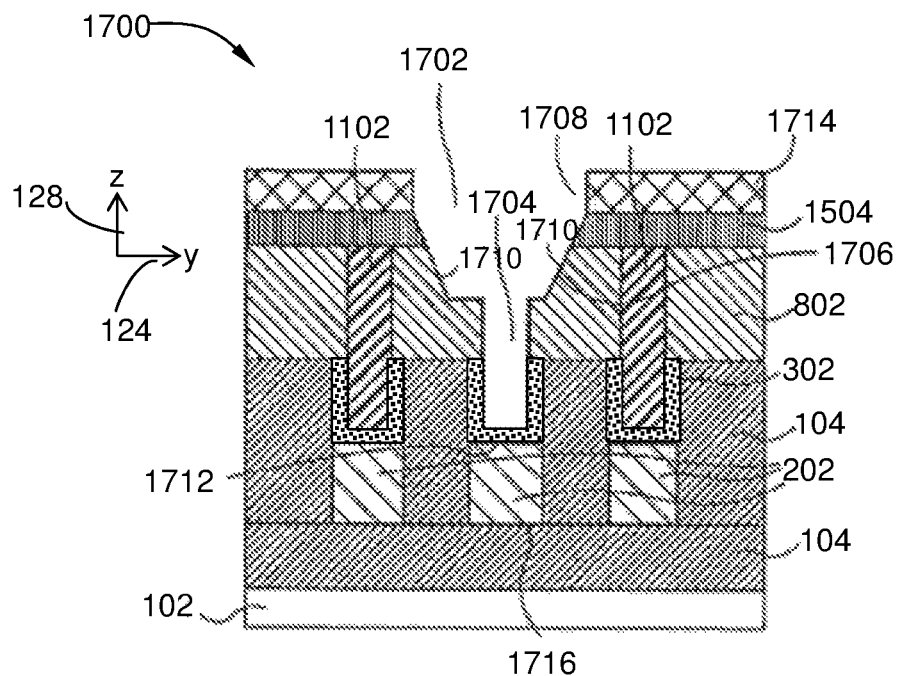
FIG. 17A is a view similar to FIG. 16A after a fully self-aligned opening is formed in insulating layer according to one embodiment.
Figure 17B:
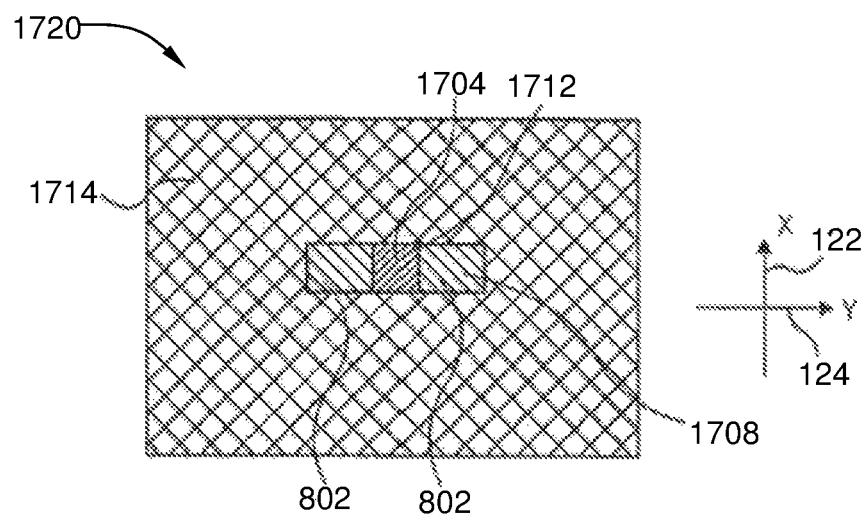
FIG. 17B is a top view of the electronic device structure depicted in FIG. 17A.

FIG. 17A is a view 1700 similar to FIG. 16A, after a fully self-aligned opening 1702 is formed in insulating layer 802 according to one embodiment. FIG. 17B is a top view 1720 of the electronic device structure depicted in FIG. 17A. As shown in FIGS. 17A and 17B, mask layer 1502 is removed. Mask layer 1502 can be removed using one of the mask layer removal techniques known to one of ordinary skill in the art of microelectronic device manufacturing. A patterned mask layer 1714 is formed on hard mask layer 1504. As shown in FIG. 17B, patterned mask layer 1714 is deposited on the hard mask layer 1504 and into opening 1602. Patterned mask layer 1714 has an opening 1708. Patterned mask layer 1714 can be formed using one or more of the mask layer depositing, patterning and etching techniques known to one of ordinary skill in the art of microelectronic device manufacturing.

Fully self-aligned opening 1702 is formed through mask opening 1708. Fully self-aligned opening 1702 includes a trench opening 1706 and a via opening 1704, as shown in FIGS. 17A and 17B. Via opening 1704 is underneath trench opening 1706. In one embodiment, trench opening 1706 is the part of that is exposed through opening 1708.

In one embodiment, via opening 1704 is formed by selectively etching insulating layer 1102 relative to the insulating layer 802 through mask opening 1708 and trench opening 1706. In one embodiment, trench opening 1706 extends along Y-axis 124. As shown in FIG. 17B, trench opening 1706 is greater along Y-axis 124 than along X-axis 122.

In one embodiment, trench opening 1706 of the opening 1702 is self-aligned along X-cross-sectional axis 122 between the features of the hard mask layer 1504 that are used to pattern the upper metallization layer conductive lines that extend along Y-axis 124 (not shown). The via opening 1704 of the opening 1702 is self-aligned along Y-axis 124 by the insulating layer 802 that is left intact by selectively etching the portion 1604 of the insulating layer 1102 relative to the insulating layer 802. This provides an advantage as the size of the trench opening 1706 does not need to be limited to the size of the cross-section between the conductive line 1716 and one of the conductive lines of the upper metallization layer that provides more flexibility for the lithography equipment. As the portion 1604 is selectively removed relative to the insulating layer 802, the size of the trench opening increases.

As shown in FIGS. 16A and 16B, the portion 1604 is self-aligned with a conductive line 1716 that is one of the lower metallization layer conductive lines 202. That is, the opening 1702 is self-aligned along both X and Y axes.

FIG. 17A is different from FIG. 16A in that FIG. 17A illustrates trench opening 1706 having slanted sidewalls 1710. Each sidewall 1710 is at an angle other than 90 degrees to the top surface of the substrate 102, so that an upper portion of the trench opening 1706 is greater than a lower portion of the trench opening 1706. In another embodiment, the sidewalls 1710 are substantially orthogonal to the top surface of the substrate 102.

In one embodiment, mask layer 1714 includes a photoresist layer. In one embodiment, mask layer 1714 includes one or more hard mask layers. In one embodiment, mask layer 1714 is tri-layer mask stack, e.g., a 193i or EUV resist mask on a ML (e.g., a silicon containing organic layer or a metal containing dielectric layer) on a BARC layer on a silicon oxide hard mask. As shown in FIGS. 17A and 17B, via opening 1704 exposes a portion 1712 of the liner 302 on conductive line 1716. In another embodiment, when the liner 302 is removed, the via opening 1704 exposes conductive line 1716.

Figure 18A:
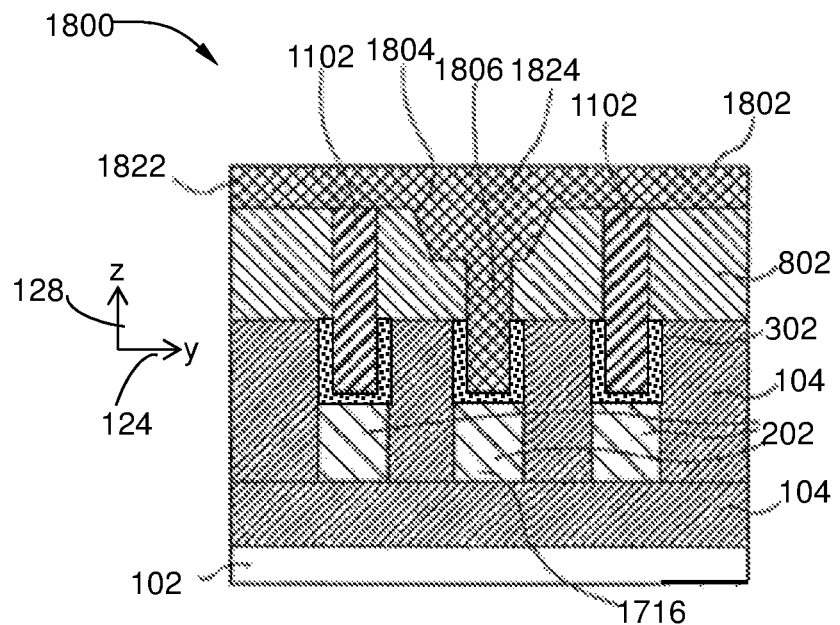
FIG. 18A is a view similar to FIG. 17A after an upper metallization layer comprising conductive lines extending along a Y-axis is formed according to one embodiment.
Figure 18B:
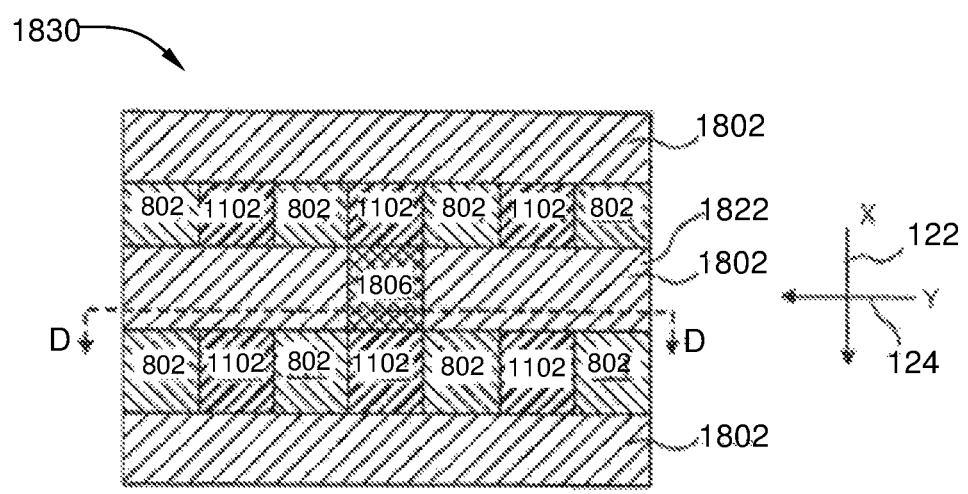
FIG. 18B is a top view of the electronic device structure depicted in FIG. 18A.

FIG. 18A is a view 1800 similar to FIG. 17A, after an upper metallization layer My comprising conductive lines extending along Y-axis 124 is formed according to one embodiment. FIG. 18B is a top view 1830 of the electronic device structure depicted in FIG. 18A. FIG. 18A is a cross-sectional view of FIG. 18B along an axis D-D'. As shown in FIG. 18A, mask layer 1502 and hard mask layer 1504 are removed. In one embodiment, each of the mask layer 1502 and hard mask layer 1504 is removed using one or more of the hard mask layer removal techniques know in one of ordinary skill in the art of microelectronic device manufacturing.

An upper metallization layer My includes a set of conductive lines 1802 that extend on portions of insulating layer 1102 and portions insulating layer 802. As shown in FIG. 18B, the portions of the insulating layer 1102 are between the portions of the insulating layer 802. Conductive lines 1802 extend along Y-axis 124. A fully self-aligned via 1824 includes a trench portion 1804 and a via portion 1806. Via portion 1806 is underneath trench portion 1804. The fully self-aligned via 1824 is between the lower metallization layer comprising conductive lines 202 that extend along X-axis 122 and the upper metallization layer comprising conductive lines 1802. As shown in FIGS. 18A and 18B, the via portion 1806 is on liner 302 on conductive line 1716. As shown in FIGS. 18A and 18B, the via portion 1806 of the via 1824 is self-aligned along the Y-axis 124 to conductive line 1716 that is one of the conductive lines 202. The via portion 1806 of the via 1824 is self-aligned along the X-axis (direction) 122 to a conductive line 1822 that is one of the conductive lines 1802. In one embodiment, when liner 302 is removed, the via portion 1806 is directly on conductive line 1716. As shown in FIGS. 18A and 18B, the via portion 1806 is a part of the conductive line 1822. As shown in FIGS. 18A and 18B, the size of the via portion 1806 is determined by the size of the cross-section between the conductive line 1716 and conductive line 1822.

In one embodiment, forming the conductive lines 1802 and via 1824 involves filling the trenches in the insulating layer and the opening 1702 with a layer of conductive material. In one embodiment, a base layer (not shown) is first deposited on the internal sidewalls and bottom of the trenches and the opening 1702, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g., copper).

In one embodiment, to form the base layer, the conductive barrier layer is deposited onto the sidewalls and bottom of the trenches, and then the seed layer is deposited on the conductive barrier layer. In another embodiment, the conductive base layer includes the seed layer that is directly deposited onto the sidewalls and bottom of the trenches. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper or cobalt, is deposited onto the seed layer of base later of copper, by an electroplating process. In one embodiment, the conductive layer is deposited into the trenches using a damascene process known to one of ordinary skill in the art of microelectronic device manufacturing. In one embodiment, the conductive layer is deposited onto the seed layer in the trenches and in the opening 1702 using a selective deposition technique, such as but not limited to electroplating, electrolysis, a CVD, PVD, MBE, MOCVD, ALD, spin-on, or other deposition techniques known to one of ordinary skill in the art of microelectronic device manufacturing.

In one embodiment, the choice of a material for conductive layer for the conductive lines 1802 and via 1824 determines the choice of a material for the seed layer. For example, if the material for the conductive lines 1802 and via 1824 includes copper, the material for the seed layer also includes copper. In one embodiment, the conductive lines 1802 and via 1824 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 1802 and via 1824 include metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, portions of the conductive layer and the base layer are removed to even out top portions of the conductive lines 1802 with top portions of the insulating layer 802 and insulating layer 1102 using a chemical-mechanical polishing ("CMP") technique known to one of ordinary skill in the art of microelectronic device manufacturing.

In one non-limiting example, the thickness of the conductive lines 1802 is in an approximate range from about 15 nm to about 1000 nm. In one non-limiting example, the thickness of the conductive lines 1802 is from about 20 nm to about 200 nm. In one non-limiting example, the width of the conductive lines 1802 is in an approximate range from about 5 nm to about 500 nm. In one non-limiting example, the spacing (pitch) between the conductive lines 1802 is from about 2 nm to about 500 nm. In more specific non-limiting example, the spacing (pitch) between the conductive lines 1802 is from about 5 nm to about 50 nm.

FIGS. 19 through 23 (including both A and B designations) illustrate another embodiment of the disclosure. FIG. 19A is a view 1900 similar to FIG. 11, after a mask layer 1904 is deposited on a hard mask layer 1902 on the insulating layer 1102 according to one embodiment. FIG. 19B is a top view 1910 of the electronic device structure depicted in FIG. 19A. As shown in FIGS. 19A and 19B, mask layer 1904 has an opening 1906 to expose hard mask layer 1902.

In one embodiment, mask layer 1904 includes a photoresist layer. In one embodiment, mask layer 1904 includes one or more hard mask layers. In one embodiment, mask layer 1904 is a tri-layer mask stack, e.g., a 193 nm immersion (193i) or EUV resist mask on a middle layer (ML) (e.g., a silicon containing organic layer or a metal containing dielectric layer) on a bottom anti-reflective coating (BARC) layer on a silicon oxide hard mask. In one embodiment, the hard mask layer 1902 is a metallization layer hard mask to pattern the conductive lines of the next metallization layer. In one embodiment, hard mask layer 1902 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer or any combination thereof. In one embodiment, hard mask layer 1804 represents one of the hard mask layers described above.

In one embodiment, the mask layer 1904 is deposited using one or more of the mask deposition techniques known to one of ordinary skill in the art of microelectronic device manufacturing. In one embodiment, hard mask layer 1902 is deposited using one or more hard mask layer deposition techniques, such as but not limited to a CVD, PVD, MBE, MOCVD, spin-on, or other hard mask deposition known to one of ordinary skill in the art of microelectronic device manufacturing. In one embodiment, the opening 1906 is formed using one or more of the patterning and etching techniques known to one of ordinary skill in the art of microelectronic device manufacturing.

Figure 19A:
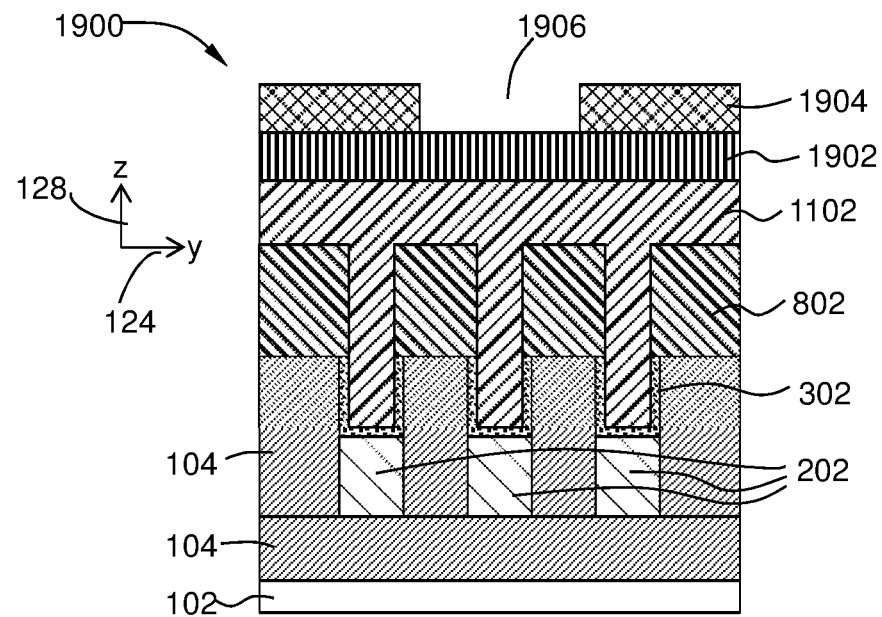
FIG. 19A is a view similar to FIG. 11 after a mask layer is deposited on a hard mask layer according to one embodiment.
Figure 19B:
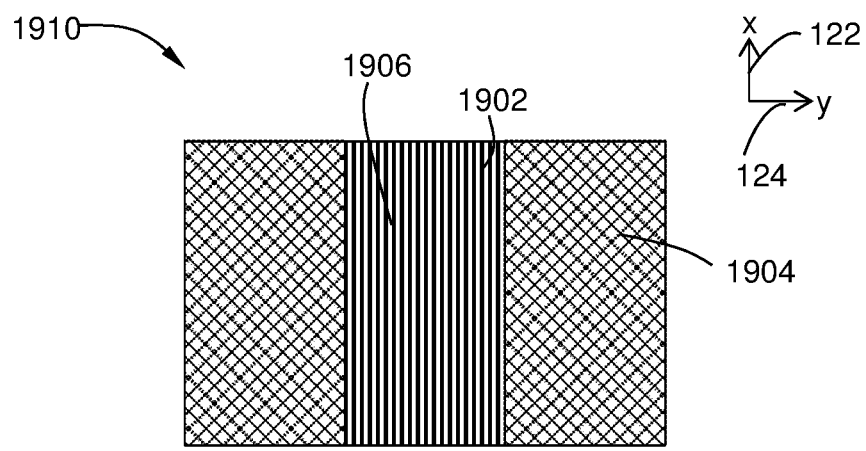
FIG. 19B is a top view of the electronic device structure depicted in FIG. 19A.
Figure 20A:
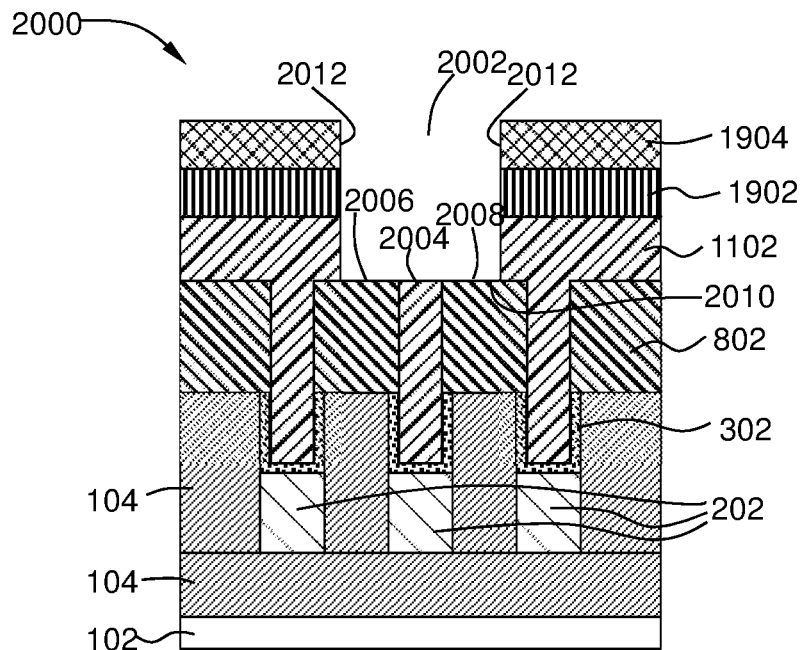
FIG. 20A is a view similar to FIG. 19A after portions of the hard mask layer and the insulating layer are removed according to one embodiment.
Figure 20B:
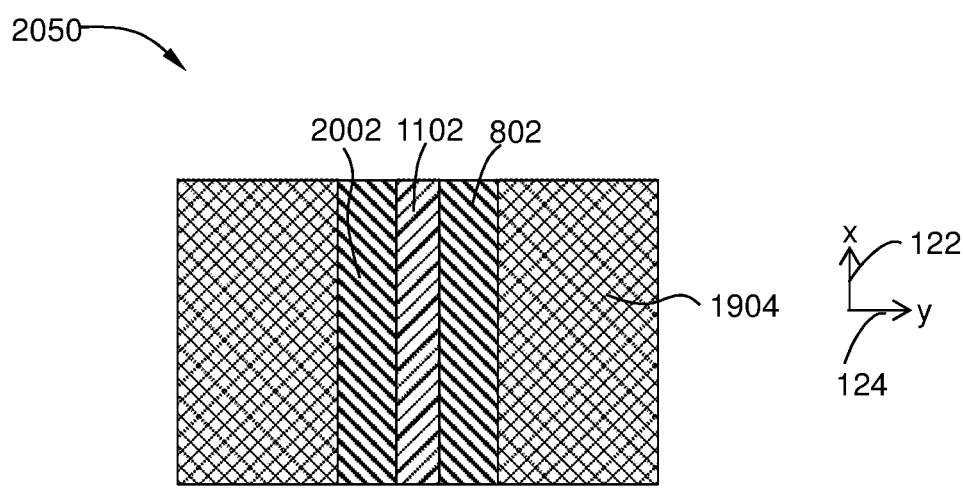
FIG. 20B is a top view of the electronic device structure depicted in FIG. 20A.

FIG. 20A is a view 2000 similar to FIG. 19A, after portions of the hard mask layer 1902 and insulating layer 1102 are removed through opening 1906 to form an opening 2002 in insulating layer 1102 according to one embodiment. FIG. 20B is a top view 2050 of the electronic device structure depicted in FIG. 20A. In one embodiment, opening 2002 is a trench opening for a via. As shown in FIGS. 20A and 20B, opening 2002 includes a bottom 2010 that includes a portion 2004 of the insulating layer 1102 between portions 2006 and 2008 of the insulating layer 802. As shown in FIGS. 20A and 20B, opening 2002 includes opposing sidewalls 2012 that include portions of the insulating layer 1102. In one embodiment, each sidewall 2012 is substantially orthogonal to bottom 2010. In another embodiment, each sidewall 2012 is slanted relative to bottom 2010 at an angle other than 90 degrees, so that an upper portion of the opening 2002 is greater than a lower portion of the opening 2002.

In one embodiment, opening 2002 having slanted sidewalls is formed using an angled non-selective etch. In one embodiment, hard mask layer 1902 is removed using one or more of wet etching, dry etching, or a combination thereof techniques known to one of ordinary skill in the art of microelectronic device manufacturing. In one embodiment, insulating layer 1102 is removed using a non-selective etch in a trench first dual damascene process. In one embodiment, insulating layer 1102 is etched down to the depth that is determined by time. In another embodiment, insulating layer 1102 is etched non-selectively down to an etch stop layer (not shown). In one embodiment, insulating layer 1102 is non-selectively etched using one or more of wet etching, dry etching, or a combination thereof techniques known to one of ordinary skill in the art of electronic device manufacturing.

Figure 21A:
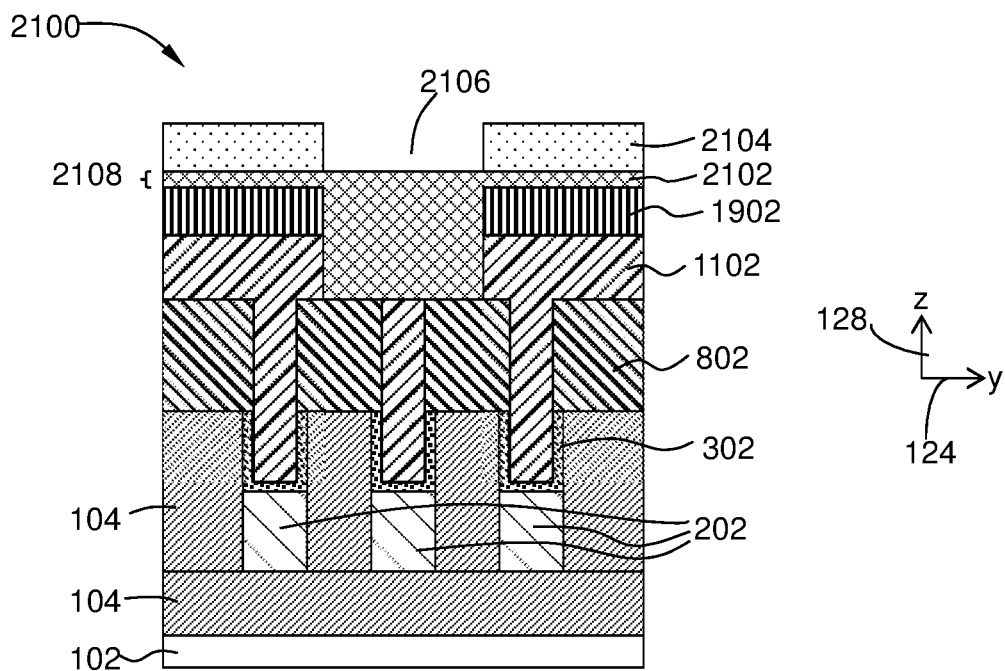
FIG. 21A is a view similar to FIG. 20A after forming a planarization filling layer and mask layer according to one embodiment.
Figure 21B:
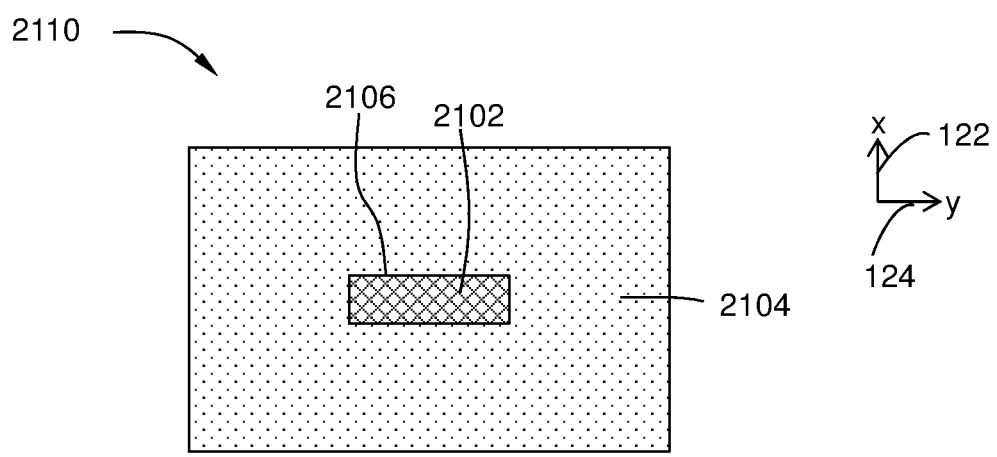
FIG. 21B is a top view of the electronic device structure depicted in FIG. 21A.

FIG. 21A is a view 2100 similar to FIG. 20A, after mask layer 1904 is removed, planarization filling layer 2102 is formed and mask layer 2104 with a fully self-aligned opening 2106 is formed according to one embodiment. FIG. 21B is a top view 2110 of the electronic device structure depicted in FIG. 21A. As shown in FIGS. 21A and 21B, mask layer 1904 is removed. Mask layer 1904 can be removed using one of the mask layer removal techniques known to one of ordinary skill in the art of microelectronic device manufacturing. A planarization filling layer 2102 is formed in opening 2002 onto the tops of exposed insulating layer 802 and insulating layer 1102. The planarization filling layer 2102 illustrated is formed so that an overburden 2108 is formed on hard mask 1902. In some embodiments, the planarization filling layer 2102 is formed to be substantially coplanar with the hard mask 1902. In some embodiments, the planarization filling layer 2102 is planarized, for example, by a CMP process. The planarization filling layer 2102 can be any suitable material including, but not limited to, BARC (Bottom Anti-Reflective Coating) layer (e.g., spin-on polymers containing C and H, or Si), DARC (Dielectric Anti-Reflective Coating) layer or an OPL (Organic Planarization Layer). The planarization filling layer 2102 of some embodiments is deposited by CVD or ALD. In some embodiments, the planarization filling layer 2102 comprises one or more atoms of Si, O, N, C or H.

A patterned mask layer 2104 is formed on hard mask layer 1902. As shown in FIG. 21B, patterned mask layer 2104 is deposited on the planarization filling layer 2102. Patterned mask layer 2104 has an opening 2106. Patterned mask layer 2104 can be formed using one or more of the mask layer depositing, patterning and etching techniques known to one of ordinary skill in the art of microelectronic device manufacturing.

In one embodiment, mask layer 2104 includes a photoresist layer. In one embodiment, mask layer 2104 includes one or more hard mask layers. In one embodiment, mask layer 2104 is tri-layer mask stack, e.g., a 193i or EUV resist mask on a ML (e.g., a silicon containing organic layer or a metal containing dielectric layer) on a BARC layer on a silicon oxide hard mask.

Figure 22A:
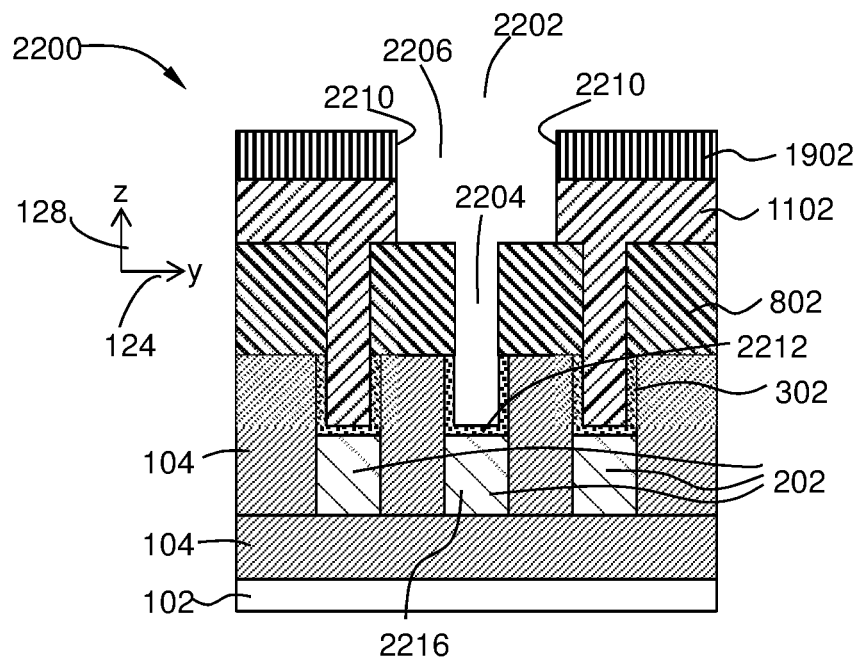
FIG. 22A is a view similar to FIG. 21A after a fully self-aligned opening is formed in insulating layer according to one embodiment.
Figure 22B:
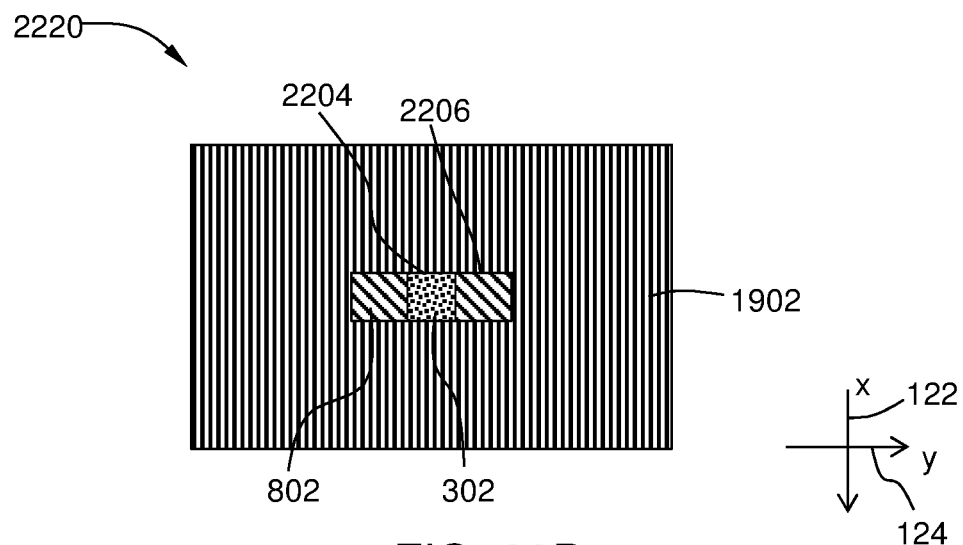
FIG. 22B is a top view of the electronic device structure depicted in FIG. 22A.

FIG. 22A is a view 2200 similar to FIG. 21A, after removing the planarization filling layer 2102 and insulating layer 1102 through opening 2106. The embodiment illustrated has the patterned hard mask layer 2104 and planarization filling layer 2102 removed from hard mask 1902. A fully self-aligned opening 2202 is formed through mask opening 2106. Fully self-aligned opening 2202 includes a trench opening 2206 and a via opening 2204, as shown in FIGS. 22A and 22B. Via opening 2204 is underneath trench opening 2206.

In one or more embodiments, via opening 2204 is formed by selectively etching insulating layer 1102 relative to the insulating layer 802 through mask opening 2106 and trench opening 2206. In one embodiment, trench opening 2206 extends along Y-axis 124. As shown in FIG. 22B, trench opening 2206 is greater along Y-axis 124 than along X-axis 122.

In one embodiment, trench opening 2206 of the opening 2202 is self-aligned along X-axis between the features of the hard mask layer 1902 that are used to pattern the upper metallization layer conductive lines that extend along Y-axis 124 (not shown). The via opening 2204 of the opening 2202 is self-aligned along Y-axis 124 by the insulating layer 802 that is left intact by selectively etching the portion 2004 of the insulating layer 1102 relative to the insulating layer 802. This provides an advantage as the size of the trench opening 2206 does not need to be limited to the size of the cross-section between the conductive line 2216 and one of the conductive lines of the upper metallization layer that provides more flexibility for the lithography equipment. As the portion 2004 is selectively removed relative to the insulating layer 802, the size of the trench opening increases.

As shown in FIGS. 20A and 20B, the portion 2004 is self-aligned with a conductive line 2216 that is one of the lower metallization layer conductive lines 202. That is, the opening 2202 is self-aligned along both X and Y axes.

FIG. 22A illustrates trench opening 2206 having sidewalls 2210 that are substantially orthogonal to the top surface of the substrate 102. In some embodiments, each sidewall 2210 is at an angle other than 90 degrees to the top surface of the substrate 102, so that an upper portion of the trench opening 2206 is greater than a lower portion of the trench opening 2206.

As shown in FIGS. 22A and 22B, via opening 2204 exposes a portion 2212 of the liner 302 on conductive line 2216. In another embodiment, when the liner 302 is removed, the via opening 2204 exposes conductive line 2216.

Figure 23A:
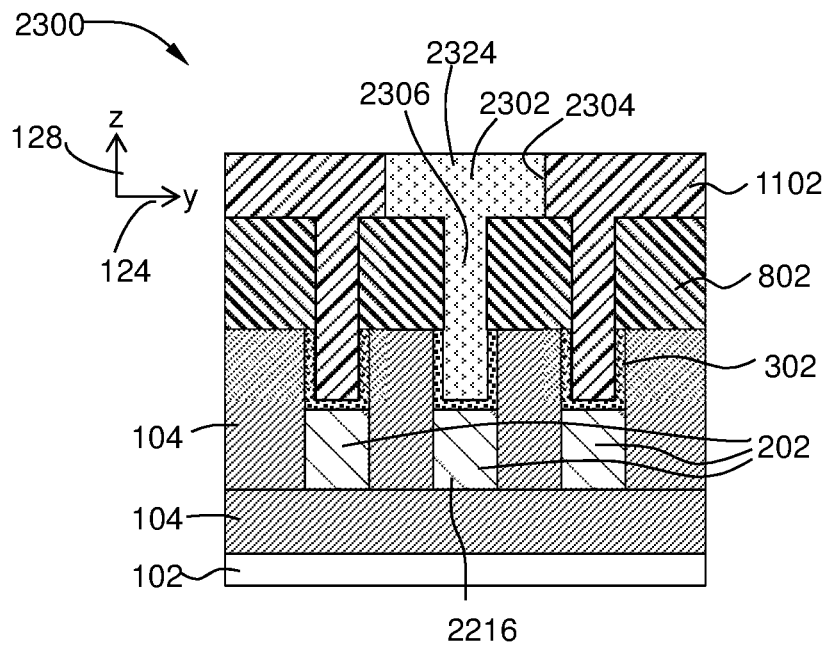
FIG. 23A is a view similar to FIG. 22A after an upper metallization layer comprising conductive lines extending along a Y-axis is formed according to one embodiment.
Figure 23B:
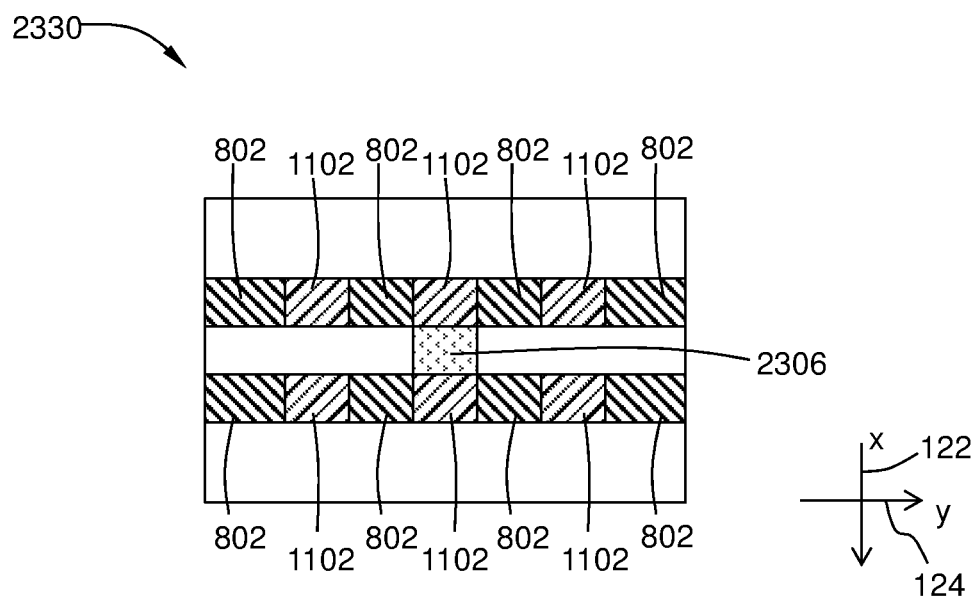
FIG. 23B is a top view of the electronic device structure depicted in FIG. 23A.

FIG. 23A is a view 2300 similar to FIG. 22A, after an upper metallization layer My comprising conductive lines extending along Y-axis 124 is formed according to one embodiment. FIG. 23B is a top view 2330 of the electronic device structure depicted in FIG. 23A. FIG. 23A is a cross-sectional view of FIG. 23B taken along an axis D-D'. As shown in FIG. 23A, hard mask layer 1902 is removed. In one embodiment, hard mask layer 1902 is removed using one or more of the hard mask layer removal techniques know in one of ordinary skill in the art of microelectronic device manufacturing.

An upper metallization layer My includes a set of conductive lines 2302 that extend on portions of insulating layer 802. In the embodiment illustrated in FIG. 23A, the conductive lines 2302 are filled to be co-planar with the top of insulating layer 1102. In some embodiments, the conductive lines 2302 extend above the top surface of insulating layer 1102, similar to that shown in FIG. 18A.

As shown in FIG. 23B, the portions of the insulating layer 1102 are between the portions of the insulating layer 802. Conductive lines 2302 extend along Y-axis 124. A fully self-aligned via 2324 includes a trench portion 2304 and a via portion 2306. Via portion 2306 is underneath trench portion 2304. The fully self-aligned via 2324 is between the lower metallization layer comprising conductive lines 202 that extend along X-axis 122 and the upper metallization layer comprising conductive lines 2302. As shown in FIGS. 23A and 23B, the via portion 2306 is on liner 302 on conductive line 2216. As shown in FIGS. 23A and 23B, the via portion 2306 of the via 2324 is self-aligned along the Y-axis 124 to conductive line 2216 that is one of the conductive lines 202. The trench portion 2306 of the via 2324 is self-aligned along the X-axis 122. In one embodiment, when liner 302 is removed, the via portion 2306 is directly on conductive line 2216.

In one embodiment, forming the conductive lines 2302 and via 2324 involves filling the trenches in the insulating layer and the opening 2202 with a layer of conductive material. In one embodiment, a base layer (not shown) is first deposited on the internal sidewalls and bottom of the trenches and the opening 2202, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g., copper or cobalt).

In one embodiment, to form the base layer, the conductive barrier layer is deposited onto the sidewalls and bottom of the trenches, and then the seed layer is deposited on the conductive barrier layer. In another embodiment, the conductive base layer includes the seed layer that is directly deposited onto the sidewalls and bottom of the trenches. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper, is deposited onto the seed layer of base later of copper, by an electroplating process. In one embodiment, the conductive layer is deposited into the trenches using a damascene process known to one of ordinary skill in the art of microelectronic device manufacturing. In one embodiment, the conductive layer is deposited onto the seed layer in the trenches and in the opening 2202 using a selective deposition technique, such as but not limited to electroplating, electrolysis, a CVD, PVD, MBE, MOCVD, ALD, spin-on, or other deposition techniques known to one of ordinary skill in the art of microelectronic device manufacturing.

In one embodiment, the choice of a material for conductive layer for the conductive lines 2302 and via 2324 determines the choice of a material for the seed layer. For example, if the material for the conductive lines 2302 and via 2324 includes copper, the material for the seed layer also includes copper. In one embodiment, the conductive lines 2302 and via 2324 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 2302 and via 2324 are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, portions of the conductive layer and the base layer are removed to even out top portions of the conductive lines 2302 with top portions of the insulating layer 1102 using a chemical-mechanical polishing ("CMP") technique known to one of ordinary skill in the art of microelectronic device manufacturing.

In one non-limiting example, the thickness of the conductive lines 2302 is in an approximate range from about 15 nm to about 1000 nm. In one non-limiting example, the thickness of the conductive lines 2302 is from about 20 nm to about 200 nm. In one non-limiting example, the width of the conductive lines 2302 is in an approximate range from about 5 nm to about 500 nm. In one non-limiting example, the spacing (pitch) between the conductive lines 2302 is from about 2 nm to about 500 nm. In more specific non-limiting example, the spacing (pitch) between the conductive lines 2302 is from about 5 nm to about 50 nm.

In an embodiment, the upper metallization layer My is configured to connect to other metallization layers (not shown). In an embodiment, the metallization layer My is configures to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one or ordinary skill in the art of electronic device manufacturing.

Figure 24:
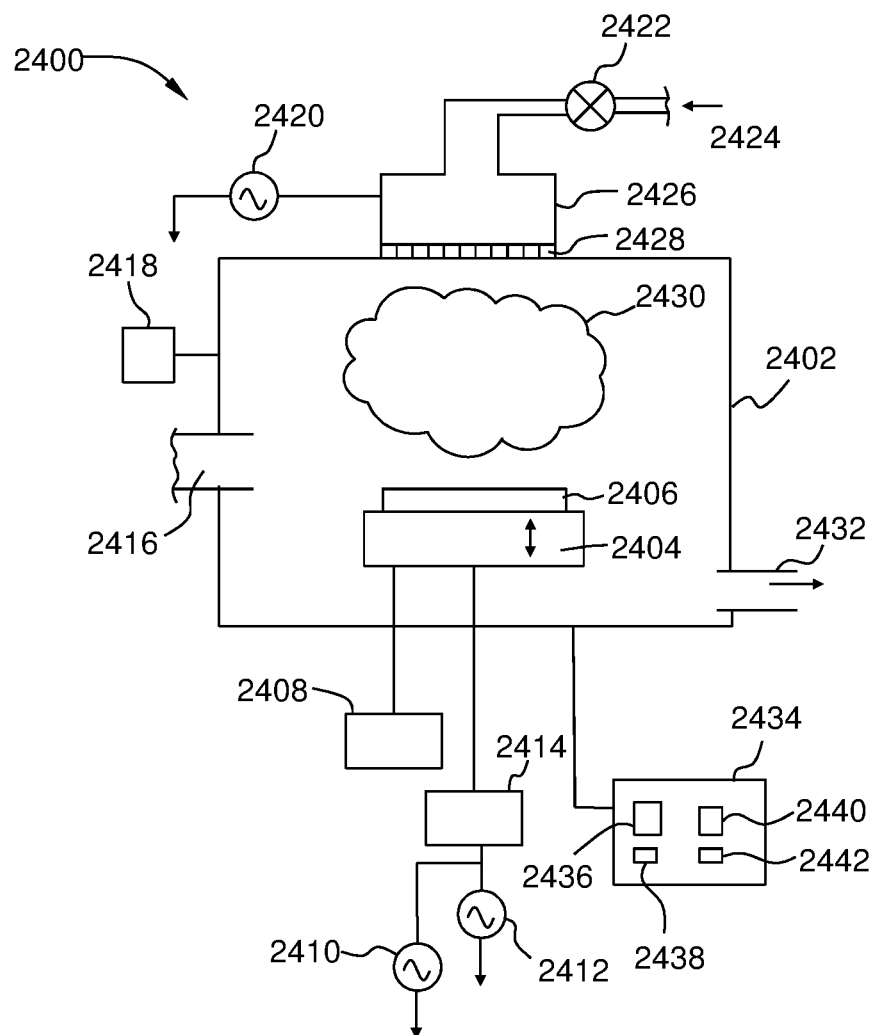
FIG. 24 shows a block diagram of a plasma system to provide a fully self-aligned via according to one embodiment.

FIG. 24 shows a block diagram of a plasma system to perform at least some of the operations to provide a fully self-aligned via according to one embodiment. As shown in FIG. 24, system 2400 has a processing chamber 2402. A movable pedestal 2404 to hold an electronic device structure 2406 is placed in processing chamber 2402. Pedestal 2404 comprises an electrostatic chuck ("ESC"), a DC electrode embedded into the ESC, and a cooling/heating base. In an embodiment, pedestal 2404 acts as moving cathode. In an embodiment, the ESC comprises an $Al_2O_3$ material, $Y_2O_3$ or other ceramic materials known to one of ordinary skill of electronic device manufacturing. A DC power supply 2408 is connected to the DC electrode of the pedestal 2404.

As shown in FIG. 24, an electronic device structure 2406 is loaded through an opening 2416 and placed on the pedestal 2404. The electronic device structure 2406 represents one of the electronic device structures described above.

System 2400 comprises an inlet to input one or more process gases 2424 through a mass flow controller 2422 to a plasma source 2426. A plasma source 2426 comprising a showerhead 2428 is coupled to the processing chamber 2402 to receive one or more gases 2424 to generate plasma. Plasma source 2416 is coupled to a RF source power 2420. Plasma source 2426 through showerhead 2428 generates a plasma 2430 in processing chamber 2402 from one or more process gases 2424 using a high frequency electric field. Plasma 2430 comprises plasma particles, such as ions, electrons, radicals, or any combination thereof. In an embodiment, power source 2410 supplies power from about 50 W to about 3000 W at a frequency from about 400 kHz to about 162 MHz to generate plasma 2430.

A plasma bias power 2410 is coupled to the pedestal 2404 (e.g., cathode) via a RF match 2414 to energize the plasma. In an embodiment, the plasma bias power 2410 provides a bias power that is not greater than 1000 W at a frequency between about 2 MHz to 60 MHz, and in a particular embodiment at about 13 MHz. A plasma bias power 2412 may also be provided, for example, to provide another bias power that is not greater than 1000 W at a frequency from about 400 kHz to about 60 MHz, and in a particular embodiment, at about 60 MHz. Plasma bias power 2412 and bias power 2410 are connected to RF match 2414 to provide a dual frequency bias power. In an embodiment, a total bias power applied to the pedestal 2404 is from about 10 W to about 3000 W.

As shown in FIG. 24, a pressure control system 2418 provides a pressure to processing chamber 2402. As shown in FIG. 24, chamber 2402 has one or more exhaust outlets 2432 to evacuate volatile products produced during processing in the chamber. In an embodiment, the plasma system 2400 is an inductively coupled plasma (ICP) system. In an embodiment, the plasma system 2400 is a capacitively coupled plasma (CCP) system.

A control system 2434 is coupled to the chamber 2402. The control system 2434 comprises a processor 2436, a temperature controller 2438 coupled to the processor 2436, a memory 2440 coupled to the processor 2436, and input/output devices 2442 coupled to the processor 2436 to form fully self-aligned via as described herein.

In one embodiment, the processor 2436 has a configuration to control recessing first conductive lines on a first insulating layer on a substrate, the first conductive lines extending along a first direction on the first insulating layer. The processor 2436 has a configuration to control depositing a liner on the recessed first conductive lines. The processor has a configuration to control selectively growing a seed layer on the recessed first conductive lines. The processor 2436 has a configuration to control forming pillars using the selectively grown seed layer. The processor 2436 has a configuration to control depositing a second insulating layer between the pillars. The processor 2436 has a configuration to control removing the pillars to form trenches in the second insulating layer. The processor 2436 has a configuration to control depositing a third insulating layer into the trenches in the second insulating layer. The processor 2436 has a configuration to control selectively etching the third insulating layer relative to the second insulating layer to form a fully self-aligned via opening down to one of the first conductive lines. The processor 2436 has a configuration to control depositing a conductive layer into the self-aligned via opening, as described above.

The control system 2434 is configured to perform at least some of the methods as described herein and may be either software or hardware or a combination of both. The plasma system 2400 may be any type of high performance processing plasma systems known in the art, such as but not limited to, an etcher, a cleaner, a furnace, or any other plasma system to manufacture electronic devices.

Figure 25A:
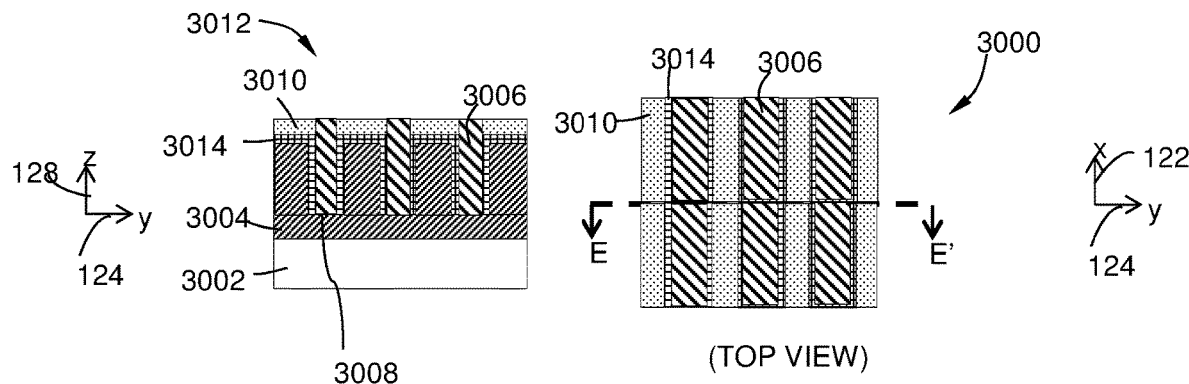
FIG. 25A illustrates a top view and a cross-sectional view of an electronic device structure to provide a fully self-aligned via according to an alternate embodiment.
Figure 25B:
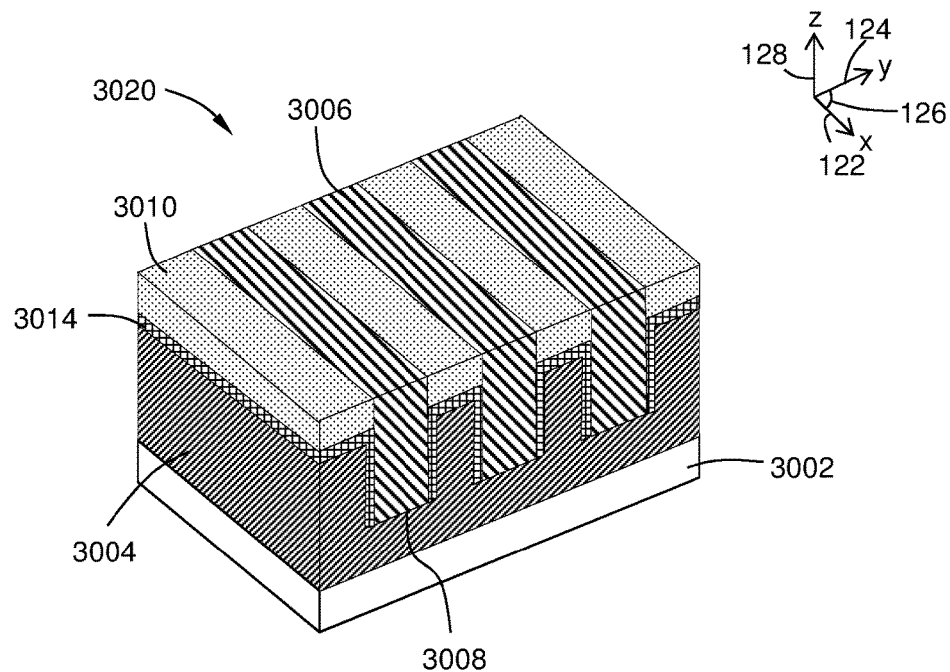
FIG. 25B is a perspective view of the electronic device structure depicted in FIG. 25A.

FIG. 25A illustrates a top view 3000 and a cross-sectional view 3012 of an electronic device structure to provide a fully self-aligned via according to another embodiment. FIG. 25A is similar to FIG. 1A, after an etch stop layer 3014 is formed on the insulating layer 3004 prior to the formation of the cap layer 3010. The cross-sectional view 3012 is along an axis E-E', as depicted in FIG. 25A. FIG. 25B is a perspective view 3020 of the electronic device structure depicted in FIG. 25A. A lower metallization layer (Mx) comprises a set of conductive lines 3006 that extend along an X-axis (direction) 122 on an insulating layer 3004 on a substrate 3002, as shown in FIGS. 25A and 25B. As shown in FIG. 25B, X-axis (direction) 122 crosses Y-axis (direction) 124 at an angle 126. In one embodiment, angle 126 is about 90 degrees. In another embodiment, angle 126 is an angle that is other than the 90 degrees angle. The insulating layer 3004 comprises trenches 3008. The recessed conductive lines 3006 are deposited in trenches 3008. A cap layer 3010 is formed on the insulating layer 3004.

In one embodiment, the etch stop layer 3014 is aluminum oxide ($Al_2O_3$). In one or more embodiment, the etch stop layer 3014 is selected from aluminum oxide ($Al_2O_3$), hafnium dioxide ($HfO_2$), and combinations thereof.

In an embodiment, the substrate 3002 comprises a semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In an embodiment, substrate 3002 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 3002 can be, e.g., an organic, a ceramic, a glass, or a semiconductor substrate 3002. Although a few examples of materials from which the substrate 3002 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one embodiment, substrate 3002 includes one or more metallization interconnect layers for integrated circuits. In at least some embodiments, the substrate 3002 includes interconnects, for example, vias, configured to connect the metallization layers. In at least some embodiments, the substrate 3002 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate includes one or more buffer layers to accommodate for a lattice mismatch between the substrate 3002 and one or more layers above substrate 3002 and to confine lattice dislocations and defects.

Insulating layer 3004 can be any material suitable to insulate adjacent devices and prevent leakage. In one embodiment, electrically insulating layer 3004 is an oxide layer, e.g., silicon dioxide, or any other electrically insulating layer determined by an electronic device design. In one embodiment, insulating layer 3004 comprises an interlayer dielectric (ILD). In one embodiment, insulating layer 3004 is a low-k dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof.

In one embodiment, insulating layer 3004 includes a dielectric material having a k-value less than 5. In one embodiment, insulating layer 3004 includes a dielectric material having a k-value less than 2. In at least some embodiments, insulating layer 3004 includes a nitride, oxide, a polymer, phosphosilicate glass, fluorosilicate (SiOF) glass, organosilicate glass (SiOCH), other electrically insulating layer determined by an electronic device design, or any combination thereof. In at least some embodiments, insulating layer 3004 may include polyimide, epoxy, photodefinable materials, such as benzocyclobutene (BCB), and WPR-series materials, or spin-on-glass.

In one embodiment, insulating layer 3004 is a low-k interlayer dielectric to isolate one metal line from other metal lines on substrate 3002. In one embodiment, the thickness of the layer 3004 is in an approximate range from about 10 nanometers (nm) to about 2 microns (μm).

In an embodiment, insulating layer 3004 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one embodiment, the lower metallization layer Mx comprising conductive lines 3006 (i.e., metal lines) is a part of a back end metallization of the electronic device. In one embodiment, the insulating layer 3004 is patterned and etched using a hard mask to form trenches 3008 using one or more patterning and etching techniques known to one of ordinary skill in the art of microelectronic device manufacturing. In one embodiment, the size of trenches 3008 in the insulating layer 3004 is determined by the size of conductive lines formed later on in a process.

In one embodiment, forming the conductive lines 3006 involves filling the trenches 3008 with a layer of conductive material. In one embodiment, a base layer (not shown) is first deposited on the internal sidewalls and bottom of the trenches 3008, and then the conductive layer is deposited on the base layer. In one embodiment, the base layer includes a conductive seed layer (not shown) deposited on a conductive barrier layer (not shown). The seed layer can include copper (Cu), and the conductive barrier layer can include aluminum (Al), titanium (Ti), tantalum (Ta), tantalum nitride (TaN), and the like metals. The conductive barrier layer can be used to prevent diffusion of the conductive material from the seed layer, e.g., copper or cobalt, into the insulating layer 3004. Additionally, the conductive barrier layer can be used to provide adhesion for the seed layer (e.g., copper).

In one embodiment, to form the base layer, the conductive barrier layer is deposited onto the sidewalls and bottom of the trenches 3008, and then the seed layer is deposited on the conductive barrier layer. In another embodiment, the conductive base layer includes the seed layer that is directly deposited onto the sidewalls and bottom of the trenches 3008. Each of the conductive barrier layer and seed layer may be deposited using any think film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper or cobalt, is deposited onto the seed layer of base layer of copper, by an electroplating process. In one embodiment, the conductive layer is deposited into the trenches 3008 using a damascene process known to one of ordinary skill in the art of microelectronic device manufacturing. In one embodiment, the conductive layer is deposited onto the seed layer in the trenches 3008 using a selective deposition technique, such as but not limited to electroplating, electrolysis, CVD, PVD, MBE, MOCVD, ALD, spin-on, or other deposition techniques know to one of ordinary skill in the art of microelectronic device manufacturing.

In one embodiment, the choice of a material for conductive layer for the conductive lines 3006 determines the choice of a material for the seed layer. For example, if the material for the conductive lines 3006 includes copper, the material for the seed layer also includes copper. In one embodiment, the conductive lines 3006 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pd), antimony (Sb), bismuth (Bi), zinc (Zn), cadmium (Cd), or any combination thereof.

In alternative embodiments, examples of the conductive materials that may be used for the conductive lines 3006 of the metallization layer Mx are, but not limited to, metals, e.g., copper (Cu), tantalum (Ta), tungsten (W), ruthenium (Ru), titanium (Ti), hafnium (Hf), zirconium (Zr), aluminum (Al), silver (Ag), tin (Sn), lead Pb), metal alloys, metal carbides, e.g., hafnium carbide (HfC), zirconium carbide (ZrC), titanium carbide (TiC), tantalum carbide (TaC), aluminum carbide (AlC), other conductive materials, or any combination thereof.

In one embodiment, portions of the conductive layer and the base layer are removed to even out top portions of the conductive lines 3006 with top portions of the insulating layer 3004 using a chemical-mechanical polishing ("CMP") technique known to one of ordinary skill in the art of microelectronic device manufacturing.

In one non-limiting example, the thickness of the conductive lines 3006 is in an approximate range from about 15 nm to about 1000 nm. In one non-limiting example, the thickness of the conductive lines 106 is from about 20 nm to about 200 nm. In one non-limiting example, the width of the conductive lines 3006 is in an approximate range from about 5 nm to about 500 nm. In one non-limiting example, the spacing (pitch) between the conductive lines 3006 is from about 2 nm to about 500 nm. In more specific non-limiting example, the spacing (pitch) between the conductive lines 3006 is from about 5 nm to about 50 nm.

In an embodiment, the lower metallization layer Mx is configured to connect to other metallization layers (not shown). In an embodiment, the metallization layer Mx is configured to provide electrical contact to electronic devices, e.g., transistor, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

In one or more embodiments, the cap layer 3010 comprises silicon nitride (SiN). The cap layer 3010 protects the insulating layer 3004. In one or more embodiments, the cap layer 3010 minimizes bowing of the side walls of the trenches 3008

Figure 26:
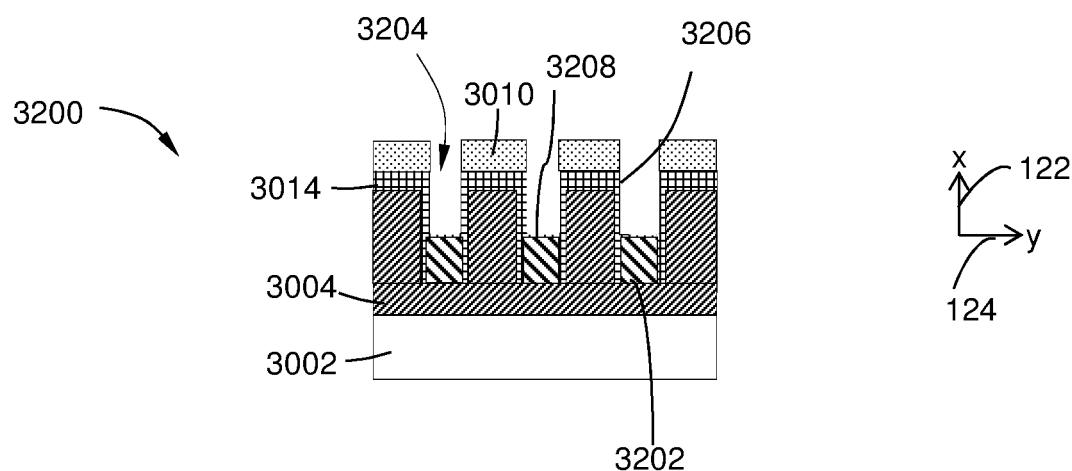
FIG. 26 is a view similar to FIG. 25A, after the conductive lines are recessed according to one embodiment.

FIG. 26 is a view 3200 similar to cross-sectional view 3012 of FIG. 25A, after the conductive lines 3006 are recessed according to one embodiment. The conductive lines 3006 are recessed to a predetermined depth to form recessed conductive lines 3202. As shown in FIG. 26, trenches 3204 are formed in the insulating layer 3004 and the etch stop layer 3014. Each trench 3204 has sidewalls 3206 that are portions of insulating layer 3004 and a bottom that is a top surface 3208 of the recessed conductive line 3202.

In one embodiment, the depth of the trenches 3204 is from about 10 nm to about 500 nm. In one embodiment, the depth of the trenches 3204 is from about 10% to about 100% of the thickness of the conductive lines. In one embodiment, the conductive lines 3006 are recessed using one or more of wet etching, dry etching, or a combination thereof techniques known to one of ordinary skill in the art of electronic device manufacturing.

Figure 27:
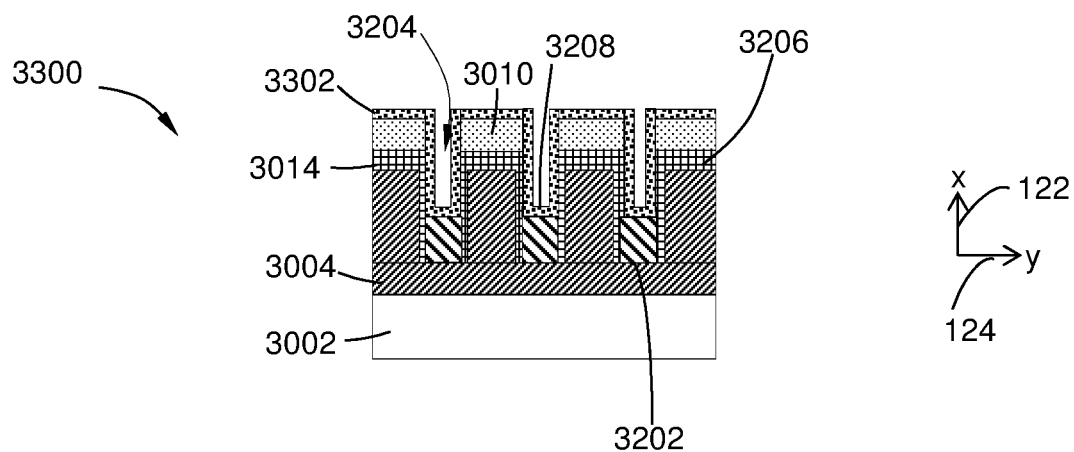
FIG. 27 is a view similar to FIG. 26, after a liner is deposited on the recessed conductive lines according to one embodiment.

FIG. 27 is a view 3300 similar to FIG. 6, after a liner 3302 is deposited on the recessed conductive lines 3202 according to one embodiment. Liner 3302 is deposited on the bottom and sidewalls of the trenches 3204, as shown in FIG. 27. In one or more embodiments, liner 3302 is deposited on top of cap layer 3010 and into trenches 3204 around etch stop layer 3014.

In one embodiment, liner 3302 is deposited to protect the conductive lines 3202 from changing the properties later on in a process (e.g., during tungsten deposition, or other processes). In one embodiment, liner 3302 is a conductive liner. In another embodiment, liner 3302 is a non-conductive liner. In one embodiment, when liner 3302 is a non-conductive liner, the liner 3302 is removed later on in a process, as described in further detail below. In one embodiment, liner 3302 includes titanium nitride (TiN), titanium (Ti), tantalum (Ta), tantalum nitride (TaN), or any combination thereof. In another embodiment, liner 3302 is an oxide, e.g., aluminum oxide ($Al_2O_3$), titanium oxide ($TiO_2$). In yet another embodiment, liner 3302 is a nitride, e.g., silicon nitride (SiN). In an embodiment, the liner 3302 is deposited to the thickness from about 0.5 nm to about 10 nm.

In an embodiment, the liner 3302 is deposited using an atomic layer deposition (ALD) technique. In one embodiment, the liner 3302 is deposited using one of deposition techniques, such as but not limited to a CVD, PVD, MBE, MOCVD, spin-on, or other liner deposition techniques know to one of ordinary skill in the art of microelectronic device manufacturing.

Figure 28:
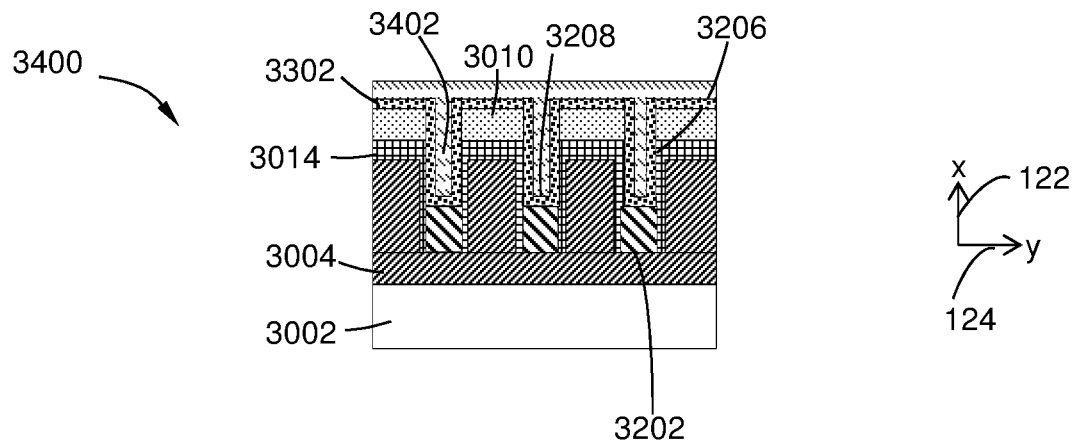
FIG. 28 is a view similar to FIG. 27, after a seed gapfill layer is deposited on the liner according to one embodiment.

FIG. 28 is a view 3400 similar to FIG. 27, after a seed gapfill layer 3402 is deposited on the liner 3302 according to one embodiment. In one embodiment, seed gapfill layer 3402 is a self-aligned selective growth seed film. As shown in FIG. 28, seed gapfill layer 3402 is deposited on liner 3302 on the top surface 3208 of the recessed conductive lines 3202, the sidewalls 3206 of the trenches 3204 and top portions of the insulating layer 3004. In one embodiment, seed gapfill layer 3402 is a tungsten (W) layer, or other seed gapfill layer to provide selective growth pillars. In some embodiments, seed gapfill layer 3402 is a metal film or a metal containing film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, seed gapfill layer 3402 comprises is a tungsten (W) seed gapfill layer.

In one embodiment, the seed gapfill layer 3402 is deposited using one of deposition techniques, such as but not limited to an ALD, a CVD, PVD, MBE, MOCVD, spin-on or other liner deposition techniques known to one of ordinary skill in the art of microelectronic device manufacturing.

Figure 29:
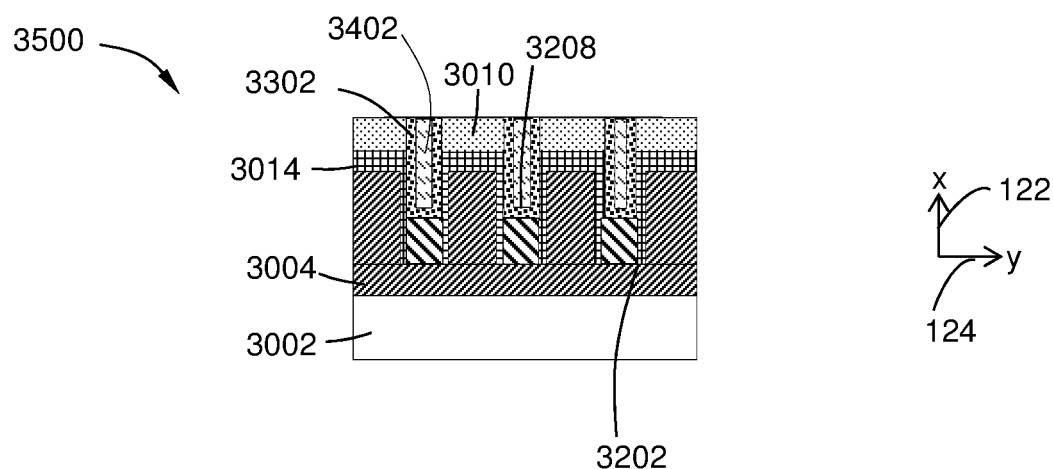
FIG. 29 is a view similar to FIG. 28, after portions of the seed gapfill layer are removed to expose top portions of the insulating layer according to one embodiment.

FIG. 29 is a view 3500 similar to FIG. 28, after portions of the seed gapfill layer 3402 and the liner 3302 are removed to expose top portions of the cap layer 3010 according to one embodiment. In one embodiment, the portions of the seed gapfill layer 3402 are removed using one of the chemical-mechanical polishing (CMP) techniques known to one of ordinary skill in the art of microelectronic device manufacturing.

Figure 30:
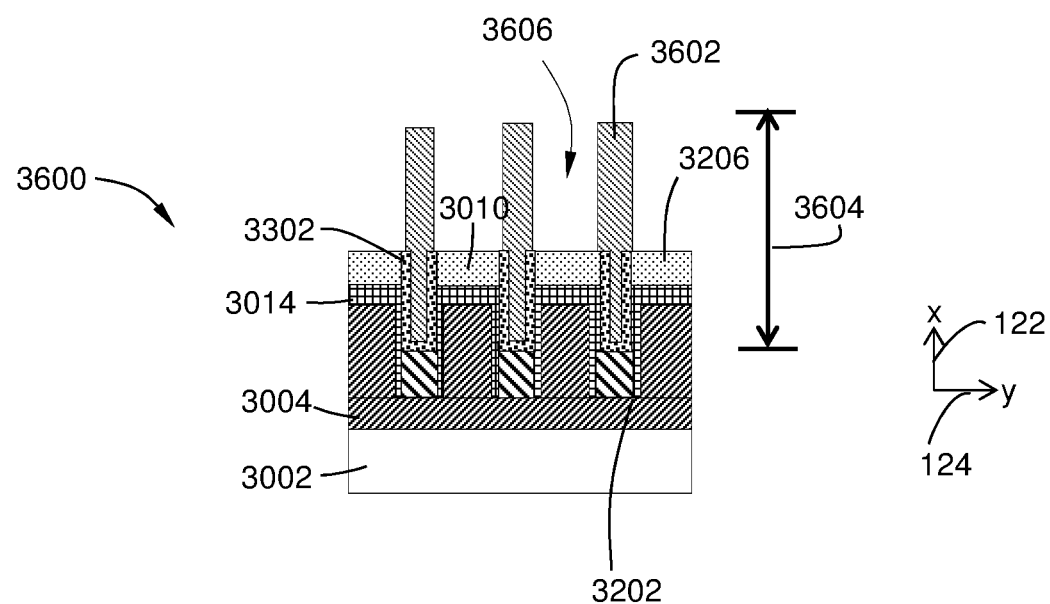
FIG. 30 is a view similar to FIG. 29, after self-aligned selective growth pillars are formed according to one embodiment.

FIG. 30 is a view 3600 similar to FIG. 29, after self-aligned selective growth pillars 3602 are formed using the seed gapfill layer 3402 on the liner 3302 on the recessed conductive lines 3202 according to one embodiment. As shown in FIG. 30, an array of the self-aligned selective growth pillars 3602 has the same pattern as the set of the conductive lines 3202. As shown in FIG. 30, the pillars 3602 extend substantially orthogonally from the top surfaces of the conductive lines 3202. As shown in FIG. 30, the pillars 3602 extend along the same direction as the conductive lines 3202. As shown in FIG. 30, the pillars are separated by gaps 3606.

In one embodiment, the pillars 3602 are selectively grown from the seed gapfill layer 3402 on portions of the liner 3302 on the conductive lines 3202. The pillars 3602 are not grown on portions of the liner 3302 on the insulating layer 3004, as shown in FIG. 30. In one embodiment, portions of the seed gapfill layer 3402 above the conductive lines 3202 are expanded for example, by oxidation, nitridation, or other process to grow pillars 3602. In one embodiment, the seed gapfill layer 3402 is oxidized by exposure to an oxidizing agent or oxidizing conditions to transform the metal or metal containing seed gapfill layer 3402 to metal oxide pillars 3602. In one embodiment, pillars 3602 include an oxide of one or more metals listed above. In more specific embodiments, pillars 3602 include tungsten oxide (e.g., WO, $WO_3$ and other tungsten oxide).

The oxidizing agent can be any suitable oxidizing agent including, but not limited to, $O_2$, $O_3$, $N_2O$, $H_2O$, $H_2O_2$, CO, $CO_2$, $NH_3$, $N_2$/Ar, $N_2$/He, $N_2$/Ar/He, or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In one embodiment, the pillars 3602 are formed by oxidation of the seed gapfill layer at any suitable temperature depending on, for example, the composition of the seed gapfill layer and the oxidizing agent. In some embodiments, the oxidation occurs at a temperature in an approximate range of about 25° C. to about 800° C. In some embodiments, the oxidation occurs at a temperature greater than or equal to about 150° C.

In one embodiment, the height 3604 of the pillars 3602 is in an approximate range from about 5 angstroms (Å) to about 10 microns (μm).

Figure 31:
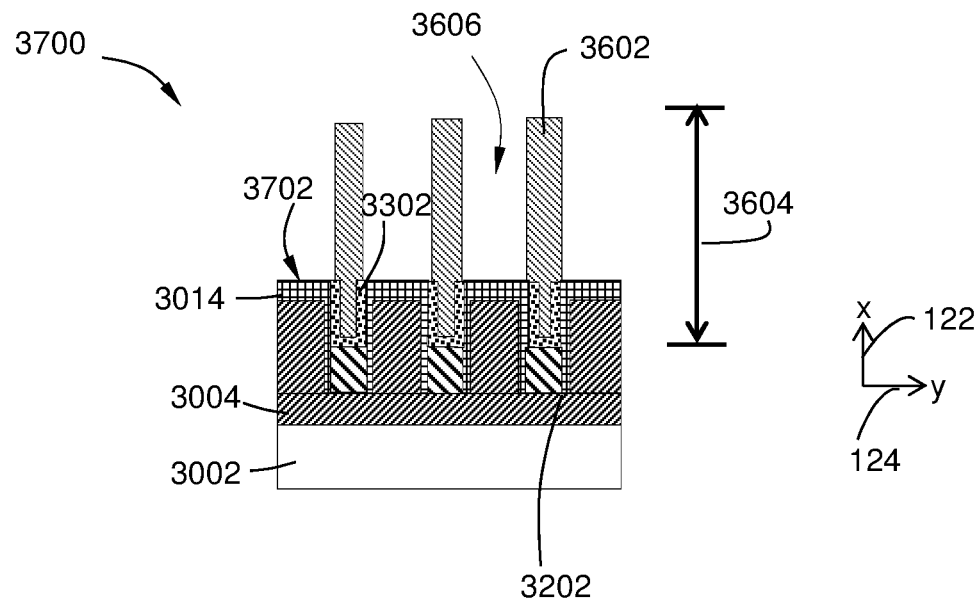
FIG. 31 is a view similar to FIG. 30 after a cap layer is removed according to one embodiment.

FIG. 31 is a view 3700 similar to FIG. 30, after at least a portion of the cap layer 3010 is selectively removed to expose the top surface 3702 of the etch stop layer 3014. The cap layer 3010 can be removed by exposing the substrate 3002 to a solution of hot phosphoric acid (i.e. "hot phos"). In one or more embodiments, the entire cap layer 3010 is removed by exposing the substrate 3002 to a solution of hot phosphoric acid (hot phos). Without intending to be bound by theory, it is thought that the cap layer 3010 serves as a sacrificial layer, introduced at the beginning of the process flow and removed midway to make the pillars appear taller.

In one or more embodiments, the solution of hot phosphoric acid (hot phos) has a concentration in the range of 1 wt. % to 99 wt. % in water. In some embodiments, the concentration of phosphoric acid is in a range of about 1 wt. % to about 99 wt. %. The substrate 3002 can be treated with the solution of hot phosphoric acid (hot phos) for a period in the range of 0.1 minutes to 60 min. In some embodiments, the substrate 3002 is treated with the solution of hot phosphoric acid (hot phos) for a period in the range of about 2 seconds to about 2 hours, or about 2 seconds to about 1 hour. In one or more embodiments, the temperature of the hot phosphoric acid solution (hot phos) is in the range of 15° C. to 400° C. In some embodiments, the temperature of the hot phosphoric acid solution (hot phos) is in the range of 25° C. to about 500° C. In some embodiments, the temperature of the hot phosphoric acid solution (hot phos) is greater than 500° C.

In one or more embodiments, the removal of the cap layer 3010 increases the aspect ratio. In one or more embodiments, the aspect ratio is in a range of 1:1 to 10:1.

It was unexpectedly and advantageously found by transmission electron microscopy (TEM) and electron energy loss spectroscopy (EELS) that the hot phos removal process is selective to the cap layer 3010 and does not affect the tungsten oxide pillars 3602 or the etch stop layer 3014.

Figure 32:
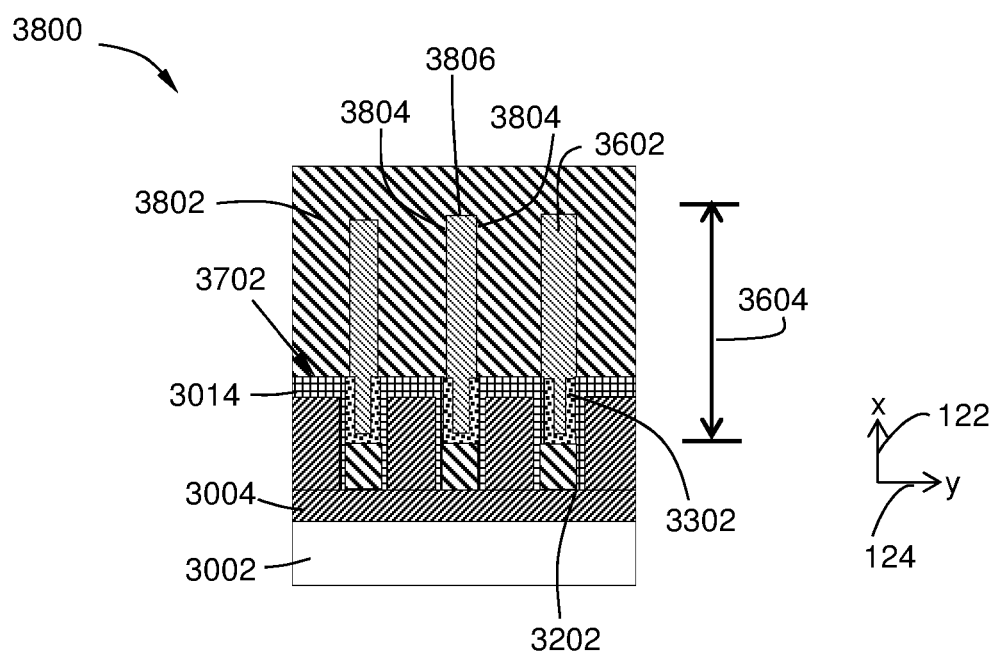
FIG. 32 is a view similar to FIG. 31 after an insulating layer is deposited to overfill the gaps between the pillars according to one embodiment.

FIG. 32 is a view 3800 similar to FIG. 31, and, after an insulating layer 3802 is deposited to overfill the gaps 3606 between the pillars 3602 according to one embodiment. As shown in FIG. 32, insulating layer 3802 is deposited on the opposing sidewalls 3804 and top portions 3806 of the pillars 3602 and through the gaps 3606 on the portions of the insulating layer 3004 and liner 3302 between the pillars 3602.

In one embodiment, insulating layer 3802 is a low-k gapfill layer. In one embodiment, insulating layer 3802 is a flowable silicon oxide (FSiOx) layer. In at least some embodiments, insulating layer 3802 is an oxide layer, e.g., silicon dioxide ($SiO_2$), or any other electrically insulating layer determined by an electronic device design. In one embodiment, insulating layer 3802 is an interlayer dielectric (ILD). In one embodiment, insulating layer 3802 is a low-k dielectric that includes, but is not limited to, materials such as, e.g., silicon dioxide, silicon oxide, a carbon based material, e.g., a porous carbon film, carbon doped oxide ("CDO"), e.g., carbon doped silicon dioxide, porous silicon dioxide, porous silicon oxide carbide hydride (SiOCH), silicon nitride, or any combination thereof. In one embodiment, insulating layer 3802 is a dielectric material having k-value less than 3. In more specific embodiment, insulating layer 3802 is a dielectric material having k-value in an approximate range from about 2.2 to about 2.7. In one embodiment, insulating layer 3802 includes a dielectric material having k-value less than 2. In one embodiment, insulating layer 3802 represents one of the insulating layers described above with respect to insulating layer 3004.

In one embodiment, insulating layer 3802 is a low-k interlayer dielectric to isolate one metal line from other metal lines. In one embodiment, insulating layer 3802 is deposited using one of deposition techniques, such as but not limited to a CVD, spin-on, an ALD, PVD. MBE, MOCVD, or other low-k insulating layer deposition techniques known to one of ordinary skill in the art of microelectronic device manufacturing.

Figure 33A:
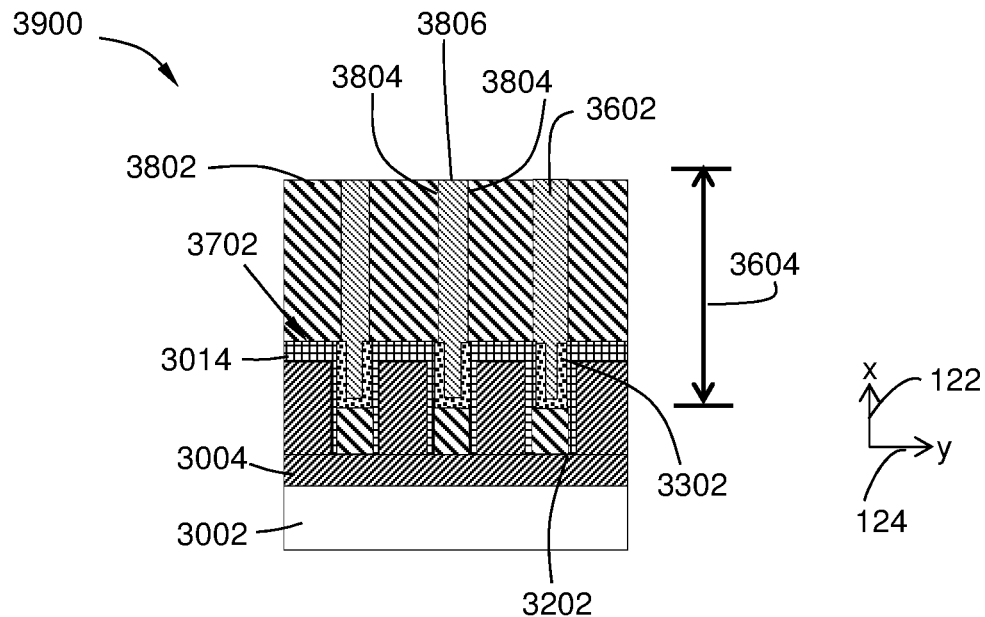
FIG. 33A is a view similar to FIG. 32, after a portion of the insulating layer is removed to expose the top portions of the pillars according to one embodiment.

FIG. 33A is a view 3900 similar to FIG. 32, after a portion of the insulating layer 3802 is removed to expose the top portions 3806 of the pillars 3602 according to one embodiment. In one embodiment, the portion of the insulating layer 3802 is removed using a CMP technique known to one of ordinary skill in the art of microelectronic device manufacturing. In one embodiment, the portion of the insulating layer 3802 is etched back to expose the top portions 3806 of the pillars 3602 using one or more of the dry and wet etching techniques known to one of ordinary skill in the art of microelectronic device manufacturing.

Figure 33B:
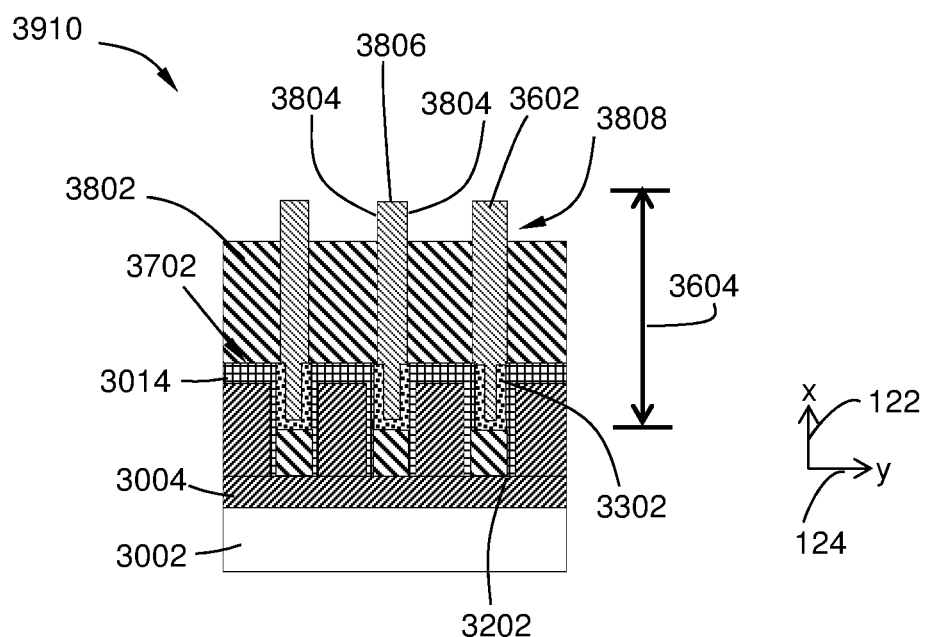
FIG. 33B is a view similar to FIG. 32, after an insulating layer is deposited to underfill the gaps between the pillars according to another embodiment.

FIG. 33B is a view 3910 similar to FIG. 30, after an insulating layer 3802 is deposited to underfill (partially fill) the gaps 3606 between the pillars 3602 according to another embodiment. As shown in FIG. 33B, insulating layer 3802 is deposited through gaps 3606 on lower portions of opposing sidewalls 3804 of the pillars 3602 and the portions of the insulating layer 3004 and liner 3302 between pillars 3602. In one embodiment, insulating layer 3802 is deposited to a predetermined thickness to expose the top portions 3806 and upper portions of the opposing sidewalls 3804 of the pillars 3602.

In one embodiment, insulating layer 3802 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing. In another embodiment, insulating layer 3802 is deposited to overfill the gaps 3606 between the pillars 3602, as described with respect to FIG. 32, and then a portion of the insulating layer 3802 is etched back to expose upper portions 3808 of the sidewalls 3804 and top portions 3806 of the pillars 3602 using one or more of the dry and wet etching techniques known to one of ordinary skill in the art of microelectronic device manufacturing.

Figure 34:
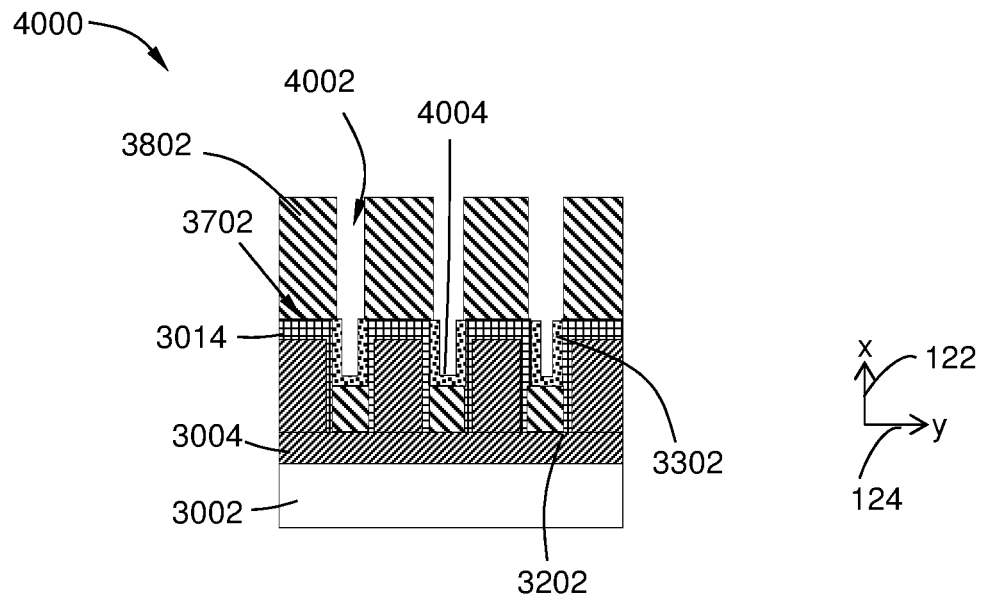
FIG. 34 is a view similar to FIG. 33A after the self-aligned selectively grown pillars are selectively removed to form trenches according to one embodiment.

FIG. 34 is a view 4000 similar to FIG. 32 after the self-aligned selectively grown pillars 3602 are selectively removed to form trenches 4002 according to one embodiment. As shown in FIG. 34, the pillars 3602 are removed selectively to the insulating layer 3802 and liner 3302. In another embodiment, when liner 3302 is a non-conductive liner, liner 3302 is removed. In one embodiment, the pillars 3602 and liner 3302 are removed selectively to the insulating layers 3802 and 3004 and conductive lines 3202 and etch stop layer 3014. As shown in FIG. 34, trenches 4002 are formed in the insulating layers 3802 and 3004. Trenches 4002 extend along the recessed conductive lines 3202. As shown in FIG. 34, each trench 4002 has a bottom that is a bottom portion 4004 of liner 3302 and opposing sidewalls that include a sidewall portion 4006 of liner 3302 and a portion of insulating layer 3802. In another embodiment, when liner 3302 is removed, each trench 4002 has a bottom that is recessed conductive line 3202 and opposing sidewalls that include portions of insulating layers 3802 and 3004. Generally, the aspect ratio of the trench refers to the ratio of the depth of the trench to the width of the trench. In one embodiment, the aspect ratio of each trench 4002 is in an approximate range from about 1:1 to about 200:1.

In one embodiment, the pillars 3602 are selectively removed using one or more of the dry and wet etching techniques known to one of ordinary skill in the art of electronic device manufacturing. In one embodiment, the pillars 3602 are selectively wet etched by e.g., 5 wt. % of ammonium hydroxide ($NH_4OH$) aqueous solution at the temperature of about 80 degrees C. In one embodiment, hydrogen peroxide ($H_2O_2$) is added to the 5 wt. % $NH_4OH$ aqueous solution to increase the etching rate of the pillars 3602. In one embodiment, the pillars 3602 are selectively wet etched using hydrofluoric acid (HF) and nitric acid ($HNO_3$) in a ratio of 1:1. In one embodiment, the pillars 3602 are selectively wet etched using HF and $HNO_3$ in a ratio of 3:7 respectively. In one embodiment, the pillars 3602 are selectively wet etched using HF and $HNO_3$ in a ratio of 4:1, respectively. In one embodiment, the pillars 3602 are selectively wet etched using HF and $HNO_3$ in a ratio of 30%:70%, respectively. In one embodiment, the pillars 3602 including tungsten (W), titanium (Ti), or both titanium and tungsten are selectively wet etched using $NH_4OH$ and $H_2O_2$ in a ratio of 1:2, respectively. In one embodiment, the pillars 3602 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 3602 are selectively wet etched using diluted or concentrated one or more of the chemistries including hydrochloric acid (HCl), $HNO_3$, sulfuric acid ($H_2SO_4$), HF, and $H_2O_2$. In one embodiment, the pillars 3602 are selectively wet etched using HF, $HNO_3$ and acetic acid ($CH_3COOH$) in a ratio of 4:4:3, respectively. In one embodiment, the pillars 3602 are selectively dry etched using a bromotrifluoromethane (CBrF3) reactive ion etching (RIE) technique. In one embodiment, the pillars 602 are selectively dry etched using a chlorine, fluorine, bromine or any combination thereof based chemistries. In one embodiment, the pillars 3602 are selectively wet etched using hot or warm Aqua Regia mixture including HCl and $HNO_3$ in a ratio of 3:1, respectively. In one embodiment, the pillars 3602 are selectively etched using alkali with oxidizers (potassium nitrate ($KNO_3$) and lead dioxide ($PbO_2$)). In one embodiment, the liner 3302 is selectively removed using one or more of the dry and wet etching techniques known to one of ordinary skill in the art of electronic device manufacturing.

Figure 35:
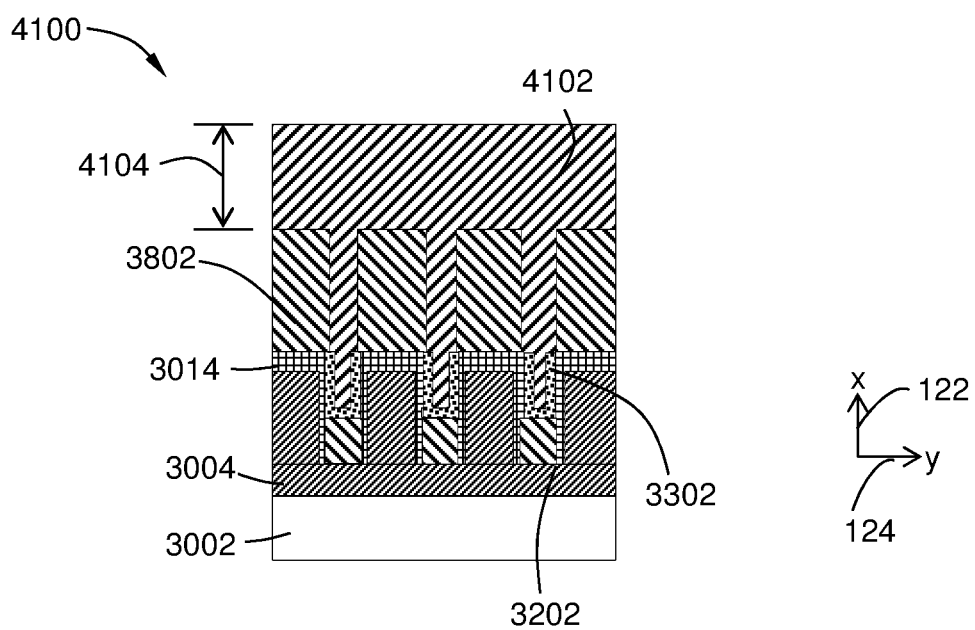
FIG. 35 is a view similar to FIG. 34 after an insulating layer is deposited into trenches according to one embodiment.

FIG. 35 is a view 4100 and that is similar to FIG. 34 after an insulating layer 4102 is deposited into trenches 4002 according to one embodiment. As shown in FIG. 35, insulating layer 4102 overfills the trenches 4002 so that portions of the insulating layer 4102 are deposited on the top portions of the insulating layer 3802. In one embodiment, the thickness of the insulating layer 4102 is greater or similar to the thickness of the insulating layer 3802. In one embodiment, the thickness 4104 is at least two or three times greater than the thickness of the insulating layer 3802. In another embodiment, portions of the insulating layer 4102 are removed using one or more of CMP or a back etch technique to even out with the top portions of the insulating layer 3802, and then another insulating layer (not shown) is deposited onto the top portions of the insulating layer 3802 and insulating layer 4102. As shown in FIG. 35, insulating layer 4102 is deposited on the sidewalls and bottom of the trenches 4004. As shown in FIG. 35, the insulating layer 4102 is deposited on the liner 3302 and portions of the insulating layer 3802. In another embodiment, when the liner 3302 is removed, the insulating layer 4102 is directly deposited on the recessed conductive lines 3202 and portions of the insulating layer 3004 and insulating layer 3802. In one embodiment, the insulating layer 4102 is etch selective to the insulating layer 3802. Generally, etch selectivity between two materials is defined as the ratio between their etching rates at similar etching conditions. In one embodiment, the ratio of the etching rate of the insulating layer 4102 to that of the insulating layer 3802 is at least 5:1. In one embodiment, the ratio of the etching rates of the insulating layer 4102 to that of the insulating layer 3802 is in an approximate range from about 2:1 to about 20:1.

In one embodiment, insulating layer 4102 is a low-k gapfill layer. In one embodiment, insulating layer 4102 is a flowable silicon oxide carbide (FSiOC) layer. In some other embodiments, insulating layer 4102 is an oxide layer, e.g., silicon dioxide, or any other electrically insulating layer determined by an electronic device design. In one embodiment, insulating layer 4102 is an interlayer dielectric (ILD). In one embodiment, insulating layer 4102 is a low-k dielectric that includes, but is not limited to, materials such as, e.g., silicon dioxide, silicon oxide, a carbon based material, e.g., a porous carbon film carbon doped oxide ("CDO"), e.g., carbon doped silicon dioxide, porous silicon dioxide, porous silicon oxide carbide hydride (SiOCH), silicon nitride, or any combination thereof. In one embodiment, insulating layer 4102 is a dielectric material having k-value less than 3. In more specific embodiment, insulating layer 4102 is a dielectric material having k-value in an approximate range from about 2.2 to about 2.7. In one embodiment, insulating layer 4102 includes a dielectric material having k-value less than 2. In one embodiment, insulating layer 4102 represents one of the insulating layers described above with respect to insulating layer 3004 and insulating layer 3802.

In one embodiment, insulating layer 4102 is a low-k interlayer dielectric to isolate one metal line from other metal lines. In one embodiment, insulating layer 4102 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

Figure 36:
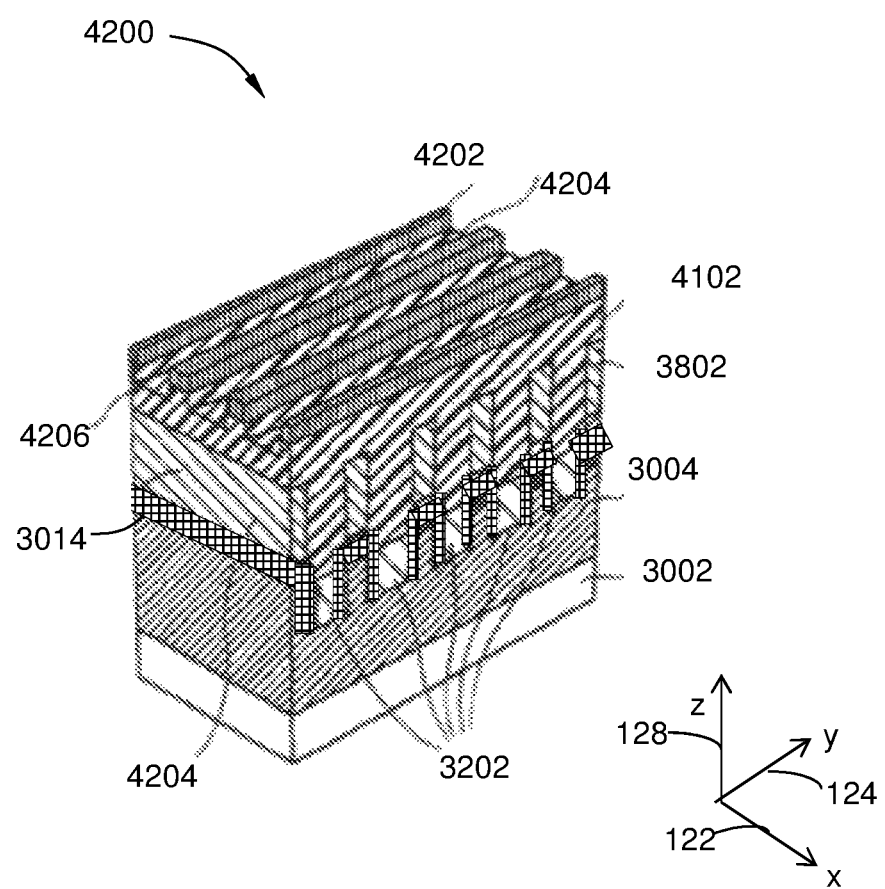
FIG. 36 is a view after an insulating layer is deposited into trenches according to one embodiment.

FIG. 36 is a view 4200 after a hard mask layer 4202 is deposited on insulating layer 4204 according to one embodiment. FIG. 36 is different from FIG. 35 in that the liner 3302 is removed, so that insulating layer 4204 is directly deposited on the recessed conductive lines 3202 and portions of the insulating layer 3004 and insulating layer 3802, as described above. In one embodiment, hard mask layer 1202 is a metallization layer hard mask. As shown in FIG. 35, the hard mask layer 4202 is patterned to define a plurality of trenches 4206. As shown in FIG. 35, the trenches 4206 extend along an Y-axis (direction) 124 that crosses an X-axis (direction) 122 at an angle. In one embodiment, direction 124 is substantially perpendicular to direction 124. In one embodiment, patterned hard mask layer 4202 is a carbon hard mask layer, a metal oxide hard mask layer, a metal nitride hard mask layer, a silicon nitride hard mask layer, a silicon oxide hard mask layer, a carbide hard mask layer, or other hard mask layer known to one of ordinary skill in the art of microelectronic device manufacturing. In one embodiment, the patterned hard mask layer 4202 is formed using one or more hard mask patterning techniques known to one of ordinary skill in the art of microelectronic device manufacturing. In one embodiment, the insulating layer 4102 is etched through a patterned hard mask layer to form trenches 4206 using one or more of etching techniques known to one of ordinary skill in the art of microelectronic device manufacturing. In one embodiment, the size of trenches in the insulating layer 4102 is determined by the size of conductive lines formed later on in a process.

Figure 37A:
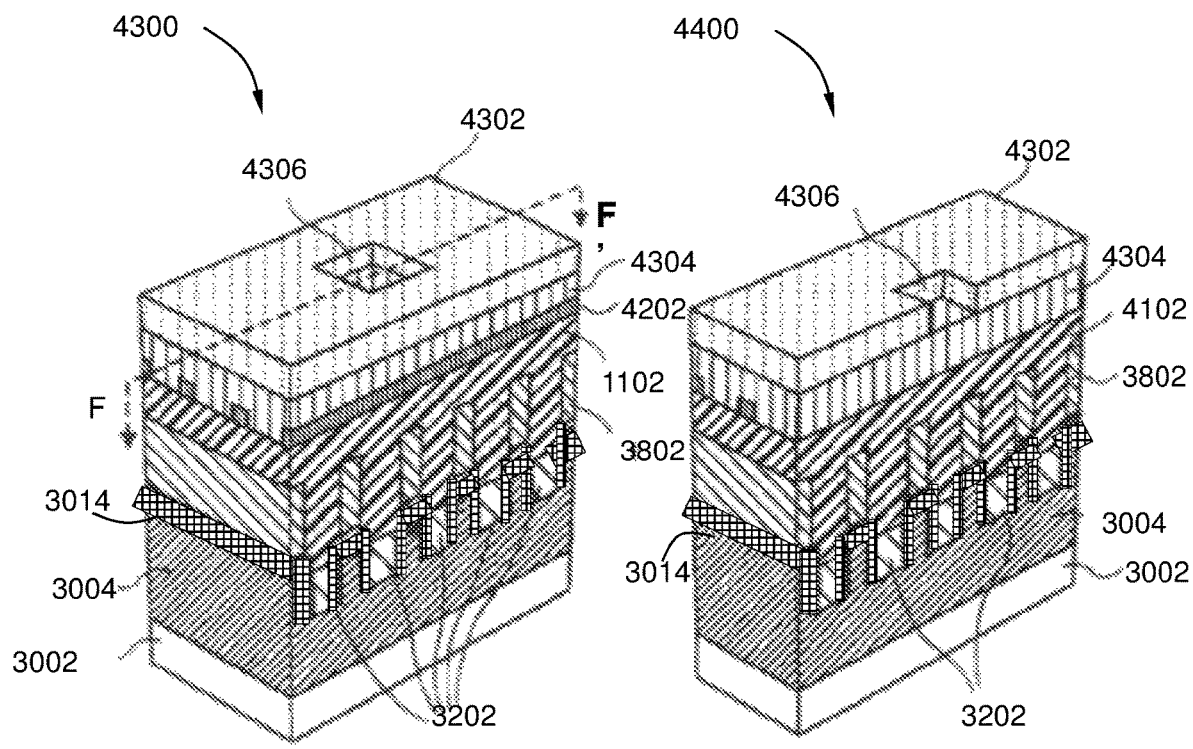
FIG. 37A is a view similar to FIG. 36 after a mask layer is deposited on an insulating layer on the patterned hard mask layer according to one embodiment.
Figure 37A:
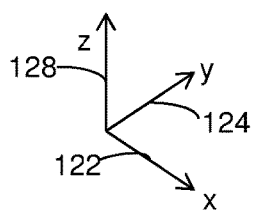
Figure 37B:
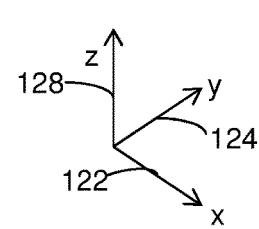
FIG. 37B is a cross-sectional view of FIG. 37A along an axis F-F'.

FIG. 37A is a view 4300 similar to FIG. 36, after a mask layer 4302 is deposited on an insulating layer 4304 on a patterned hard mask layer 4202 according to one embodiment. FIG. 37B is a cross-sectional view 4400 of FIG. 37A along an axis F-F'.

As shown in FIGS. 37A and 37B, an opening 4306 is formed in mask layer 4202. Opening 4306 is formed above one of the conductive lines 3202, as shown in FIGS. 37A and 37B. In one embodiment, the opening 4306 defines a trench portion of the fully self-aligned via formed later on in a process.

In one embodiment, mask layer 4302 includes a photoresist layer. In one embodiment, mask layer 4302 includes one or more hard mask layers. In one embodiment, the insulating layer 4304 is a hard mask layer. In one embodiment, insulating layer 4304 includes a bottom anti-reflective coating (BARC) layer. In one embodiment, insulating layer 1304 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer, or any combination thereof. In one embodiment, insulating layer 4304 represents one of the insulating layers described above. In one embodiment, mask layer 4302 is deposited using one or more mask layer deposition techniques known to one of ordinary skill in the art of microelectronic device manufacturing. In one embodiment, insulating layer 4304 is deposited using one of deposition techniques, such as but not limited to a CVD, PVD, MBE, NOCVD, spin-on, or other insulating layer deposition techniques known to one of ordinary skill in the art of microelectronic device manufacturing. In one embodiment, the opening 4306 is formed using one or more of the patterning and etching techniques known to one of ordinary skill in the art of microelectronic device manufacturing.

Figure 38A:
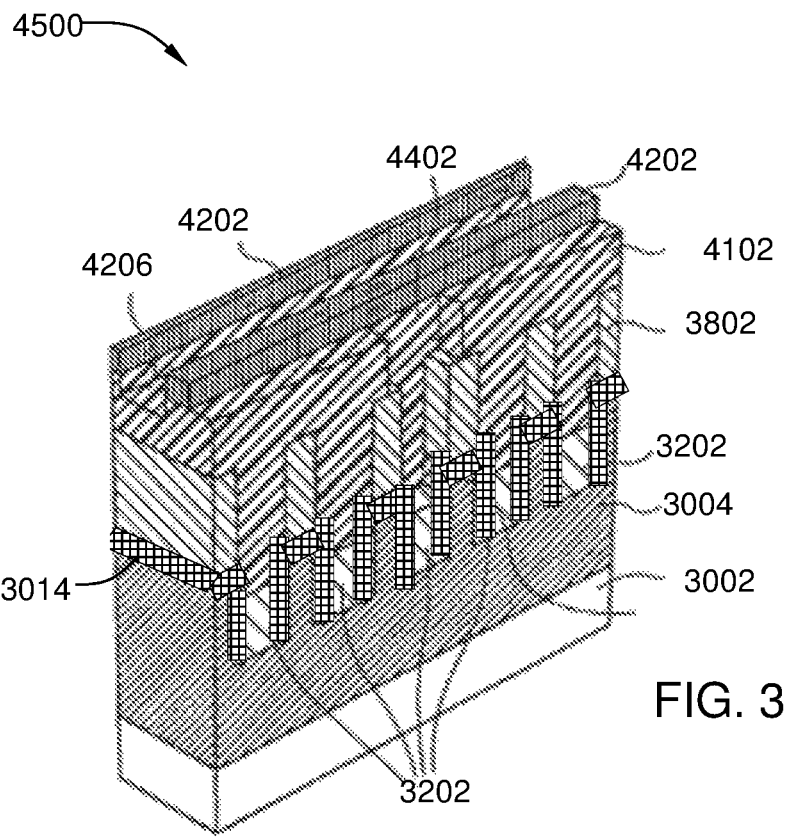
FIG. 38A is a view similar to FIG. 37B after the insulating layer is selectively etched according to one embodiment.
Figure 38B:
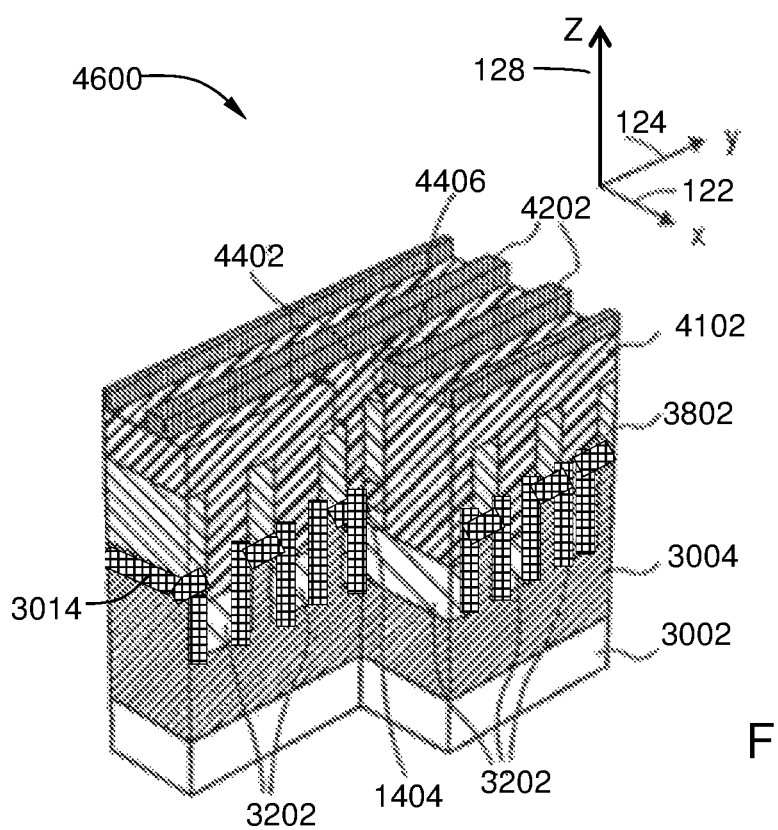
FIG. 38B is a view similar to FIG. 37A after the insulating layer is selectively etched according to one embodiment.

FIG. 38A is a view 4500 similar to FIG. 37B after the insulating layer 4304 and patterned hard mask layer 4202 are selectively etched through opening 4306 to form an opening 4402 according to one embodiment. FIG. 38B is a view 4600 similar to FIG. 37A after the insulating layer 4304 and insulating layer 4102 are selectively etched through opening 4306 to form opening 4402 according to one embodiment.

FIG. 38B is different from FIG. 38A in that FIG. 38B shows a cut through opening 4402 along X-axis 122 and Y-axis 124. As shown in FIGS. 38A and 38B, opening 4402 includes a via portion 4404 and a trench portion 4406. As shown in FIGS. 38A and 38B, via portion 4404 of the opening 4402 is limited along Y-axis 124 by insulating layer 3802. Via portion 4404 of the opening 4402 is self-aligned along Y-axis 124 to one of the conductive lines 3202. As shown in FIGS. 38A and 38B, trench portion 4406 is limited along X-axis 122 by the features of the hard mask layer 4202 that extend along Y-axis 124. In one embodiment, insulating layer 4102 is selectively etched relative to the insulating layer 3802 to form opening 4402.

In one embodiment, patterned hard mask layer 4202 is selectively etched relative to the insulating layer 3802 to form opening 4402. As shown in FIGS. 38A and 38B, mask layer 4302 and insulating layer 4304 are removed. In one embodiment, mask layer 4302 is removed using one or more of the mask layer removal techniques known to one of ordinary skill in the art of microelectronic device manufacturing. In one embodiment, insulating layer 4304 is removed using one or more of the etching techniques known to one of ordinary skill in the art of microelectronic device manufacturing.

Figure 39A:
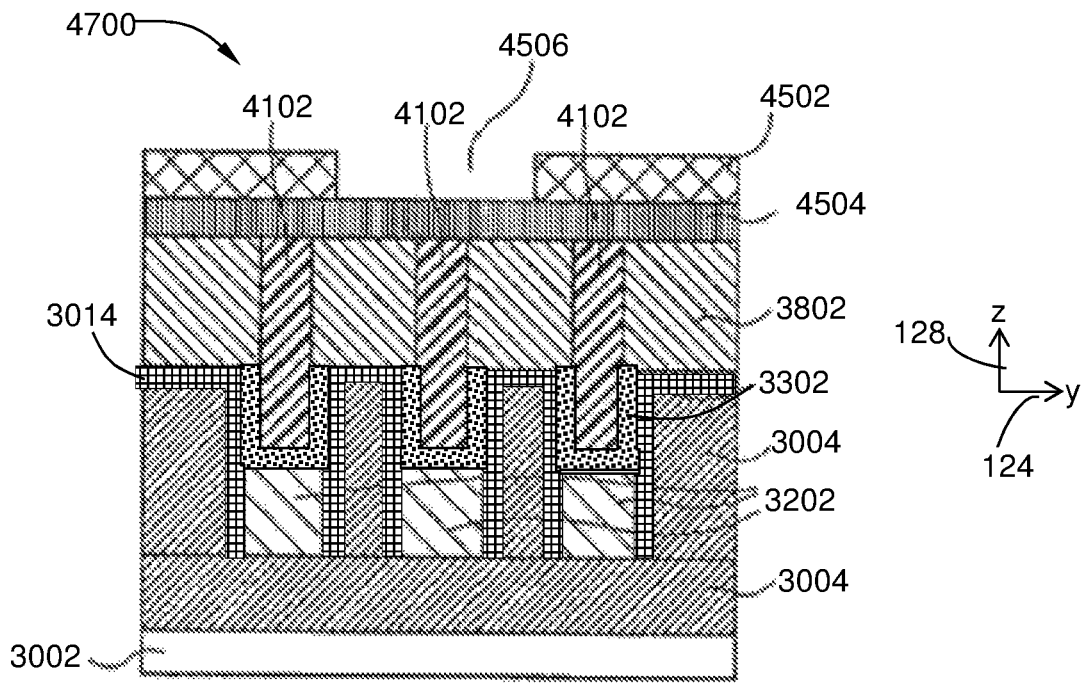
FIG. 39A is a view similar to FIG. 35 after a mask layer is deposited on a hard mask layer according to one embodiment.
Figure 39B:
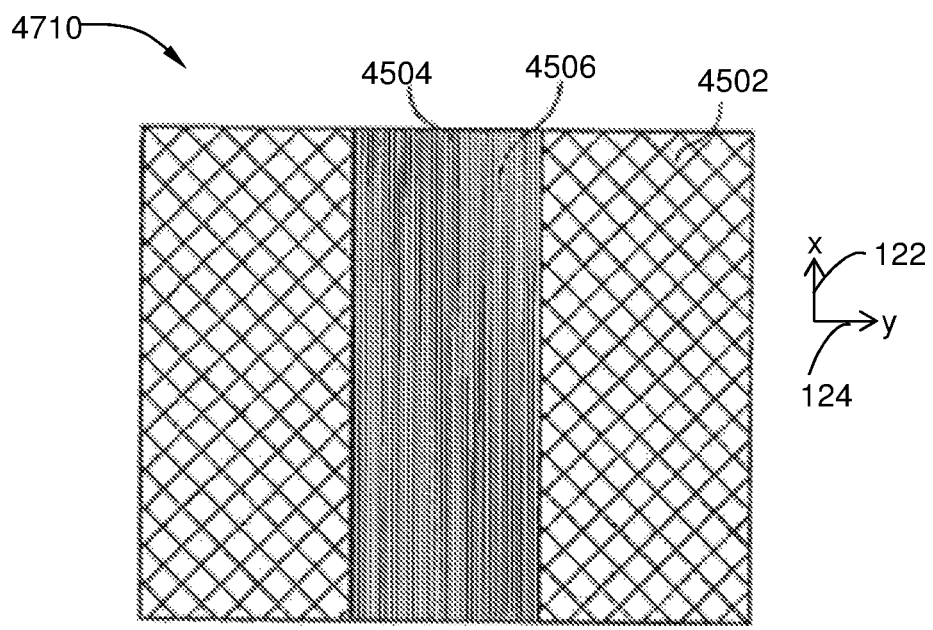
FIG. 39B is a top view of the electronic device structure depicted in FIG. 39A.

FIG. 39A is a view 4700 similar to FIG. 35, after a mask layer 4502 is deposited on the exposed insulating layer 3802 and insulating layer 4102 according to one embodiment. FIG. 39B is a top view 4710 of the electronic device structure depicted in FIG. 39A. As shown in FIG. 39A, a portion of the insulating layer 4102 is removed to even out top portions of the insulating layer 3802 with top portions of the insulating layer 4102. As shown in FIGS. 39A and 39B, mask layer 4502 has an opening 4506 to expose hard mask layer 4502.

In one embodiment, the portion of the insulating layer 4102 is removed using a CMP technique known to one of ordinary skill in the art of microelectronic device manufacturing. In one embodiment, a portion of the insulating layer 4102 is etched back to expose the top portion of the insulating layer 3802. In another embodiment, a portion of the insulating layer 3802 is etched back to a predetermined depth to expose upper portions of the sidewalls and top portions of the insulating layer 4102 in the trenches 4002. In one embodiment, the portion of the insulating layer 3802 is etched back using one or more of the dry and wet etching techniques known to one of ordinary skill in the art of microelectronic device manufacturing.

In one embodiment, mask layer 4502 includes a photoresist layer. In one embodiment, mask layer 4502 includes one or more hard mask layers. In one embodiment, mask layer 4502 is a tri-layer mask stack, e.g., a 193 nm immersion (193i) or EUV resist mask on a middle layer (ML) (e.g., a silicon containing organic layer or a metal containing dielectric layer) on a bottom anti-reflective coating (BARC) layer on a silicon oxide hard mask. In one embodiment, the hard mask layer 4504 is a metallization layer hard mask to pattern the conductive lines of the next metallization layer. In one embodiment, hard mask layer 4504 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer or any combination thereof. In one embodiment, hard mask layer 1504 represents one of the hard mask layers described above.

In one embodiment, the insulating layer 3802 and the insulating layer 4102 are patterned and etched using hard mask 4504 to form trenches using one or more patterning and etching techniques known to one or ordinary skill in the art of microelectronic device manufacturing. In one embodiment, the size of trenches in the insulating layer 3802 and insulating layer 4102 is determined by the size of conductive lines formed later on in a process.

In one embodiment, the mask layer 4502 is deposited using one or more of the mask deposition techniques known to one of ordinary skill in the art of microelectronic device manufacturing. In one embodiment, hard mask layer 4504 is deposited using one or more hard mask layer deposition techniques, such as but not limited to a CVD, PVD, MBE, MOCVD, spin-on, or other hard mask deposition known to one of ordinary skill in the art of microelectronic device manufacturing. In one embodiment, the opening 4506 is formed using one or more of the patterning and etching techniques known to one of ordinary skill in the art of microelectronic device manufacturing.

Figure 40A:
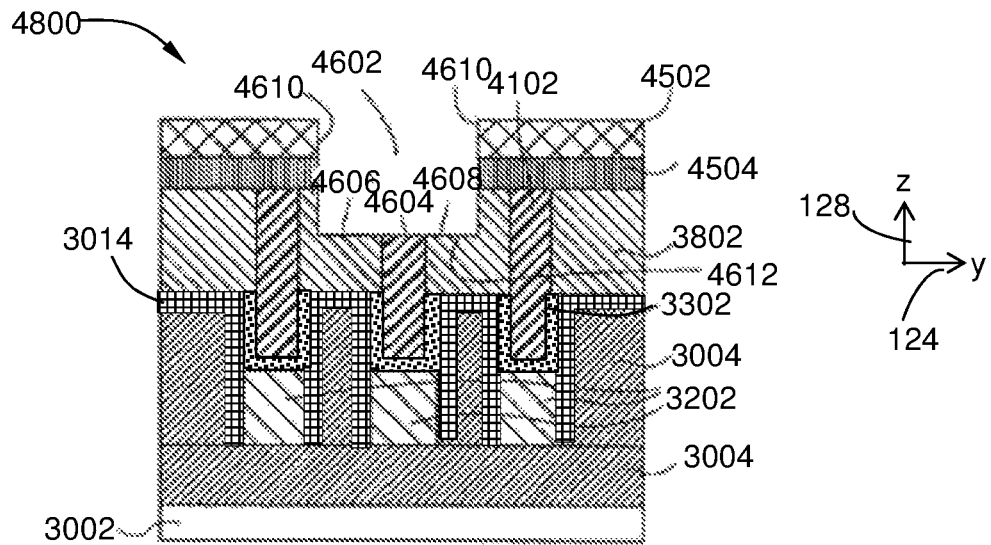
FIG. 40A is a view similar to FIG. 39A after portions of the hard mask layer and the insulating layer are removed according to one embodiment.
Figure 40B:
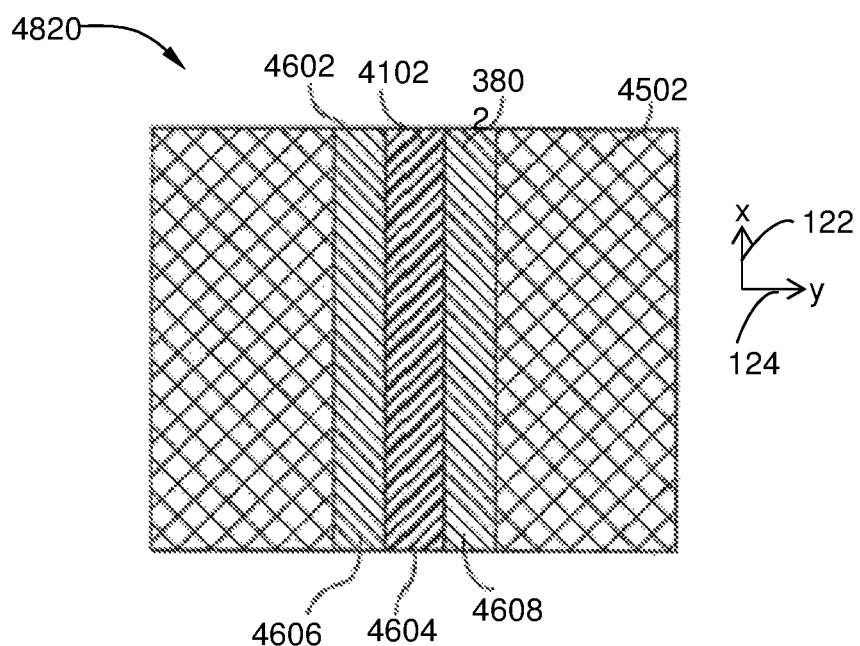
FIG. 40B is a top view of the electronic device structure depicted in FIG. 40A.

FIG. 40A is a view 4800 similar to FIG. 39A, after portions of the hard mask layer 4504, insulating layer 3802 and insulating layer 4102 are removed through opening 4506 to form an opening 4602 in insulating layer 3802 according to one embodiment. FIG. 40B is a top view 4820 of the electronic device structure depicted in FIG. 40A. In one embodiment, opening 4602 is a trench opening for a via. As shown in FIGS. 40A and 40B, opening 4602 includes a bottom 4612 that includes a portion 4604 of the insulating layer 4102 between portions 4606 and 4608 of the insulating layer 3802. As shown in FIGS. 40A and 40B, opening 4602 includes opposing sidewalls 4610 that include portions of the insulating layer 3802. In one embodiment, each sidewall 4610 is substantially orthogonal to bottom 4612. In another embodiment, each sidewall 4610 is slanted relative to bottom 4612 at an angle other than 90 degrees, so that an upper portion of the opening 4602 is greater than a lower portion of the opening 4602.

In one embodiment, opening 4602 having slanted sidewalls is formed using an angled non-selective etch. In one embodiment, hard mask layer 4504 is removed using one or more of wet etching, dry etching, or a combination thereof techniques known to one of ordinary skill in the art of microelectronic device manufacturing. In one embodiment, insulating layer 3802 and insulating layer 4102 are removed using a non-selective etch in a trench first dual damascene process. In one embodiment, insulating layer 3802 and insulating layer 4102 are etched down to the depth that is determined by time. In another embodiment, insulating layer 3802 and insulating layer 4102 are etched non-selectively down to etch stop layer 3014. In one embodiment, insulating layer 3802 and insulating layer 4102 are non-selectively etched using one or more of wet etching, dry etching, or a combination thereof techniques known to one of ordinary skill in the art of electronic device manufacturing.

Figure 41A:
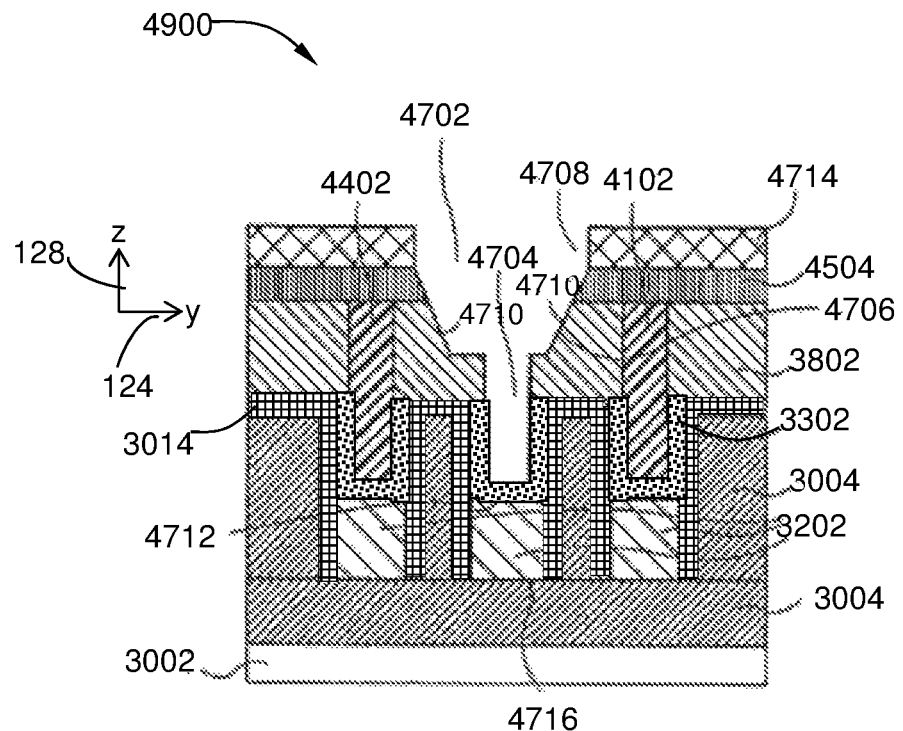
FIG. 41A is a view similar to FIG. 40A after a fully self-aligned opening is formed in insulating layer according to one embodiment.
Figure 41B:
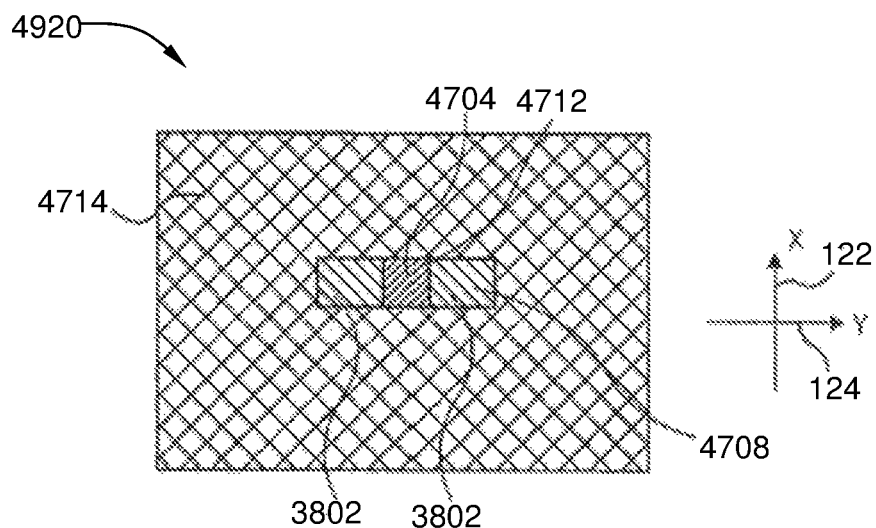
FIG. 41B is a top view of the electronic device structure depicted in FIG. 41A.

FIG. 41A is a view 4900 similar to FIG. 40A, after a fully self-aligned opening 4702 is formed in insulating layer 3802 according to one embodiment. FIG. 41B is a top view 4720 of the electronic device structure depicted in FIG. 41A. As shown in FIGS. 41A and 41B, mask layer 4502 is removed. Mask layer 4502 can be removed using one of the mask layer removal techniques known to one of ordinary skill in the art of microelectronic device manufacturing. A patterned mask layer 4714 is formed on hard mask layer 4504. As shown in FIG. 41B, patterned mask layer 4714 is deposited on the hard mask layer 4504 and into opening 4602. Patterned mask layer 4714 has an opening 4708. Patterned mask layer 4714 can be formed using one or more of the mask layer depositing, patterning and etching techniques known to one of ordinary skill in the art of microelectronic device manufacturing.

Fully self-aligned opening 4702 is formed through mask opening 4708. Fully self-aligned opening 4702 includes a trench opening 4706 and a via opening 4704, as shown in FIGS. 41A and 41B. Via opening 4704 is underneath trench opening 4706. In one embodiment, trench opening 4706 is the part of the that is exposed through opening 4708.

In one embodiment, via opening 4704 is formed by selectively etching insulating layer 4102 relative to the insulating layer 3802 through mask opening 4708 and trench opening 4706. In one embodiment, trench opening 4706 extends along Y-axis 124. As shown in FIG. 41B, trench opening 4706 is greater along Y-axis 124 than along X-axis 122.

In one embodiment, trench opening 4706 of the opening 4702 is self-aligned along X-axis 122 between the features of the hard mask layer 4504 that are used to pattern the upper metallization layer conductive lines that extend along Y-axis 124 (not shown). The via opening 4704 of the opening 4702 is self-aligned along Y-axis 124 by the insulating layer 3802 that is left intact by selectively etching the portion 4604 of the insulating layer 4102 relative to the insulating layer 3802. This provides an advantage as the size of the trench opening 4706 does not need to be limited to the size of the cross-section between the conductive line 4716 and one of the conductive lines of the upper metallization layer that provides more flexibility for the lithography equipment. As the portion 4604 is selectively removed relative to the insulating layer 3802, the size of the trench opening increases.

As shown in FIGS. 40A and 40B, the portion 4604 is self-aligned with a conductive line 4716 that is one of the lower metallization layer conductive lines 3202. That is, the opening 4702 is self-aligned along both X and Y axes.

FIG. 41A is different from FIG. 40A in that FIG. 41A illustrates trench opening 4706 having slanted sidewalls 4710. Each sidewall 4710 is at an angle other than 90 degrees to the top surface of the substrate 3002, so that an upper portion of the trench opening 4706 is greater than a lower portion of the trench opening 4706. In another embodiment, the sidewalls 4710 are substantially orthogonal to the top surface of the substrate 3002.

In one embodiment, mask layer 4714 includes a photoresist layer. In one embodiment, mask layer 4714 includes one or more hard mask layers. In one embodiment, mask layer 4714 is tri-layer mask stack, e.g., a 193i or EUV resist mask on a ML (e.g., a silicon containing organic layer or a metal containing dielectric layer) on a BARC layer on a silicon oxide hard mask. As shown in FIGS. 41A and 41B, via opening 4704 exposes a portion 4712 of the liner 3302 on conductive line 4716. In another embodiment, when the liner 3302 is removed, the via opening 4704 exposes conductive line 4716.

Figure 42A:
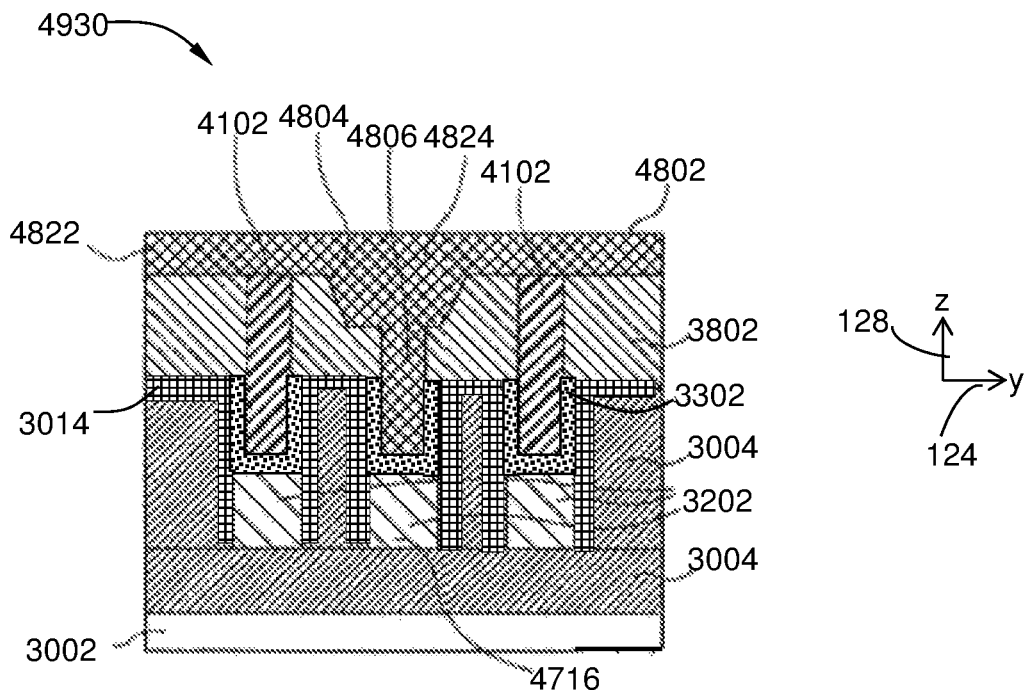
FIG. 42A is a view similar to FIG. 41A after an upper metallization layer comprising conductive lines extending along a Y-axis is formed according to one embodiment.
Figure 42B:
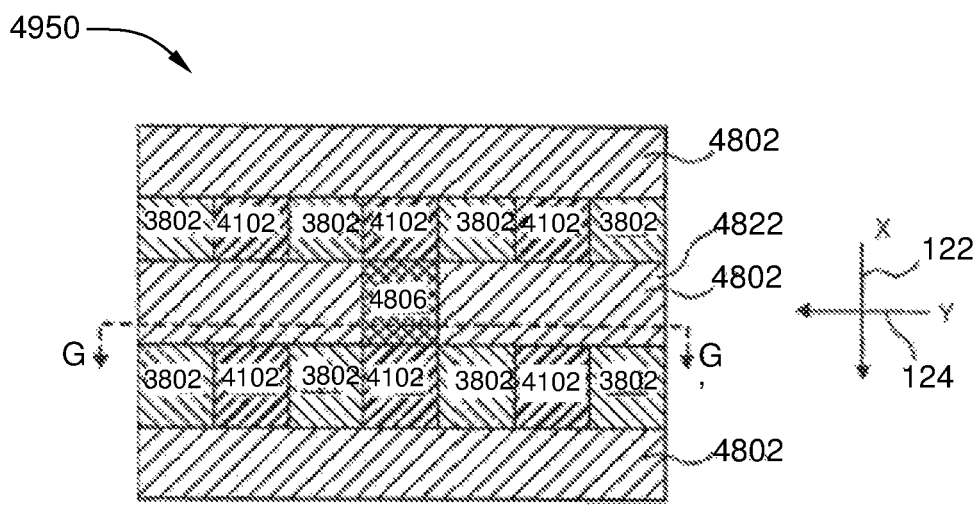
FIG. 42B is a top view of the electronic device structure depicted in FIG. 42A.

FIG. 42A is a view 4930 similar to FIG. 41A, after an upper metallization layer My comprising conductive lines extending along Y-axis 124 is formed according to one embodiment. FIG. 42B is a top view 4950 of the electronic device structure depicted in FIG. 42A. FIG. 42A is a cross-sectional view of FIG. 42B along an axis G-G'. As shown in FIG. 42A, mask layer 4502 and hard mask layer 4504 are removed. In one embodiment, each of the mask layer 4502 and hard mask layer 4504 is removed using one or more of the hard mask layer removal techniques know in one of ordinary skill in the art of microelectronic device manufacturing.

An upper metallization layer My includes a set of conductive lines 4802 that extend on portions of insulating layer 4102 and portions insulating layer 3802. As shown in FIG. 42B, the portions of the insulating layer 4102 are between the portions of the insulating layer 3802. Conductive lines 4802 extend along Y-axis 124. A fully self-aligned via 4824 includes a trench portion 4804 and a via portion 4806. Via portion 4806 is underneath trench portion 4804. The fully self-aligned via 4824 is between the lower metallization layer comprising conductive lines 4802 that extend along X-axis 122 and the upper metallization layer comprising conductive lines 4802. As shown in FIGS. 42A and 42B, the via portion 4806 is on liner 3302 on conductive line 4716. As shown in FIGS. 42A and 42B, the via portion 4806 of the via 4824 is self-aligned along the Y-axis 124 to conductive line 4716 that is one of the conductive lines 3202. The via portion 4806 of the via 4824 is self-aligned along the X-axis (direction) 122 to a conductive line 4822 that is one of the conductive lines 4802. In one embodiment, when liner 3302 is removed, the via portion 4806 is directly on conductive line 4716. As shown in FIGS. 42A and 42B, the via portion 4806 is a part of the conductive line 4822. As shown in FIGS. 42A and 42B, the size of the via portion 4806 is determined by the size of the cross-section between the conductive line 4716 and conductive line 4822.

In one embodiment, forming the conductive lines 4802 and via 4824 involves filling the trenches in the insulating layer and the opening 4702 with a layer of conductive material. In one embodiment, a base layer (not shown) is first deposited on the internal sidewalls and bottom of the trenches and the opening 4702, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g., copper).

In one embodiment, to form the base layer, the conductive barrier layer is deposited onto the sidewalls and bottom of the trenches, and then the seed layer is deposited on the conductive barrier layer. In another embodiment, the conductive base layer includes the seed layer that is directly deposited onto the sidewalls and bottom of the trenches. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper or cobalt, is deposited onto the seed layer of base later of copper, by an electroplating process. In one embodiment, the conductive layer is deposited into the trenches using a damascene process known to one of ordinary skill in the art of microelectronic device manufacturing. In one embodiment, the conductive layer is deposited onto the seed layer in the trenches and in the opening 4702 using a selective deposition technique, such as but not limited to electroplating, electrolysis, a CVD, PVD, MBE, MOCVD, ALD, spin-on, or other deposition techniques known to one of ordinary skill in the art of microelectronic device manufacturing.

In one embodiment, the choice of a material for conductive layer for the conductive lines 4802 and via 4824 determines the choice of a material for the seed layer. For example, if the material for the conductive lines 4802 and via 4824 includes copper, the material for the seed layer also includes copper. In one embodiment, the conductive lines 4802 and via 4824 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 4802 and via 4824 include metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, portions of the conductive layer and the base layer are removed to even out top portions of the conductive lines 4802 with top portions of the insulating layer 3802 and insulating layer 4102 using a chemical-mechanical polishing ("CMP") technique known to one of ordinary skill in the art of microelectronic device manufacturing.

In one non-limiting example, the thickness of the conductive lines 4802 is in an approximate range from about 15 nm to about 1000 nm. In one non-limiting example, the thickness of the conductive lines 4802 is from about 20 nm to about 200 nm. In one non-limiting example, the width of the conductive lines 4802 is in an approximate range from about 5 nm to about 500 nm. In one non-limiting example, the spacing (pitch) between the conductive lines 4802 is from about 2 nm to about 500 nm. In more specific non-limiting example, the spacing (pitch) between the conductive lines 1802 is from about 5 nm to about 50 nm.

FIGS. 43 through 47 (including both A and B designations) illustrate another embodiment of the disclosure. FIG. 43A is a view 4960 similar to FIG. 34, after a mask layer 4904 is deposited on a hard mask layer 4902 on the insulating layer 4102 according to one embodiment. FIG. 43B is a top view 4970 of the electronic device structure depicted in FIG. 43A. As shown in FIGS. 43A and 43B, mask layer 4904 has an opening 4906 to expose hard mask layer 4902.

In one embodiment, mask layer 4904 includes a photoresist layer. In one embodiment, mask layer 4904 includes one or more hard mask layers. In one embodiment, mask layer 4904 is a tri-layer mask stack, e.g., a 193 nm immersion (193i) or EUV resist mask on a middle layer (ML) (e.g., a silicon containing organic layer or a metal containing dielectric layer) on a bottom anti-reflective coating (BARC) layer on a silicon oxide hard mask. In one embodiment, the hard mask layer 4902 is a metallization layer hard mask to pattern the conductive lines of the next metallization layer. In one embodiment, hard mask layer 4902 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer or any combination thereof. In one embodiment, hard mask layer 4902 represents one of the hard mask layers described above.

In one embodiment, the mask layer 4904 is deposited using one or more of the mask deposition techniques known to one of ordinary skill in the art of microelectronic device manufacturing. In one embodiment, hard mask layer 4902 is deposited using one or more hard mask layer deposition techniques, such as but not limited to a CVD, PVD, MBE, MOCVD, spin-on, or other hard mask deposition known to one of ordinary skill in the art of microelectronic device manufacturing. In one embodiment, the opening 4906 is formed using one or more of the patterning and etching techniques known to one of ordinary skill in the art of microelectronic device manufacturing.

Figure 43A:
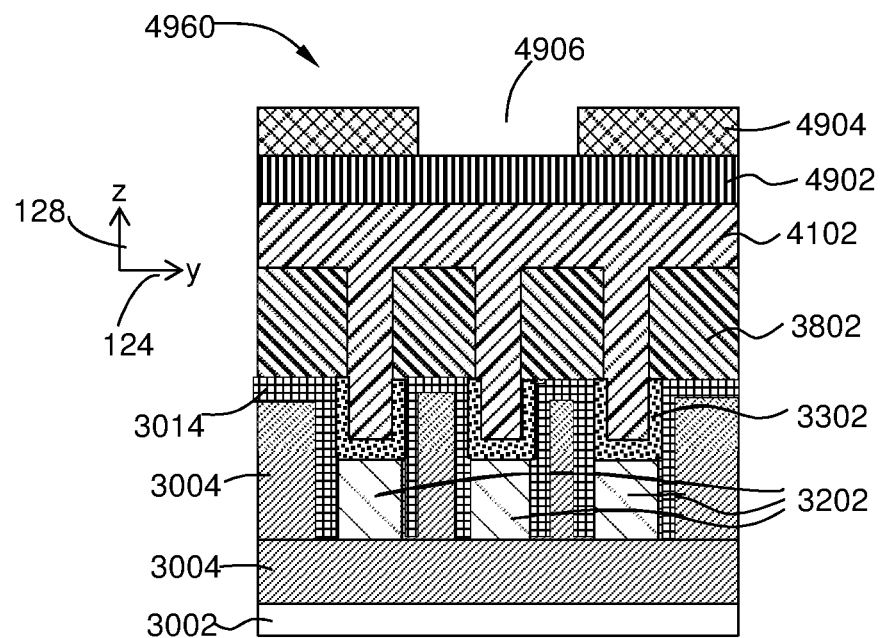
FIG. 43A is a view similar to FIG. 35 after a mask layer is deposited on a hard mask layer according to one embodiment.
Figure 43B:
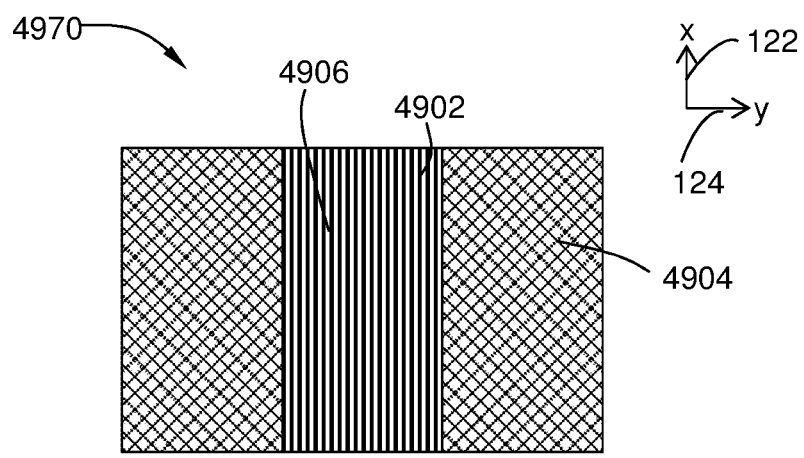
FIG. 43B is a top view of the electronic device structure depicted in FIG. 43A.
Figure 44A:
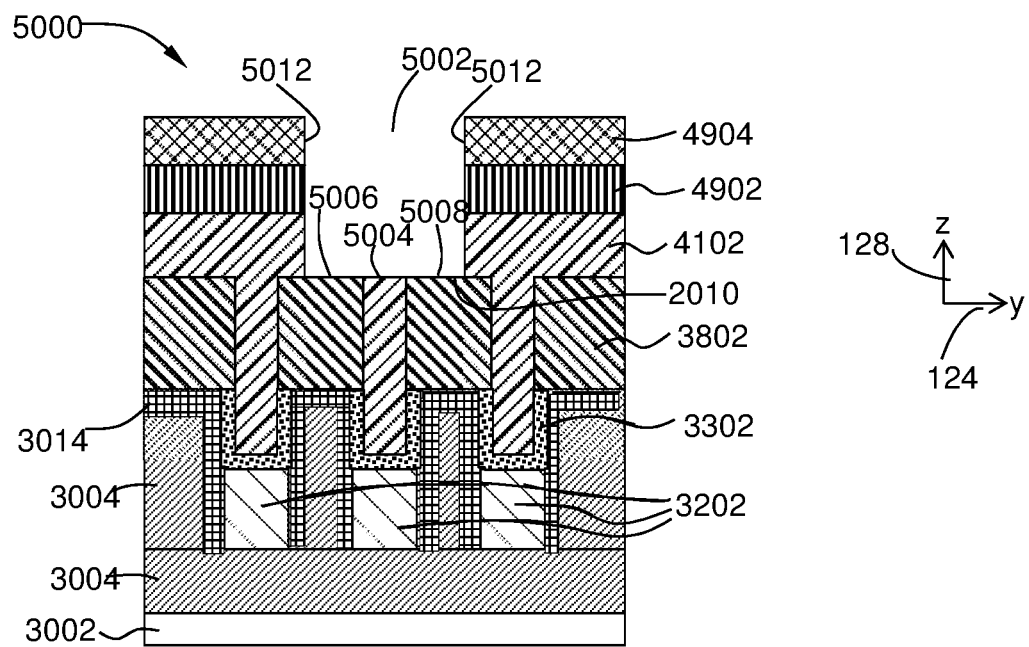
FIG. 44A is a view similar to FIG. 43A after portions of the hard mask layer and the insulating layer are removed according to one embodiment.
Figure 44B:
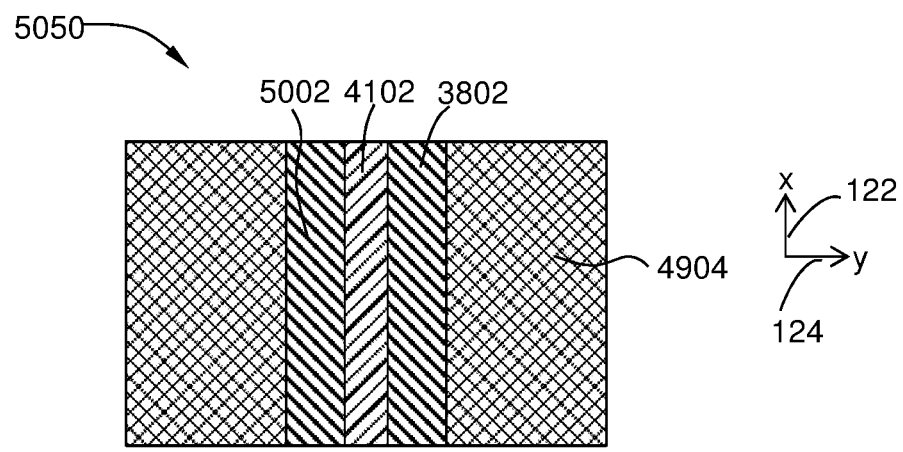
FIG. 44B is a top view of the electronic device structure depicted in FIG. 44A.

FIG. 44A is a view 5000 similar to FIG. 43A, after portions of the hard mask layer 4902 and insulating layer 4102 are removed through opening 4906 to form an opening 5002 in insulating layer 4102 according to one embodiment. FIG. 44B is a top view 5050 of the electronic device structure depicted in FIG. 44A. In one embodiment, opening 5002 is a trench opening for a via. As shown in FIGS. 44A and 44B, opening 5002 includes a bottom 5010 that includes a portion 5004 of the insulating layer 4102 between portions 5006 and 5008 of the insulating layer 3802. As shown in FIGS. 44A and 44B, opening 5002 includes opposing sidewalls 5012 that include portions of the insulating layer 4102. In one embodiment, each sidewall 5012 is substantially orthogonal to bottom 5010. In another embodiment, each sidewall 5012 is slanted relative to bottom 5010 at an angle other than 90 degrees, so that an upper portion of the opening 5002 is greater than a lower portion of the opening 5002.

In one embodiment, opening 5002 having slanted sidewalls is formed using an angled non-selective etch. In one embodiment, hard mask layer 4902 is removed using one or more of wet etching, dry etching, or a combination thereof techniques known to one of ordinary skill in the art of microelectronic device manufacturing. In one embodiment, insulating layer 4102 is removed using a non-selective etch in a trench first dual damascene process. In one embodiment, insulating layer 4102 is etched down to the depth that is determined by time. In another embodiment, insulating layer 4102 is etched non-selectively down to etch stop layer 3014. In one embodiment, insulating layer 4102 is non-selectively etched using one or more of wet etching, dry etching, or a combination thereof techniques known to one of ordinary skill in the art of electronic device manufacturing.

Figure 45A:
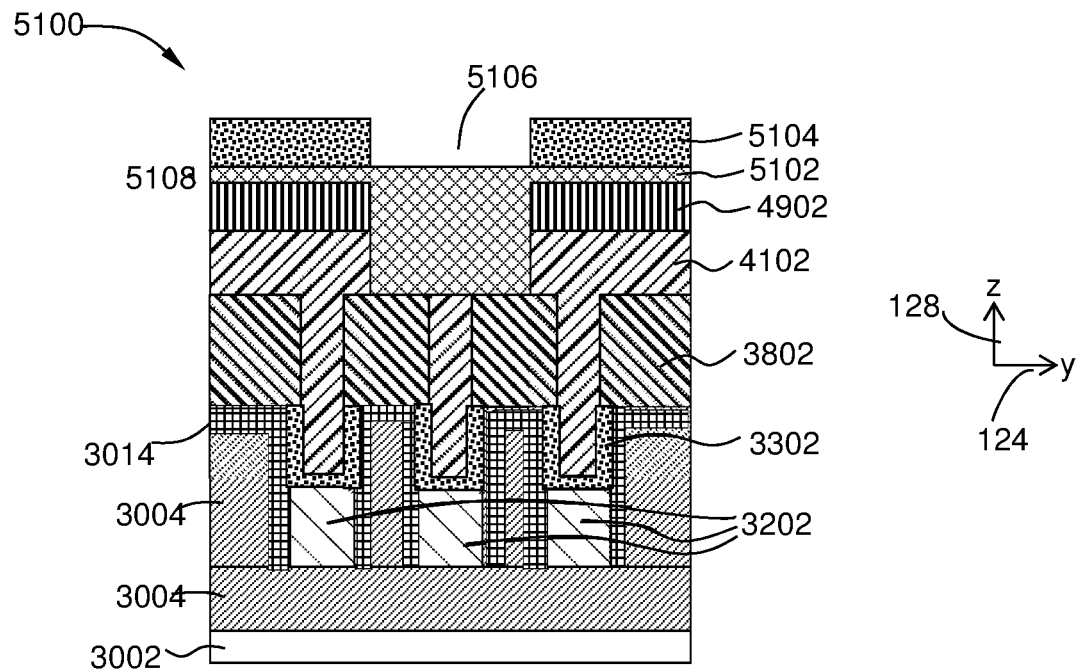
FIG. 45A is a view similar to FIG. 45A after forming a planarization filling layer and mask layer according to one embodiment.
Figure 45B:
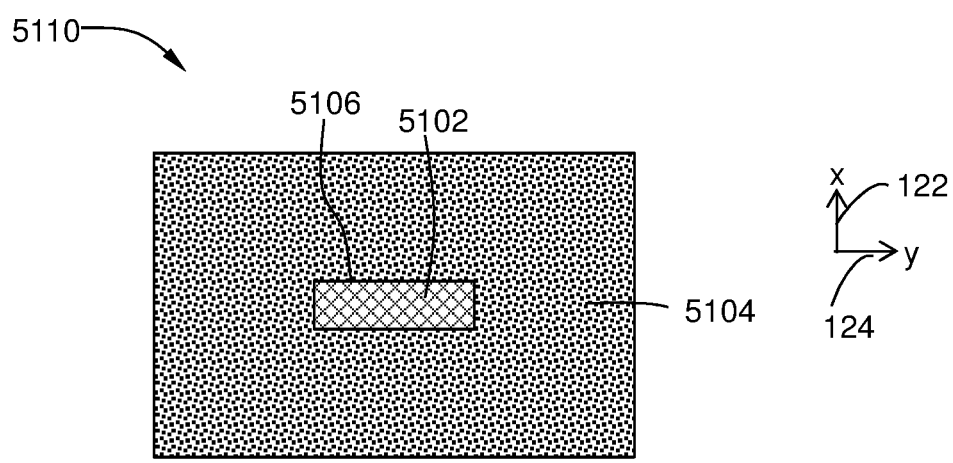
FIG. 45B is a top view of the electronic device structure depicted in FIG. 45A.

FIG. 45A is a view 5100 similar to FIG. 44A, after mask layer 4904 is removed, planarization filling layer 5102 is formed and mask layer 5104 with a fully opening 5106 is formed according to one embodiment. FIG. 45B is a top view 5110 of the electronic device structure depicted in FIG. 45A. As shown in FIGS. 45A and 45B, mask layer 4904 is removed. Mask layer 4904 can be removed using one of the mask layer removal techniques known to one of ordinary skill in the art of microelectronic device manufacturing. A planarization filling layer 5102 is formed in opening 5002 onto the tops of exposed insulating layer 3802 and insulating layer 4102. The planarization filling layer 5102 illustrated is formed so that an overburden 5108 is formed on hard mask layer 4902. In some embodiments, the planarization filling layer 5102 is formed to be substantially coplanar with the hard mask layer 4902. In some embodiments, the planarization filling layer 5102 is planarized, for example, by a CMP process. The planarization filling layer 5102 can be any suitable material including, but not limited to, BARC (Bottom Anti-Reflective Coating) layer (e.g., spin-on polymers containing C and H, or Si), DARC (Dielectric Anti-Reflective Coating) layer or an OPL (Organic Planarization Layer). The planarization filling layer 5102 of some embodiments is deposited by CVD or ALD. In some embodiments, the planarization filling layer 5102 comprises one or more atoms of Si, O, N, C or H.

A patterned mask layer 5104 is formed on hard mask layer 4902. As shown in FIG. 45B, patterned mask layer 5104 is deposited on the planarization filling layer 5102. Patterned mask layer 5104 has an opening 5106. Patterned mask layer 5104 can be formed using one or more of the mask layer depositing, patterning and etching techniques known to one of ordinary skill in the art of microelectronic device manufacturing.

In one embodiment, mask layer 5104 includes a photoresist layer. In one embodiment, mask layer 5104 includes one or more hard mask layers. In one embodiment, mask layer 5104 is tri-layer mask stack, e.g., a 193i or EUV resist mask on a ML (e.g., a silicon containing organic layer or a metal containing dielectric layer) on a BARC layer on a silicon oxide hard mask.

Figure 46A:
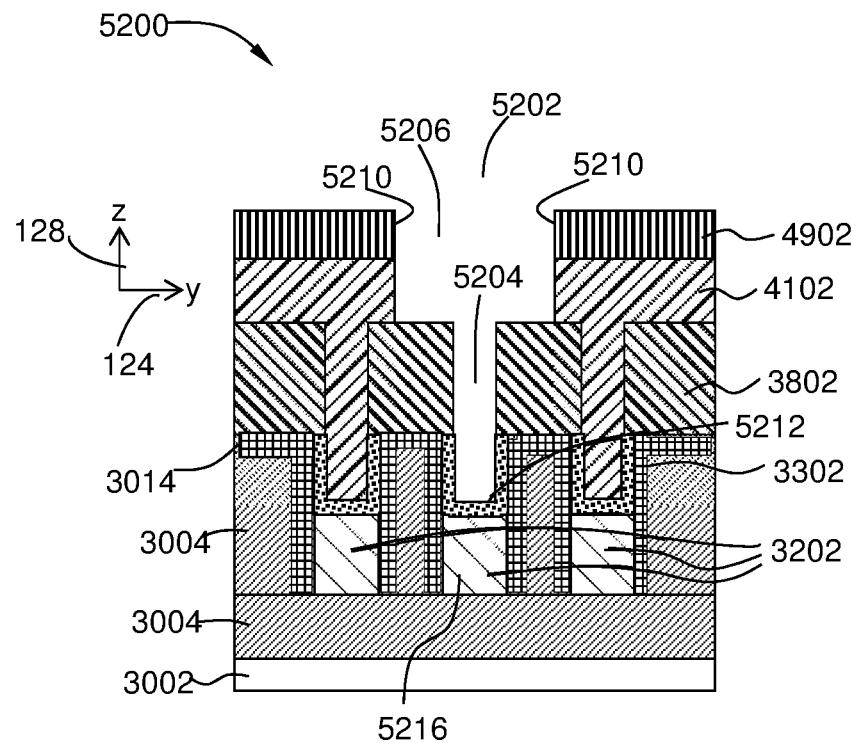
FIG. 46A is a view similar to FIG. 45A after a fully self-aligned opening is formed in insulating layer according to one embodiment.
Figure 46B:
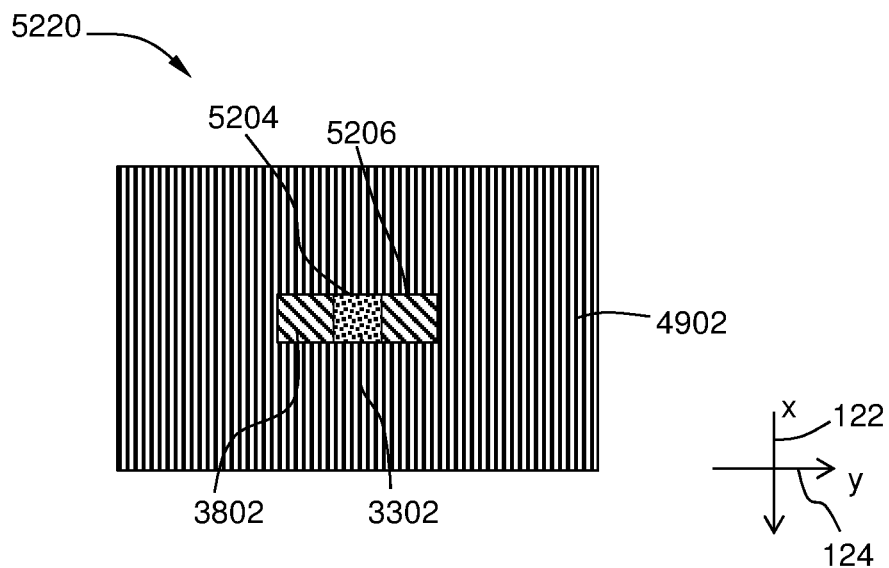
FIG. 46B is a top view of the electronic device structure depicted in FIG. 46A.

FIG. 46A is a view 2200 similar to FIG. 45A, after removing the planarization filling layer 5102 and insulating layer 4102 through opening 5106. The embodiment illustrated has the patterned mask layer 5104 and planarization filling layer 5102 removed from hard mask layer 4902. A fully self-aligned opening 5202 is formed through opening 5106. Fully self-aligned opening 5202 includes a trench opening 5206 and a via opening 5204, as shown in FIGS. 46A and 46B. Via opening 5204 is underneath trench opening 5206.

In one or more embodiments, via opening 5204 is formed by selectively etching insulating layer 4102 relative to the insulating layer 3802 through opening 5106 and trench opening 5206. In one embodiment, trench opening 2206 extends along Y-axis 124. As shown in FIG. 46B, trench opening 5206 is greater along Y-axis 124 than along X-axis 122.

In one embodiment, trench opening 5206 of the opening 5202 is self-aligned along X-axis between the features of the hard mask layer 4902 that are used to pattern the upper metallization layer conductive lines that extend along Y-axis 124 (not shown). The via opening 5204 of the opening 5202 is self-aligned along Y-axis 124 by the insulating layer 3802 that is left intact by selectively etching the portion 5004 of the insulating layer 4102 relative to the insulating layer 3802. This provides an advantage as the size of the trench opening 5206 does not need to be limited to the size of the cross-section between the conductive line 5216 and one of the conductive lines of the upper metallization layer that provides more flexibility for the lithography equipment. As the portion 2004 is selectively removed relative to the insulating layer 3802, the size of the trench opening increases.

As shown in FIGS. 44A and 44B, the portion 5004 is self-aligned with a conductive line 5216 that is one of the lower metallization layer conductive lines 3202. That is, the opening 5202 is self-aligned along both X and Y axes.

FIG. 46A illustrates trench opening 5206 having sidewalls 5210 that are substantially orthogonal to the top surface of the substrate 3002. In some embodiments, each sidewall 5210 is at an angle other than 90 degrees to the top surface of the substrate 3002, so that an upper portion of the trench opening 5206 is greater than a lower portion of the trench opening 5206.

As shown in FIGS. 46A and 46B, via opening 5204 exposes a portion 5212 of the liner 3302 on conductive line 5216. In another embodiment, when the liner 302 is removed, the via opening 5204 exposes conductive line 5216.

Figure 47A:
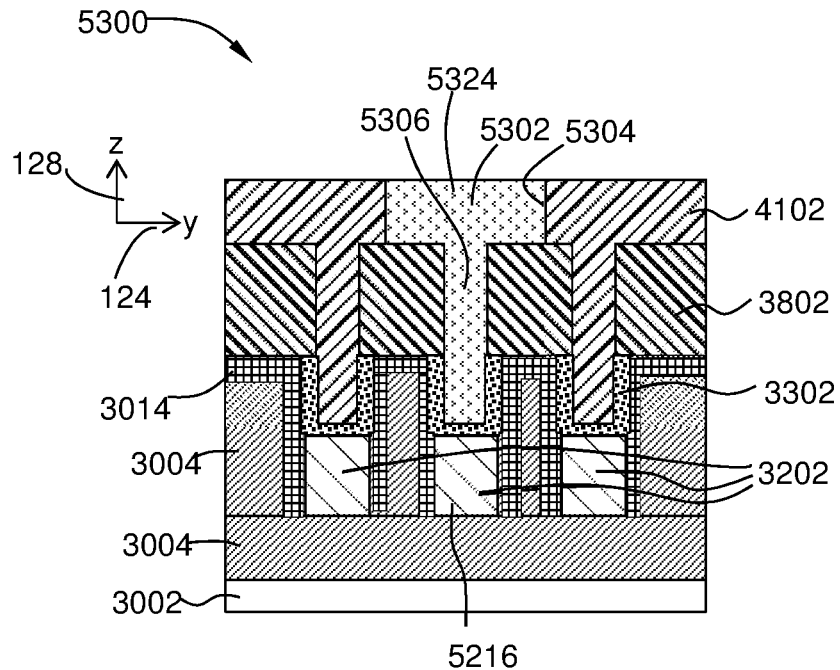
FIG. 47A is a view similar to FIG. 46A after an upper metallization layer comprising conductive lines extending along a Y-axis is formed according to one embodiment.
Figure 47B:
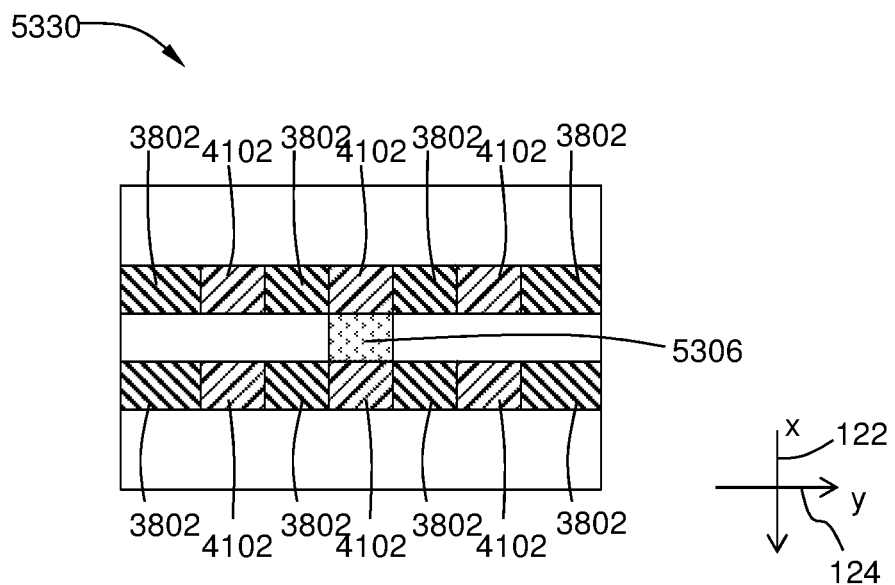
FIG. 47B is a top view of the electronic device structure depicted in FIG. 47A.

FIG. 47A is a view 5300 similar to FIG. 46A, after an upper metallization layer My comprising conductive lines extending along Y-axis 124 is formed according to one embodiment. FIG. 47B is a top view 5330 of the electronic device structure depicted in FIG. 47A. FIG. 47A is a cross-sectional view of FIG. 47B taken along an axis H-H'. As shown in FIG. 47A, hard mask layer 4902 is removed. In one embodiment, hard mask layer 4902 is removed using one or more of the hard mask layer removal techniques know in one of ordinary skill in the art of microelectronic device manufacturing.

An upper metallization layer My includes a set of conductive lines 5302 that extend on portions of insulating layer 3802. In the embodiment illustrated in FIG. 47A, the conductive lines 5302 are filled to be co-planar with the top of insulating layer 4102. In some embodiments, the conductive lines 5302 extend above the top surface of insulating layer 4102, similar to that shown in FIG. 42A.

As shown in FIG. 47B, the portions of the insulating layer 4102 are between the portions of the insulating layer 3802. Conductive lines 5302 extend along Y-axis 124. A fully self-aligned via 5324 includes a trench portion 5304 and a via portion 5306. Via portion 5306 is underneath trench portion 5304. The fully self-aligned via 5324 is between the lower metallization layer comprising conductive lines 3202 that extend along X-axis 122 and the upper metallization layer comprising conductive lines 5302. As shown in FIGS. 47A and 47B, the via portion 5306 is on liner 3302 on conductive line 5216. As shown in FIGS. 47A and 47B, the via portion 5306 of the via 5324 is self-aligned along the Y-axis 124 to conductive line 5216 that is one of the conductive lines 3202. The trench portion 5306 of the via 5324 is self-aligned along the X-axis 122. In one embodiment, when liner 3302 is removed, the via portion 5306 is directly on conductive line 5216.

In one embodiment, forming the conductive lines 5302 and via 5324 involves filling the trenches in the insulating layer and the opening 5202 (as shown in FIG. 46A) with a layer of conductive material. In one embodiment, a base layer (not shown) is first deposited on the internal sidewalls and bottom of the trenches and the opening 5202, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g., copper or cobalt).

In one embodiment, to form the base layer, the conductive barrier layer is deposited onto the sidewalls and bottom of the trenches, and then the seed layer is deposited on the conductive barrier layer. In another embodiment, the conductive base layer includes the seed layer that is directly deposited onto the sidewalls and bottom of the trenches. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper, is deposited onto the seed layer of base later of copper, by an electroplating process. In one embodiment, the conductive layer is deposited into the trenches using a damascene process known to one of ordinary skill in the art of microelectronic device manufacturing. In one embodiment, the conductive layer is deposited onto the seed layer in the trenches and in the opening 5202 using a selective deposition technique, such as but not limited to electroplating, electrolysis, a CVD, PVD, MBE, MOCVD, ALD, spin-on, or other deposition techniques known to one of ordinary skill in the art of microelectronic device manufacturing.

In one embodiment, the choice of a material for conductive layer for the conductive lines 5302 and via 5324 determines the choice of a material for the seed layer. For example, if the material for the conductive lines 5302 and via 5324 includes copper, the material for the seed layer also includes copper. In one embodiment, the conductive lines 5302 and via 5324 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 5302 and via 5324 are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, portions of the conductive layer and the base layer are removed to even out top portions of the conductive lines 5302 with top portions of the insulating layer 4102 using a chemical-mechanical polishing ("CMP") technique known to one of ordinary skill in the art of microelectronic device manufacturing.

In one non-limiting example, the thickness of the conductive lines 5302 is in an approximate range from about 15 nm to about 1000 nm. In one non-limiting example, the thickness of the conductive lines 5302 is from about 20 nm to about 200 nm. In one non-limiting example, the width of the conductive lines 5302 is in an approximate range from about 5 nm to about 500 nm. In one non-limiting example, the spacing (pitch) between the conductive lines 5302 is from about 2 nm to about 500 nm. In more specific non-limiting example, the spacing (pitch) between the conductive lines 5302 is from about 5 nm to about 50 nm.

In an embodiment, the upper metallization layer My is configured to connect to other metallization layers (not shown). In an embodiment, the metallization layer My is configures to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one or ordinary skill in the art of electronic device manufacturing.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. An electronic device comprising:
   a first metallization layer comprising first conductive lines extending along a first direction, each of the first conductive lines separated from an adjacent first conductive line by a first insulating layer;
   an etch stop layer on the first insulating layer;
   a second insulating layer on the first insulating layer, the second insulating layer separated from the first insulating layer by the etch stop layer;
   a third insulating layer on some of the first conductive lines so that at least one of the first conductive lines is free of the third insulating layer;
   a second metallization layer on portions of the second insulating layer and the third insulating layer, the second metallization layer comprising second conductive lines extending along a second direction that crosses the first direction at an angle, each of the second conductive lines separated from an adjacent second conductive line by the third insulating layer; and
   at least one via between the first metallization layer and the second metallization layer, each of the at least one vias formed on the at least one first conductive line free of the third insulating layer and having a conductive material therein, wherein the via is self-aligned along the second direction to the at least one first conductive lines.

2. The electronic device of claim 1, wherein the at least one via is self-aligned along the first direction to one of the second conductive lines.

3. The electronic device of claim 1, wherein the third insulating layer is etch selective relative to the second insulating layer.

4. The electronic device of claim 1, further comprising a liner between the first conductive lines and the second insulating layer and between the first conductive lines and the conductive material in the at least one via.

5. The electronic device of claim 1, wherein the etch stop layer comprises one or more of aluminum oxide ($Al_2O_3$) and hafnium dioxide ($HfO_2$).

6. The electronic device of claim 1, wherein the first conductive lines and second conductive lines independently comprise one or more of copper, ruthenium, nickel, cobalt, chromium, iron, manganese, titanium, aluminum, hafnium, tantalum, tungsten, vanadium, molybdenum, palladium, gold, silver, platinum, indium, tin, lead, antimony, bismuth, zinc, and cadmium.

7. The electronic device of claim 6, wherein the first conductive lines and the second conductive lines independently comprise one or more of copper or cobalt.

8. The electronic device of claim 1, wherein the first insulating layer, the second insulating layer, and the third insulating layer are independently selected from: oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof.

9. The electronic device of claim 8, wherein the first insulating layer and the second insulating layer are comprised of the same material.

10. An electronic device comprising:
    a first metallization layer comprising a first conductive lines extending along a first direction, each of the first conductive lines is separated from an adjacent first conductive line by a first insulating layer, the first conductive lines comprising one or more of copper, ruthenium, nickel, cobalt, chromium, iron, manganese, titanium, aluminum, hafnium, tantalum, tungsten, vanadium, molybdenum, palladium, gold, silver, platinum, indium, tin, lead, antimony, bismuth, zinc, and cadmium and the first insulating layer comprising one or more of oxides, carbon doped oxides, porous silicon dioxide, carbides, oxycarbides, nitrides, oxynitrides, oxycarbonitrides, polymers, phosphosilicate glass, fluorosilicate (SiOF) glass, and organosilicate glass (SiOCH);

an etch stop layer on the first insulating layer, the etch stop layer comprising one or more of aluminum oxide ($Al_2O_3$) and hafnium dioxide ($HfO_2$);

a second insulating layer on the first insulating layer, the second insulating layer separated from the first insulating layer by the etch stop layer and the second insulating layer comprising one or more of oxides, carbon doped oxides, porous silicon dioxide, carbides, oxycarbides, nitrides, oxynitrides, oxycarbonitrides, polymers, phosphosilicate glass, fluorosilicate (SiOF) glass, and organosilicate glass (SiOCH);

a third insulating layer on some of the first conductive lines so that at least one first conductive line is free of the third insulating layer, the third insulating layer comprising one or more of oxides, carbon doped oxides, porous silicon dioxide, carbides, oxycarbides, nitrides, oxynitrides, oxycarbonitrides, polymers, phosphosilicate glass, fluorosilicate (SiOF) glass, and organosilicate glass (SiOCH);

a second metallization layer on portions of the second insulating layer and the third insulating layer, the second metallization layer comprising a second conductive lines extending along a second direction that crosses the first direction at an angle, each of the second conductive lines separated from an adjacent second conductive line by the third insulating layer, the second conductive lines comprising one or more of copper, ruthenium, nickel, cobalt, chromium, iron, manganese, titanium, aluminum, hafnium, tantalum, tungsten, vanadium, molybdenum, palladium, gold, silver, platinum, indium, tin, lead, antimony, bismuth, zinc, and cadmium; and at least one via between the first metallization layer and the second metallization layer, each of the at least one vias formed on the at least one conductive line free of the third insulating layer and having a conductive material therein, wherein the at least one via is self-aligned along the second direction to one of the first conductive lines.

\* \* \* \* \*